United States Patent
Kawamura et al.

(10) Patent No.: US 9,947,876 B2
(45) Date of Patent: Apr. 17, 2018

(54) ORGANIC ELECTROLUMINESCENCE DEVICE AND ELECTRONIC DEVICE

(71) Applicant: IDEMITSU KOSAN CO., LTD., Chiyoda-ku (JP)

(72) Inventors: Yuichiro Kawamura, Sodegaura (JP); Toshinari Ogiwara, Sodegaura (JP); Ryohei Hashimoto, Sodegaura (JP)

(73) Assignee: IDEMITSU KOSAN CO., LTD., Chiyoda-ku (JP)

( * ) Notice: Subject to any disclaimer, the term of this patent is extended or adjusted under 35 U.S.C. 154(b) by 138 days.

(21) Appl. No.: 14/909,946

(22) PCT Filed: Aug. 24, 2015

(86) PCT No.: PCT/JP2015/073763
§ 371 (c)(1),
(2) Date: Feb. 3, 2016

(87) PCT Pub. No.: WO2016/031785
PCT Pub. Date: Mar. 3, 2016

(65) Prior Publication Data
US 2016/0301014 A1 Oct. 13, 2016

(30) Foreign Application Priority Data

Aug. 26, 2014 (JP) ................. 2014-172009
Mar. 27, 2015 (JP) ................. 2015-067468
Jul. 14, 2015 (JP) ................. 2015-140728

(51) Int. Cl.
*H01L 51/00* (2006.01)
*C09K 11/06* (2006.01)
(Continued)

(52) U.S. Cl.
CPC .......... *H01L 51/0072* (2013.01); *C09K 11/06* (2013.01); *H01L 51/005* (2013.01);
(Continued)

(58) Field of Classification Search
CPC ............... H01L 51/005; H01L 51/0055; H01L 51/0058; H01L 51/006; H01L 51/0061;
(Continued)

(56) References Cited

U.S. PATENT DOCUMENTS

2009/0261717 A1 10/2009 Buesing et al.
2012/0112169 A1  5/2012 Mizuki et al.
(Continued)

FOREIGN PATENT DOCUMENTS

JP 2009-542735 A 12/2009
JP 2011-003793 A  1/2011
(Continued)

OTHER PUBLICATIONS

Qisheng Zhang, et al., "Efficient blue organic light-emitting diodes employing thermally activated delayed fluorescence", Nature Photonics, Mar. 2, 2014, vol. 8, No. 4, 9 pages.
(Continued)

*Primary Examiner* — Vu A Nguyen
(74) *Attorney, Agent, or Firm* — Oblon, McClelland, Maier & Neustadt, L.L.P.

(57) ABSTRACT

An organic electroluminescence device includes an anode, an emitting layer and a cathode, in which the emitting layer includes a first compound, a second compound and a third compound. The first compound is a delayed fluorescent compound. The first compound has an energy gap $T_{77K}$ at 77 [K] larger than an energy gap $T_{77K}$ at 77 [K] of the second compound. The third compound has an energy gap $T_{77K}$ at 77 [K] larger than the energy gap $T_{77K}$ at 77 [K] of the second compound. The second compound has a fused ring structure represented by a formula (2) below and has eight or less rings in total.

(2)

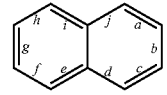

27 Claims, 5 Drawing Sheets

(51) Int. Cl.
*H05B 33/14* (2006.01)
*H05B 33/20* (2006.01)
*H01L 51/50* (2006.01)

(52) U.S. Cl.
CPC ........ *H01L 51/006* (2013.01); *H01L 51/0061* (2013.01); *H01L 51/0073* (2013.01); *H01L 51/0094* (2013.01); *H01L 51/5004* (2013.01); *H05B 33/14* (2013.01); *H05B 33/20* (2013.01); *C09K 2211/1007* (2013.01); *C09K 2211/1011* (2013.01); *C09K 2211/1014* (2013.01); *C09K 2211/1022* (2013.01); *C09K 2211/1048* (2013.01); *C09K 2211/1051* (2013.01); *C09K 2211/1088* (2013.01); *H01L 51/0054* (2013.01); *H01L 51/0055* (2013.01); *H01L 51/0056* (2013.01); *H01L 51/0058* (2013.01); *H01L 51/5012* (2013.01); *H01L 51/5016* (2013.01); *H01L 51/5028* (2013.01); *H01L 51/5056* (2013.01); *H01L 51/5072* (2013.01); *H01L 2251/5384* (2013.01)

(58) Field of Classification Search
CPC ............. H01L 51/0072; H01L 51/0073; H01L 51/0094
See application file for complete search history.

(56) References Cited

U.S. PATENT DOCUMENTS

| | | |
|---|---|---|
| 2012/0256172 A1 | 10/2012 | Ito et al. |
| 2013/0153878 A1 | 6/2013 | Mizuki et al. |
| 2014/0353646 A1 | 12/2014 | Mizuki et al. |
| 2015/0115225 A1 | 4/2015 | Kawamura et al. |
| 2015/0188070 A1* | 7/2015 | Ogiwara ............. H01L 51/5012 257/40 |
| 2015/0255720 A1 | 9/2015 | Heil et al. |
| 2015/0340623 A1* | 11/2015 | Kawamura .......... C07D 219/06 257/40 |

FOREIGN PATENT DOCUMENTS

| | | |
|---|---|---|
| JP | 5669163 B | 2/2015 |
| JP | 2015-144224 A | 8/2015 |
| WO | 2008/059713 A | 5/2008 |
| WO | 2010/122810 A1 | 10/2010 |
| WO | 2012/017680 A1 | 2/2012 |
| WO | 2013/042775 A1 | 3/2013 |
| WO | 2013/180241 A1 | 12/2013 |
| WO | WO 2013180241 A1 * 12/2013 ........... C07D 209/86 |
| WO | 2014/037077 A1 | 3/2014 |

OTHER PUBLICATIONS

Hajime Nakanotani, et al., "High-efficiency organic light-emitting diodes with fluorescent emitters", Nature Communications, May 30, 2014, 7 pages.
Chihaya Adachi, "Yuki Hando-tai no Debaisu Bussei (Device Physics of Organic Semiconductors)", Kodansha, Mar. 22, 2012, with English translation, 5 pages.
Hiroki Uoyama, et al., "Highly efficient organic light-emitting diodes from delayed fluorescence", Nature, 2012, vol. 492, 7 pages.
International Search Report dated Nov. 24, 2015 for PCT/JP2015/073763 filed on Aug. 24, 2015.

* cited by examiner

ORGANIC ELECTROLUMINESCENCE DEVICE AND ELECTRONIC DEVICE

TECHNICAL FIELD

The present invention relates to an organic electroluminescence device and an electronic device.

BACKGROUND ART

When a voltage is applied to an organic electroluminescence device (hereinafter, occasionally referred to as an "organic EL device"), holes are injected from an anode into an emitting layer and electrons are injected from a cathode into the emitting layer. The injected electrons and holes are recombined in an emitting layer to form excitons. Here, according to the electron spin statistics theory, singlet excitons and triplet excitons are generated at a ratio of 25%:75%.

A fluorescent organic EL device, which uses emission caused by singlet excitons, has been applied to a full-color display of a mobile phone, TV and the like, but is inferred to exhibit an internal quantum efficiency of 25% at a maximum. A fluorescent EL device is required to use triplet excitons in addition to singlet excitons to promote a further efficient emission from the organic EL device.

In view of the above, a highly efficient fluorescent organic EL device using delayed fluorescence has been studied.

For instance, a thermally activated delayed fluorescence (TADF) mechanism has been studied. The TADF mechanism uses such a phenomenon that inverse intersystem crossing from triplet excitons to singlet excitons thermally occurs when a material having a small energy difference ($\Delta ST$) between singlet energy level and triplet energy level is used. As for thermally activated delayed fluorescence, refer to, for instance, ADACHI, Chihaya, ed. (Mar. 22, 2012), "Yuki Hando-tai no Debaisu Bussei (Device Physics of Organic Semiconductors)", Kodansha, pp. 261-262. An organic EL device using the TADF mechanism is disclosed in, for instance, non-Patent Literature 1.

The organic EL device using the TADF mechanism is also desired to be further improved with respect to the performance of the device.

CITATION LIST

Non-Patent Literature

Non-Patent Literature 1: H. Nakanotani, Nat. Commun., 5, 4016, 2014

SUMMARY OF THE INVENTION

Problems to be Solved by the Invention

An object of the invention is to provide a high-performance organic electroluminescence device and an electronic device including the organic electroluminescence device.

Means for Solving the Problems

According to an aspect of the invention, there is provided an organic electroluminescence device including an anode, an emitting layer and a cathode, in which the emitting layer includes a first compound, a second compound, and a third compound; the first compound is a delayed fluorescent compound; the first compound has an energy gap $T_{77K}$ at 77 [K] larger than an energy gap $T_{77K}$ at 77 [K] of the second compound; the third compound has an energy gap $T_{77K}$ larger than the energy gap $T_{77K}$ at 77 [K] of the second compound; and the second compound is a compound having a fused ring structure represented by a formula (2) below, the fused ring structure having eight or less rings in total.

[Formula 1]

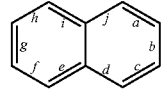

(2)

In the formula (2), a monocyclic ring or a fused ring is optionally fused to at least one of positions a, c, d, e, f, h, i and j. A five-membered ring or a fused ring having a five-membered ring is optionally fused to at least one of positions b and g.

When a six-membered ring is fused to the positions i and j, a monocyclic ring or a fused ring is also fused to the positions d and e.

When a six-membered ring is fused to the positions d and e, a monocyclic ring or a fused ring is also fused to the positions i and j.

When a fused ring having a five-membered ring is fused to the position b, the five-membered ring of the fused ring is directly fused to the position b.

When a fused ring having a five-membered ring is fused to the position g, the five-membered ring of the fused ring is directly fused to the position g.

According to an aspect of the invention, there is provided an organic electroluminescence device including an anode, an emitting layer and a cathode, in which the emitting layer includes a first compound and a second compound, the first compound is a compound represented by a formula (10) below, and the second compound is a compound having a fused ring structure represented by a formula (2) below, the fused ring structure having eight or less rings in total.

[Formula 2]

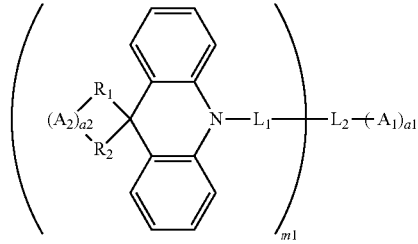

(10)

In the formula (10), a1 is 0 or 1 and a2 is 0 or 1, provided that a1+a2≥1. m1 is an integer of 1 to 5. When a2 is 0, $R_1$ and $R_2$ each independently represent a hydrogen atom or a monovalent substituent. When $R_1$ and $R_2$ are substituents, the substituents are each independently selected from the group consisting of a substituted or unsubstituted aromatic hydrocarbon group having 6 to 30 ring carbon atoms, a substituted or unsubstituted heterocyclic group having 5 to 30 ring atoms, a substituted or unsubstituted alkyl group having 1 to 30 carbon atoms, a substituted or unsubstituted alkoxy group having 1 to 30 carbon atoms, a substituted or unsubstituted aralkyl group having 7 to 30 carbon atoms, a substituted or unsubstituted aryloxy group having 6 to 30 ring carbon atoms, and a substituted silyl group. When a2 is 1, $R_1$ and $R_2$ are each independently a linking group selected from the group consisting of a substituted or unsubstituted aromatic hydrocarbon group having 6 to 30 ring carbon atoms, a substituted or unsubstituted heterocyclic group having 5 to 30 ring atoms, a substituted or unsubstituted alkyl group having 1 to 30 carbon atoms, a substituted or unsubstituted alkoxy group having 1 to 30 carbon atoms, a substituted or unsubstituted aralkyl group having 7 to 30 carbon atoms, a substituted or unsubstituted aryloxy group having 6 to 30 ring carbon atoms, and a substituted silyl group. When m1 is 2 or more, a plurality of $R_1$ are mutually the same or different and a plurality of $R_2$ are mutually the same or different. $A_1$ and $A_2$ are a group having a partial structure selected from formulae (a-1) to (a-7) below. When m1 is 2 or more, a plurality of $A_2$ are mutually the same or different. When a1 is 0, $L_2$ is a hydrogen atom or a monovalent substituent. When $L_2$ is a monovalent substituent, the substituent is selected from the group consisting of a substituted or unsubstituted aromatic hydrocarbon group having 6 to 30 ring carbon atoms and a substituted or unsubstituted heterocyclic group having 5 to 30 ring atoms. When a1 is 1, $L_2$ is a single bond or a linking group. When $L_2$ is a linking group, the linking group is selected from the group consisting of a substituted or unsubstituted aromatic hydrocarbon group having 6 to 30 ring carbon atoms and a substituted or unsubstituted heterocyclic group having 5 to 30 ring atoms. $L_1$ is a single bond or a linking group. When $L_1$ is a linking group, the linking group is selected from the group consisting of a substituted or unsubstituted aromatic hydrocarbon group having 6 to 30 ring carbon atoms and a substituted or unsubstituted heterocyclic group having 5 to 30 ring atoms. When m1 is 2 or more, a plurality of $L_1$ are mutually the same or different.

[Formula 3]

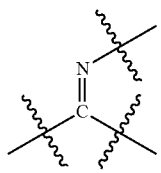

(a-1)

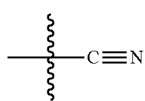

(a-2)

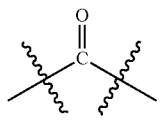

(a-3)

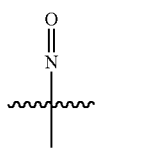

(a-4)

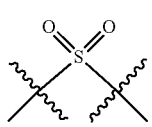

(a-5)

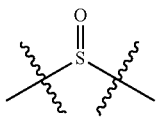

(a-6)

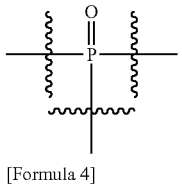

(a-7)

[Formula 4]

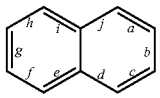

(2)

In the formula (2), a monocyclic ring or a fused ring is optionally fused to at least one of positions a, c, d, e, f, h, i and j. A five-membered ring or a fused ring having a five-membered ring is optionally fused to at least one of positions b and g.

When a six-membered ring is fused to the positions i and j, a monocyclic ring or a fused ring is also fused to the positions d and e.

When a six-membered ring is fused to the positions d and e, a monocyclic ring or a fused ring is also fused to the positions i and j.

When a fused ring having a five-membered ring is fused to the position h, the five-membered ring of the fused ring is directly fused to the position b.

When a fused ring having a five-membered ring is fused to the position g, the five-membered ring of the fused ring is directly fused to the position g.

According to still another aspect of the invention, there is provided an organic electroluminescence device including an anode, an emitting layer and a cathode, in which the emitting layer includes a first compound and a second compound, the first compound is a compound represented by a formula (10') below, and the second compound is a compound having a fused ring structure represented by a formula (2) below, the fused ring structure having eight or less rings in total.

[Formula 5]

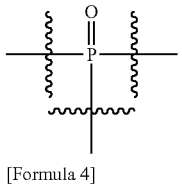

(10')

In the formula (10'), m2 is 2. a2 is 0 or 1. A plurality of a2 are mutually the same or different. m1 is an integer of 1 to 5. A plurality of m1 are mutually the same or different. When a2 is 0, $R_1$ and $R_2$ each independently represent a hydrogen atom or a monovalent substituent. When $R_1$ and $R_2$ are substituents, the substituents are each independently selected from the group consisting of a substituted or unsubstituted aromatic hydrocarbon group having 6 to 30 ring carbon atoms, a substituted or unsubstituted heterocyclic group having 5 to 30 ring atoms, a substituted or unsubstituted alkyl group having 1 to 30 carbon atoms, a substituted or unsubstituted alkoxy group having 1 to 30 carbon atoms, a substituted or unsubstituted aralkyl group having 7 to 30 carbon atoms, a substituted or unsubstituted aryloxy group having 6 to 30 ring carbon atoms, and a substituted silyl group. When a2 is 1, $R_1$ and $R_2$ are each independently a linking group selected from the group consisting of a substituted or unsubstituted aromatic hydrocarbon group having 6 to 30 ring carbon atoms, a substituted or unsubstituted heterocyclic group having 5 to 30 ring atoms, a substituted or unsubstituted alkyl group having 1 to 30 carbon atoms, a substituted or unsubstituted alkoxy group having 1 to 30 carbon atoms, a substituted or unsubstituted aralkyl group having 7 to 30 carbon atoms, a substituted or unsubstituted aryloxy group having 6 to 30 ring carbon atoms, and a substituted silyl group. A plurality of $R_1$ are mutually the same or different and a plurality of $R_2$ are mutually the same or different. $A_1$ and $A_2$ are a group having a partial structure selected from formulae (a-1) to (a-7) below, A plurality of $A_2$ are mutually the same or different. $L_2$ is a single bond or a linking group. When $L_2$ is a linking group, the linking group is selected from the group consisting of a substituted or unsubstituted aromatic hydrocarbon group having 6 to 30 ring carbon atoms and a substituted or unsubstituted heterocyclic group having 5 to 30 ring atoms. A plurality of $L_2$ are mutually the same or different. $L_1$ is a single bond or a linking group. When $L_1$ is a linking group, the linking group is selected from the group consisting of a substituted or unsubstituted aromatic hydrocarbon group having 6 to 30 ring carbon atoms and a substituted or unsubstituted heterocyclic group having 5 to 30 ring atoms. A plurality of $L_1$ are mutually the same or different.

[Formula 6]

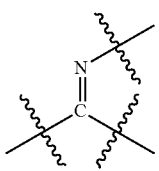

(a-1)

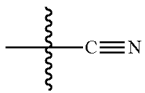

(a-2)

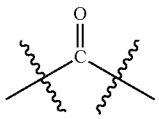

(a-3)

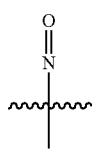

(a-4)

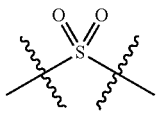

(a-5)

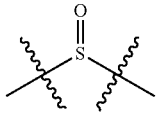

(a-6)

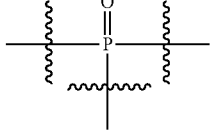

(a-7)

[Formula 7]

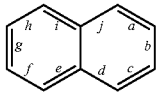

(2)

In the formula (2), a monocyclic ring or a fused ring is optionally fused to at least one of positions a, c, d, e, f, h, i and j. A five-membered ring or a fused ring having a five-membered ring is optionally fused to at least one of positions b and g.

When a six-membered ring is fused to the positions i and j, a monocyclic ring or a fused ring is also fused to the positions d and e.

When a six-membered ring is fused to the positions d and e, a monocyclic ring or a fused ring is also fused to the positions i and j.

When a fused ring having a five-membered ring is fused to the position b, the five-membered ring of the fused ring is directly fused to the position b.

When a fused ring having a five-membered ring is fused to the position g, the five-membered ring of the fused ring is directly fused to the position g.

According to a further aspect of the invention, an electronic device including the organic electroluminescence device according to the above aspect is provided.

According to the above aspects of invention, a high-performance organic electroluminescence device and an electronic device including the organic electroluminescence device can be provided.

DESCRIPTION OF EMBODIMENT(S)

First Exemplary Embodiment

Arrangement(s) of Organic EL Device

The organic EL device in the first exemplary embodiment includes a pair of electrodes and an organic layer between the pair of electrodes. The organic layer includes at least one layer formed of an organic compound. Alternatively, the organic layer includes a plurality of layers formed of an organic compound. The organic layer may further include an inorganic compound. In the organic EL device in the exemplary embodiment, at least one layer of the organic layer(s) is the emitting layer. Specifically, for instance, the organic layer may consist of a single emitting layer, or may include layers usable in a typical organic EL device, such as a hole injecting layer, a hole transporting layer, an electron injecting layer, an electron transporting layer and a blocking layer.

Typical device arrangements of an organic EL device include the following arrangements (a) to (e) and the like:

(a) anode/emitting layer/cathode;
(b) anode/hole injecting•transporting layer/emitting layer/cathode;
(c) anode/emitting layer/electron injecting-transporting layer/cathode;
(d) anode/hole injecting•transporting layer/emitting layer/electron injecting•transporting layer/cathode; and
(e) anode/hole injecting•transporting layer/emitting layer/blocking layer/electron injecting•transporting layer/cathode.

The arrangement (d) is preferably used among the above arrangements. However, the arrangement of the invention is not limited to the above arrangements. The "emitting layer" refers to an organic layer having an emitting function. The term "hole injecting/transporting layer" means at least one of a hole injecting layer and a hole transporting layer. The term "electron injecting/transporting layer" means at least one of an electron injecting layer and an electron transporting layer. Herein, when the hole injecting layer and the hole transporting layer are provided, the hole injecting layer is preferably provided between the hole transporting layer and the anode. When the electron injecting layer and the electron transporting layer are provided, the electron injecting layer is preferably provided between the electron transporting layer and the cathode. The hole injecting layer, the hole transporting layer, the electron transporting layer and the electron injecting layer may each consist of a single layer or a plurality of layers.

Figure 1:
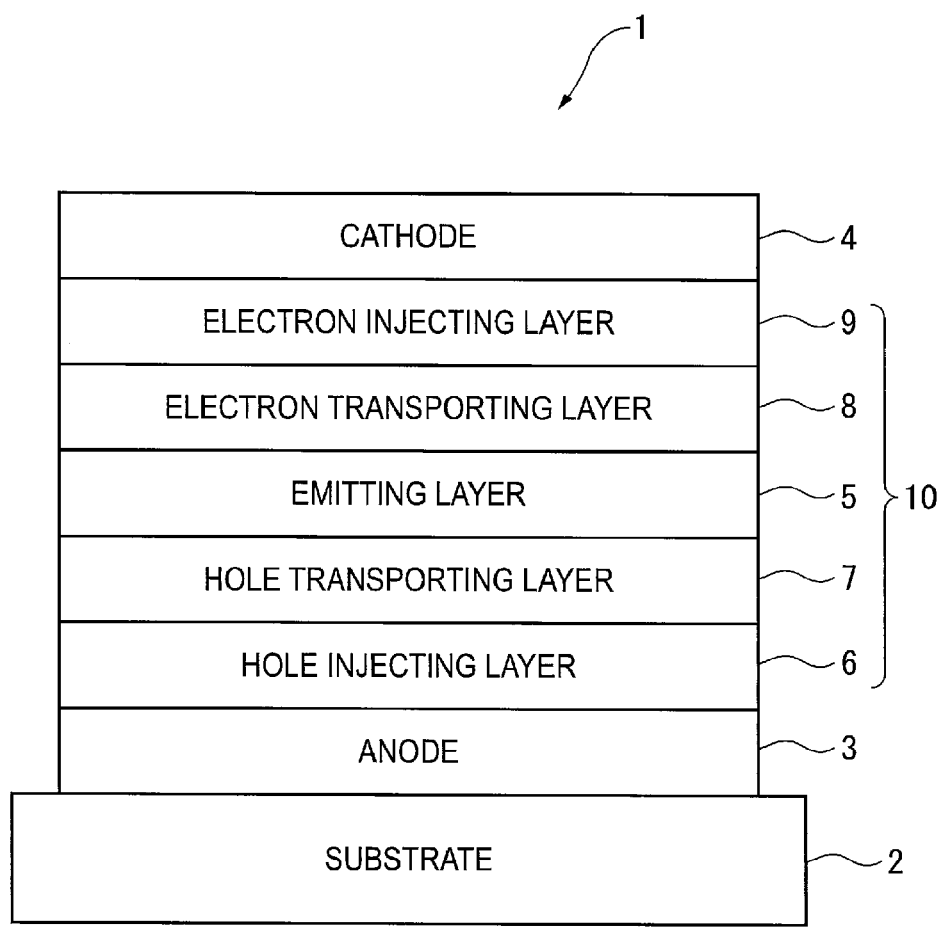
FIG. 1 schematically shows an exemplary arrangement of an organic electroluminescence device according to an exemplary embodiment.

FIG. 1 schematically shows an arrangement of exemplary organic EL device according to the exemplary embodiment.

An organic EL device 1 includes a light-transmissive substrate 2, an anode 3, a cathode 4 and an organic layer 10 disposed between the anode 3 and the cathode 4. The organic layer 10 includes a hole injecting layer 6, a hole transporting layer 7, an emitting layer 5, an electron transporting layer 8, and an electron injecting layer 9, which are sequentially laminated from the anode 3.

Emitting Layer

The emitting layer 5 of the organic EL device 1 in the exemplary embodiment contains a first compound, a second compound and a third compound. The emitting layer 5 may include a metal complex.

First Compound

The first compound in the exemplary embodiment is a delayed fluorescent compound. An energy gap $T_{77K}(M1)$ at 77 [K] of the first compound is larger than an energy gap $T_{77K}(M2)$ at 77 [K] of the second compound.

The first compound of the exemplary embodiment is exemplified by a compound represented by a formula (1) below.

[Formula 8]

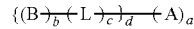

(1)

In the formula (1), A is a group having a partial structure selected from formulae (a-1) to (a-7) below. When a plurality of A are present, the plurality of A are optionally mutually the same or different and the plurality of A are optionally mutually bonded to form a saturated or unsaturated ring.

B is a group having a partial structure selected from formulae (b-1) to (b-6) below. When a plurality of B are present, the plurality of B are optionally mutually the same or different and the plurality of B are optionally mutually bonded to form a saturated or unsaturated ring.

a, b and d are each independently an integer of 1 to 5.

c is an integer of 0 to 5.

When c is 0, A and B are bonded by a single bond or a spiro bond.

When c is an integer of 1 to 5, L is a linking group selected from the group consisting of a substituted or unsubstituted aromatic hydrocarbon group having 6 to 30 ring carbon atoms and a substituted or unsubstituted heterocyclic group having 5 to 30 ring atoms. When a plurality of L are present, the plurality of L are optionally mutually the same or different and are optionally mutually bonded to form a saturated or unsaturated ring.

[Formula 9]

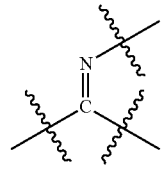

(a-1)

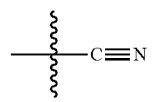

(a-2)

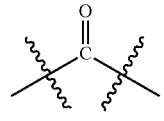

(a-3)

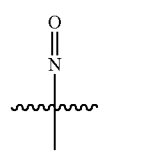

(a-4)

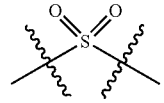

(a-5)

(a-6) 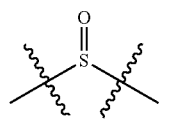

(a-7) 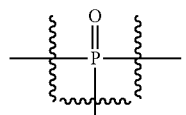

[Formula 10]

(b-1) 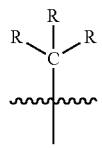

(b-2) 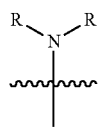

(b-3) 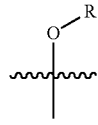

(b-4) 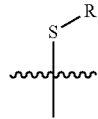

(b-5) 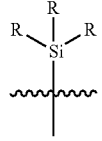

(b-6) 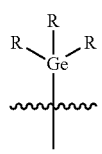

In the formulae (b-1) to (b-6): R is each independently a hydrogen atom or a substituent. When R is a substituent, the substituent is selected from the group consisting of a substituted or unsubstituted aromatic hydrocarbon group having 6 to 30 ring carbon atoms, a substituted or unsubstituted heterocyclic group having 5 to 30 ring atoms, and a substituted or unsubstituted alkyl group having 1 to 30 carbon atoms. When a plurality of R are present, the plurality of R are optionally mutually the same or different and are optionally mutually bonded to form a saturated or unsaturated ring.

As the group having the partial structure selected from the formulae (a-1) to (a-7), for instance, the group having the partial structure represented by the formula (a-3) is exemplified by a group represented by a formula (a-3-1).

[Formula 11]

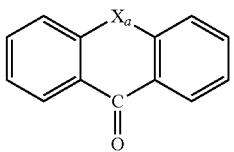
(a-3-1)

In the formula (a-3-1), $X_a$ is a single bond, an oxygen atom, a sulfur atom or a carbon atom bonded to L or B in the formula (1).

As the group having the partial structure selected from the partial structures represented by the formulae (b-1) to (b-6), for instance, the group having the partial structure represented by the formula (b-2) is exemplified by a group represented by a formula (b-2-1).

[Formula 12]

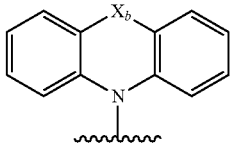
(b-2-1)

In the formula (B-2-1), $X_b$ is a single bond, an oxygen atom, a sulfur atom, $CR_{b1}R_{b2}$ or a carbon atom bonded to L or A in the formula (1).

$R_{b1}$ and $R_{b2}$ are each independently a hydrogen atom or a substituent. When $R_{b1}$ and $R_{b2}$ are substituents, the substituents are each independently selected from the group consisting of a substituted or unsubstituted alkyl group having 1 to 30 carbon atoms and a substituted or unsubstituted aromatic hydrocarbon group having 6 to 30 ring carbon atoms.

$R_{b1}$ and $R_{b2}$ are each preferably a substituent selected from the group consisting of a substituted or unsubstituted alkyl group having 1 to 30 carbon atoms and a substituted or unsubstituted aromatic hydrocarbon group having 6 to 30 ring carbon atoms, more preferably a substituent selected from the group consisting of a substituted or unsubstituted alkyl group having 1 to 30 carbon atoms.

A bonding pattern of the compound represented by the formula (1) is exemplified by bonding patterns shown in Table 1 below.

TABLE 1

| No. | a | b | c | d | Bonding Pattern |
|---|---|---|---|---|---|
| (1A) | 1 | 1 | 0 | 1 | B—A |
| (1B) | 1 | 1 | 1 | 1 | B—L—A |
| (1C) | 2 | 1 | 0 | 1 | B—A—A, B(A)(A) |
| (1D) | 1 | 2 | 0 | 1 | B—B—A, B(B)(A) |
| (1E) | 2 | 1 | 1 | 1 | B—L—A—A, B—L(A)(A) |

TABLE 1-continued

| No. | a | b | c | d | Bonding Pattern |
|---|---|---|---|---|---|
| (1F) | 1 | 2 | 1 | 1 | B—B—L—A,  |
| (1G) | 1 | 1 | 2 | 1 | B—L—L—A |
| (1H) | 1 | 1 | 1 | 2 | 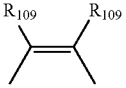, B—L—B—L—A |

In the exemplary embodiment, B in the formula (1) is preferably represented by a formula (100) below.

[Formula 13]

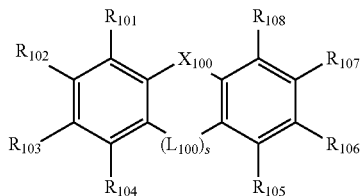  (100)

In the formula (100): $R_{101}$ to $R_{108}$ each independently represent a hydrogen atom or a substituent. When $R_{101}$ to $R_{108}$ are substituents, the substituents are each independently selected from the group consisting of a substituted or unsubstituted aromatic hydrocarbon group having 6 to 30 ring carbon atoms, a substituted or unsubstituted heterocyclic group having 5 to 30 ring atoms, a substituted or unsubstituted alkyl group having 1 to 30 carbon atoms, a substituted silyl group, a substituted or unsubstituted alkoxy group having 1 to 30 carbon atoms, a substituted or unsubstituted aryloxy group having 6 to 30 ring carbon atoms, a substituted or unsubstituted alkylamino group having 2 to 30 carbon atoms, a substituted or unsubstituted arylamino group having 6 to 60 ring carbon atoms, a substituted or unsubstituted alkylthio group having 1 to 30 carbon atoms, and a substituted or unsubstituted arylthio group having 6 to 30 ring carbon atoms. At least one of a combination of $R_{101}$ and $R_{102}$, a combination of $R_{102}$ and $R_{103}$, a combination of $R_{103}$ and $R_{104}$, a combination of $R_{105}$ and $R_{106}$, a combination of $R_{106}$ and $R_{107}$, and a combination of $R_{107}$ and $R_{108}$ optionally forms a saturated or unsaturated cyclic structure.

$L_{100}$ is any one selected from linking groups represented by formulae (111) to (117) below.

s is an integer of 1 to 3. When s is 2 or 3, a plurality of $L_{100}$ are optionally mutually the same or different.

$L_{100}$ is any one selected from linking groups represented by formulae (121) to (125) below.

[Formula 14]

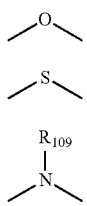

(111)
(112)
(113)
(114)
(115)
(116)
(117)

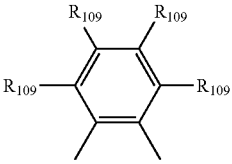

In the formulae (113) to (117), $R^{109}$ each independently represent the same as $R_{101}$ to $R_{108}$ of the formula (100).

However, in the formula (100), one of $R_{101}$ to $R_{108}$ or one of $R_{109}$ is a single bond to be bonded to L or A in the formula (1).

$R_{109}$ may be bonded to $R_{104}$ or $R_{105}$ of the formula (100) to form a saturated or unsaturated cyclic structure.

When a plurality of $R_{109}$ are present, the plurality of $R_{109}$ are mutually the same or different.

[Formula 15]

(121)
(122)
(123)
(124)
(125)

In the above formulae (123) to (125), $R_{110}$ is each independently a hydrogen atom or a substituent. When $R_{110}$ is a substituent, the substituent is selected from the group consisting of a substituted or unsubstituted aromatic hydrocarbon group having 6 to 30 ring carbon atoms, a substituted or unsubstituted heterocyclic group having 5 to 30 ring atoms, and a substituted or unsubstituted alkyl group having 1 to 30 carbon atoms. When a plurality of $R_{110}$ are present, the plurality of $R_{110}$ are optionally mutually the same or different.

$R_{110}$ may be bonded to $R_{101}$ or $R_{108}$ of the formula (100) to form a saturated or unsaturated cyclic structure.

In the exemplary embodiment, $L_{100}$ is preferably represented by one of the formulae (111) to (114), more preferably represented by the formula (113) or (114).

In the exemplary embodiment, $X_{100}$ is preferably represented by one of the formulae (121) to (124), more preferably represented by the formula (123) or (124).

The compound represented by the formula (1) is preferably a compound represented by a formula (10) below.

[Formula 16]

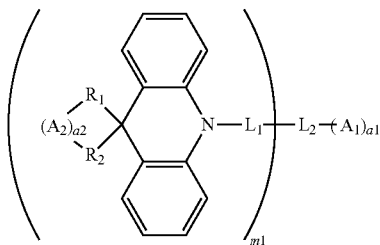

(10)

In the formula (10): a1 is 0 or 1 and a2 is 0 or 1, provided that a1+a2≥1.

m1 is an integer of 1 to 5.

When a2 is 0, $R_1$ and $R_2$ each independently represent a hydrogen atom or a monovalent substituent. When $R_1$ and $R_2$ are substituents, the substituents are each independently selected from the group consisting of a substituted or unsubstituted aromatic hydrocarbon group having 6 to 30 ring carbon atoms, a substituted or unsubstituted heterocyclic group having 5 to 30 ring atoms, a substituted or unsubstituted alkyl group having 1 to 30 carbon atoms, a substituted or unsubstituted alkoxy group having 1 to 30 carbon atoms, a substituted or unsubstituted aralkyl group having 7 to 30 carbon atoms, a substituted or unsubstituted aryloxy group having 6 to 30 ring carbon atoms, and a substituted silyl group.

When a2 is 1, $R_1$ and $R_2$ are each independently a linking group selected from the group consisting of a substituted or unsubstituted aromatic hydrocarbon group having 6 to 30 ring carbon atoms, a substituted or unsubstituted heterocyclic group having 5 to 30 ring atoms, a substituted or unsubstituted alkyl group having 1 to 30 carbon atoms, a substituted or unsubstituted alkoxy group having 1 to 30 carbon atoms, a substituted or unsubstituted aralkyl group having 7 to 30 carbon atoms, a substituted or unsubstituted aryloxy group having 6 to 30 ring carbon atoms, and a substituted silyl group.

When m1 is 2 or more, a plurality of $R_1$ are mutually the same or different; a plurality of $R_2$ are mutually the same or different.

$A_1$ and $A_2$ are each independently a group having a partial structure selected from the formulae (a-1) to (a-7). When m1 is 2 or more, a plurality of $A_2$ are mutually the same or different.

When a1 is 0, $L_2$ is a hydrogen atom or a monovalent substituent. When $L_2$ is a monovalent substituent, the substituent is selected from the group consisting of a substituted or unsubstituted aromatic hydrocarbon group having 6 to 30 ring carbon atoms and a substituted or unsubstituted heterocyclic group having 5 to 30 ring atoms.

When a1 is 1, $L_2$ is a single bond or a linking group. When $L_2$ is a linking group, the linking group is selected from the group consisting of a substituted or unsubstituted aromatic hydrocarbon group having 6 to 30 ring carbon atoms and a substituted or unsubstituted heterocyclic group having 5 to 30 ring atoms.

$L_1$ is a single bond or a linking group. When $L_1$ is a linking group, the linking group is selected from the group consisting of a substituted or unsubstituted aromatic hydrocarbon group having 6 to 30 ring carbon atoms and a substituted or unsubstituted heterocyclic group having 5 to 30 ring atoms. When m1 is 2 or more, a plurality of $L_1$ are mutually the same or different.

In the exemplary embodiment, when a2 is 0, $R_1$ and $R_2$ are preferably a substituent selected from the group consisting of a substituted or unsubstituted aromatic hydrocarbon group having 6 to 30 ring carbon atoms, a substituted or unsubstituted heterocyclic group having 5 to 30 ring atoms and a substituted silyl group, more preferably a substituent selected from the group consisting of a substituted or unsubstituted aromatic hydrocarbon group having 6 to 30 ring carbon atoms and a substituted or unsubstituted heterocyclic group having 5 to 30 ring atoms.

In the exemplary embodiment, when a2 is 1, $R_1$ and $R_2$ are preferably a linking group selected from the group consisting of a substituted or unsubstituted aromatic hydrocarbon group having 6 to 30 ring carbon atoms, a substituted or unsubstituted heterocyclic group having 5 to 30 ring atoms and a substituted silyl group, more preferably a linking group selected from the group consisting of a substituted or unsubstituted aromatic hydrocarbon group having 6 to 30 ring carbon atoms and a substituted or unsubstituted heterocyclic group having 5 to 30 ring atoms.

The compound represented by the formula (1) is exemplified by a compound represented by a formula (10') below.

[Formula 17]

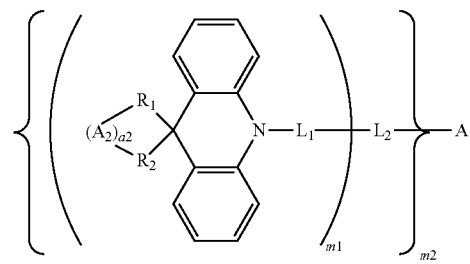

(10')

In the formula (10'): m2 is 2; a2 is 0 or 1; a plurality of a2 are mutually the same or different.

m1 is an integer of 1 to 5. A plurality of m1 are mutually the same or different.

When a2 is 0, $R_1$ and $R_2$ each independently represent a hydrogen atom or a monovalent substituent. When $R_1$ and $R_2$ are substituents, the substituents are each independently selected from the group consisting of a substituted or unsubstituted aromatic hydrocarbon group having 6 to 30 ring carbon atoms, a substituted or unsubstituted heterocyclic group having 5 to 30 ring atoms, a substituted or unsubstituted alkyl group having 1 to 30 carbon atoms, a substituted or unsubstituted alkoxy group having 1 to 30 carbon atoms, a substituted or unsubstituted aralkyl group having 7 to 30 carbon atoms, a substituted or unsubstituted aryloxy group having 6 to 30 ring carbon atoms, and a substituted silyl group.

When a2 is 1, $R_1$ and $R_2$ are each independently a linking group selected from the group consisting of a substituted or unsubstituted aromatic hydrocarbon group having 6 to 30 ring carbon atoms, a substituted or unsubstituted heterocyclic group having 5 to 30 ring atoms, a substituted or unsubstituted alkyl group having 1 to 30 carbon atoms, a substituted or unsubstituted alkoxy group having 1 to 30 carbon atoms, a substituted or unsubstituted aralkyl group having 7 to 30 carbon atoms, a substituted or unsubstituted aryloxy group having 6 to 30 ring carbon atoms, and a substituted silyl group.

A plurality of $R_1$ are mutually the same or different. A plurality of $R_2$ are mutually the same or different.

$A_1$ and $A_2$ are a group having a partial structure selected from the formulae (a-1) to (a-7). A plurality of $A_2$ are mutually the same or different.

$L_2$ is a single bond or a linking group. When $L_2$ is a linking group, the linking group is selected from the group consisting of a substituted or unsubstituted aromatic hydrocarbon group having 6 to 30 ring carbon atoms and a substituted or unsubstituted heterocyclic group having 5 to 30 ring atoms. A plurality of $L_2$ are mutually the same or different.

$L_1$ is a single bond or a linking group. When $L_1$ is a linking group, the linking group is selected from the group consisting of a substituted or unsubstituted aromatic hydrocarbon group having 6 to 30 ring carbon atoms and a substituted or unsubstituted heterocyclic group having 5 to 30 ring atoms. A plurality of $L_1$ are mutually the same or different.

The compound represented by the formula (10) is exemplified by a compound represented by a formula (10A) below.

[Formula 18]

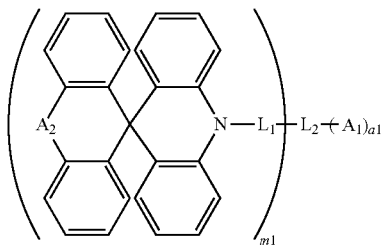

(10A)

In the formula (10A), a1, m1, $A_1$, $A_2$, $L_1$ and $L_2$ each represent the same as a1, m1, $A_1$, $A_2$, $L_1$ and $L_2$ in the formula (10).

The compound represented by the formula (10) or the formula (10') is exemplified by compounds represented by formulae (10B) to (10E) below.

[Formula 19]

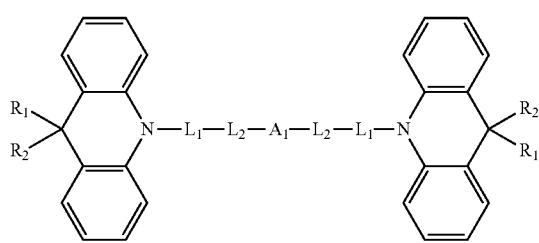

(10B)

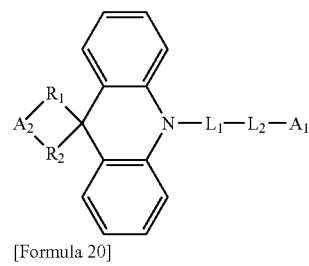

(10C)

[Formula 20]

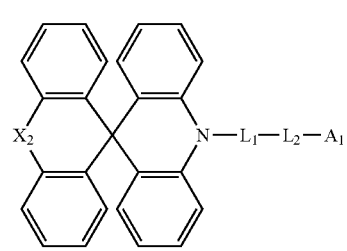

(10D)

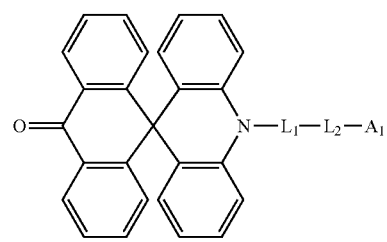

(10E)

In the formula (10D), $X_2$ is selected from the group consisting of =N-$L_1$-$L_2$-$A_1$, an oxygen atom, a sulfur atom and a selenium atom. In the formulae (10B), (10C), (10D) and (10E), $R_1$, $R_2$, $A_1$, $A_2$, $L_1$ and $L_2$ each represent the same as $R_1$, $R_2$, $A_1$, $A_2$, $L_1$ and $L_2$ in the formula (10).

Delayed Fluorescence

Thermally activated delayed fluorescence is described in "Yuki Hando-tai no Debaisu Bussei (Device Physics of Organic Semiconductor)" edited by Chihaya Adachi, published by Kodansha Company Ltd, pages 261 to 268. This document describes that, when an energy gap $\Delta E_{13}$ between a singlet state and a triplet state of a fluorescent material can be decreased, in spite of a typical low transition probability, inverse energy transfer from the triplet state to the singlet state occurs at a high efficiency to express thermally stimulated delayed fluorescence (TADF). Further, a generating mechanism of delayed fluorescence is described in FIG. 10.38 in this document. The first compound in the exemplary embodiment is a compound emitting thermally activated delayed fluorescence to be generated by such a mechanism.

Delayed fluorescence can be observed by measuring transient PL (Photo Luminescence).

Behavior of delayed fluorescence can also be analyzed based on the decay curve obtained by measuring the transient PL. The transient PL measurement is a method for measuring reduction behavior (transitional property) of PL emission obtained after irradiating pulse laser on a sample to excite the sample and stopping irradiating the pulse laser. PL emission using a TADF material is divided into an emission component from singlet excitons generated by the first PL excitation and an emission component from singlet excitons generated via triplet excitons. Lifetime of the singlet excitons initially generated in the PL excitation is very short at a nano-second order. Accordingly, the emission from the singlet excitons is rapidly reduced after pulse laser radiation.

On the other hand, since delayed fluorescence provides emission from singlet excitons generated through long-life triplet excitons, emission is gradually reduced. Thus, there is a large difference in time between the emission from the singlet excitons initially generated in the PL excitation and the emission from the singlet excitons derived from the triplet excitons. Accordingly, a luminous intensity derived from delayed fluorescence is obtainable.

Figure 2:
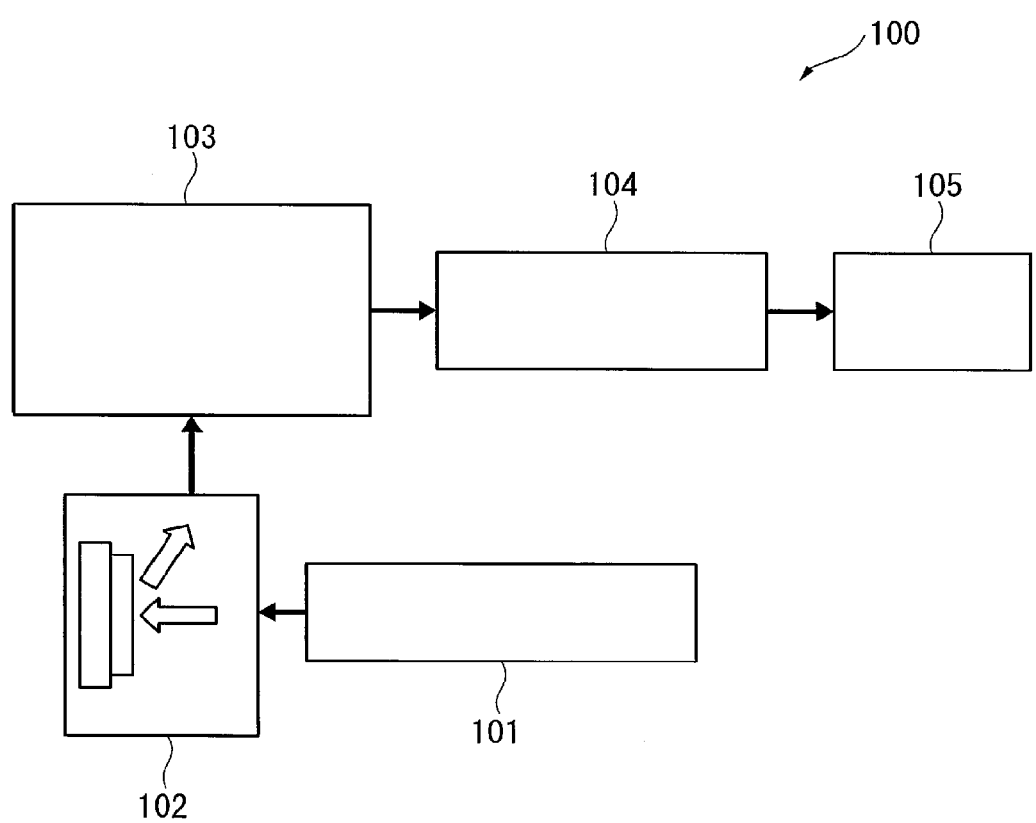
FIG. 2 is a schematic illustration of a measuring device of transitional PL.

FIG. 2 is a schematic illustration of an exemplary device for measuring the transient PL.

In the exemplary embodiment, a transient PL measuring device 100 includes a pulse laser 101 configured to irradiate light having a predetermined wavelength, a sample chamber 102 configured to house a measurement sample, a spectrometer 103 configured to disperse the light irradiated from the measurement sample, a streak camera 104 configured to produce a two-dimensional image, and a personal computer 105 configured to import and analyze the two-dimensional image. A device usable for the measurement of the transient PL is not limited to the device described in the first exemplary embodiment.

The sample housed in the sample chamber 102 is obtained by forming a thin film, in which a doping material is doped to a matrix material at a concentration of 12 mass %, on the quartz substrate.

The thin film sample housed in the sample chamber 102 is irradiated with pulse laser from the pulse laser 101 to excite the doping material. Emission is extracted at 90 degrees angle relative to an irradiation direction of the excited light. The extracted emission is dispersed with the spectrometer 103 to form a two-dimensional image in the streak camera 104. As a result, the two-dimensional image expressed in coordinates of which ordinate axis indicates time and of which abscissa axis indicates a wavelength, in which a luminous point indicates a luminous intensity, can be obtained. If the two-dimensional image is cut out along a predetermined time axis, emission spectrum expressed in coordinates of which ordinate axis indicates a luminous intensity and of which abscissa axis indicates the wavelength can be obtained. If the two-dimensional image is cut out along a wavelength axis, a decay curve (transient PL) expressed in coordinates of which ordinate axis indicates a logarithm of the luminous intensity and of which abscissa axis indicates time can be obtained.

For instance, using a reference compound H1 below as the matrix material and a reference compound D1 as the doping material, a thin film sample A was prepared as described above and the transitional PL was measured.

[Formula 21]

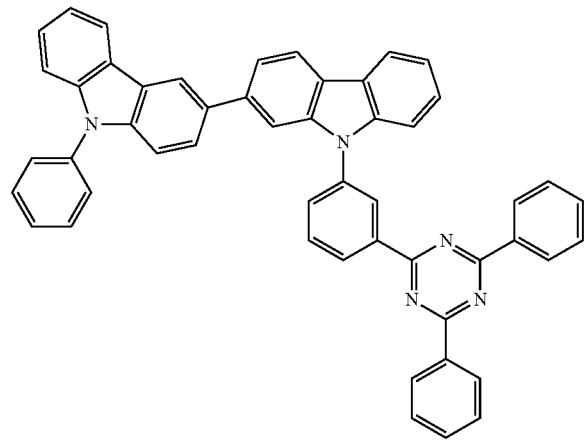

(Reference Compound H1)

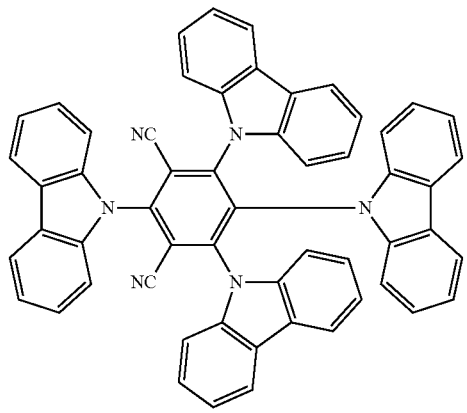

(Reference Compound D1)

Herein, the decay curve was analyzed using the above-described thin film sample A and a thin film sample B. The thin film sample B was prepared as described above, using a reference compound H2 below as the matrix material and the reference compound D1 as the doping material.

Figure 3:
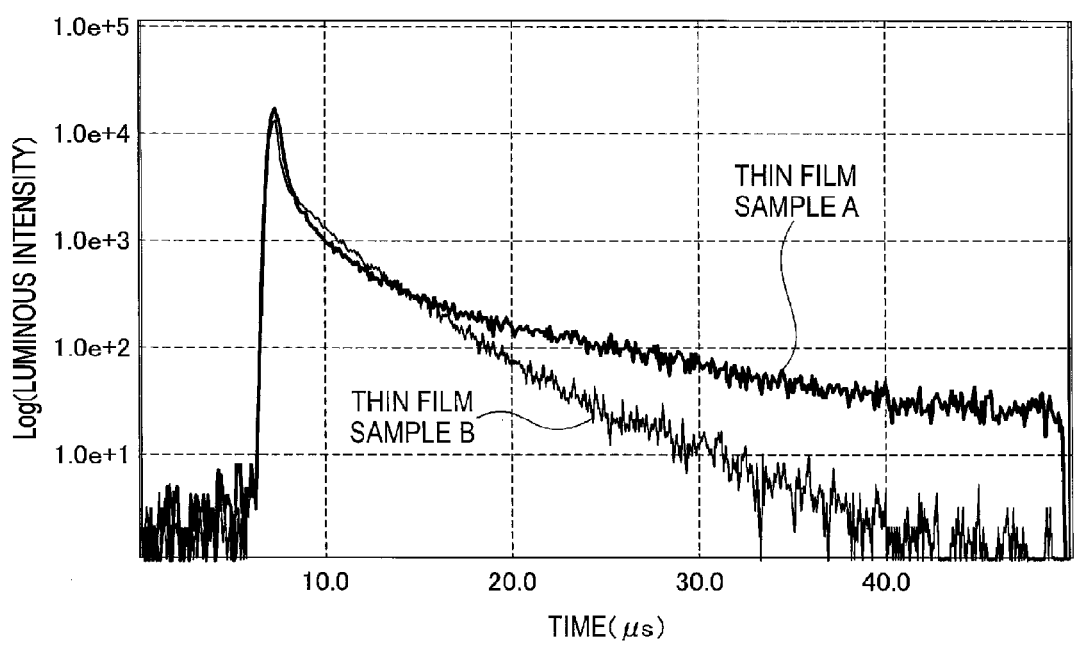
FIG. 3 shows an example of a decay curve of the transitional PL.

FIG. 3 shows a decay curve obtained from the measured transitional PL of the thin film sample A and the thin film sample B.

[Formula 22]

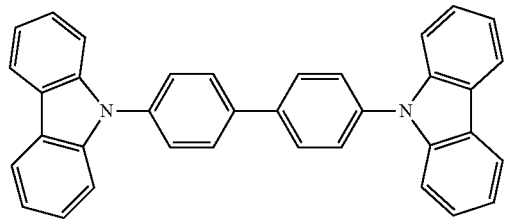

(Reference Compound H2)

An emission decay curve expressed in coordinates of which ordinate axis indicates a luminous intensity and of which abscissa axis indicates time can be obtained by measuring the transient PL as described above. Based on the emission decay curve, a fluorescence intensity ratio between fluorescence in the single state generated by light excitation and the delayed fluorescence in the singlet state generated by the inverse energy transfer through the triplet state can be estimated. In the delayed fluorescence material, a ratio of the delayed fluorescence intensity to be gradually reduced is larger to some extent than a ratio of the fluorescence intensity to be rapidly reduced.

In the first exemplary embodiment, an amount of the delayed fluorescence can be calculated using the device of FIG. 2. In the first compound after excited with pulse light (light irradiated from the pulse laser) having a wavelength to be absorbed in the first compound, Prompt Emission that is immediately observed in the excited state and Delay Emission that is not observed immediately after the excitation but is later observed are present. In the first exemplary embodiment, an amount of Delay Emission is preferably 5% or more based on an amount of Prompt Emission.

The amount of Prompt Emission and the amount of Delay Emission can be obtained according to the method as a method described in "Nature 492, 234-218, 2012." The amount of Prompt emission and the amount of Delay emission may be calculated using a device different from one described in the above Reference Literature.

A sample usable for measuring delayed fluorescence is obtained, for instance, by co-depositing the first compound and a compound TH-2 described later on a quartz substrate so that a ratio of the first compound is 12 mass %, thereby forming a 100-nm-thick thin film.

Relationship Between Triplet Energy and Energy Gap at 77K

Description will be made on a relationship between a triplet energy and an energy gap at 77K. In the exemplary embodiment, the energy gap at 77 [K] is different from a typical triplet energy in some aspects.

For the first compound (measurement target), the triplet energy is measured as follows. A measurement target compound (the first compound) and a compound TH-2 are co-deposited on a quartz substrate to prepare a sample sealed in an NMR tube. The samples were prepared under the following conditions.

quartz substrate/TH-2: first compound (film thickness: 100 nm, concentration of first compound: 12 mass %).

[Formula 23]

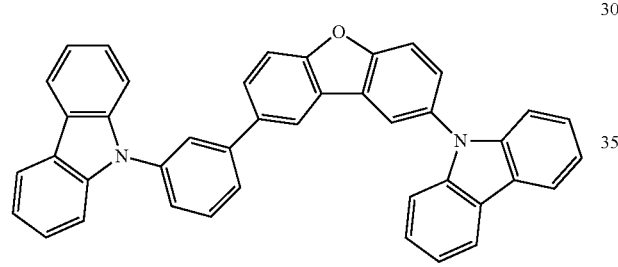

TH-2

A phosphorescent spectrum (ordinate axis: phosphorescent luminous intensity, abscissa axis: wavelength) of each of the samples was measured at a low temperature (77K). A tangent was drawn to the rise of the phosphorescent spectrum on the short-wavelength side. An energy amount was calculated as the energy gap $T_{77K}$ at 77K according to a conversion equation 1 below based on a wavelength value $\lambda_{edge}$ (nm) at an intersection of the tangent and the abscissa axis.

$T_{77K}[eV]=1239.85/\lambda_{edge}$    Conversion Equation 1:

For phosphorescence measurement, a spectrophotofluorometer body F-4500 (manufactured by Hitachi High-Technologies Corporation) was used. It should be noted that the phosphorescence measuring device may be different from the above device.

The tangent to the rise of the phosphorescence spectrum on the short-wavelength side is drawn as follows. While moving on a curve of the phosphorescence spectrum from the short-wavelength side to the maximum spectral value closest to the short-wavelength side among the maximum spectral values, a tangent is checked at each point on the curve toward the long-wavelength of the phosphorescence spectrum. An inclination of the tangent was increased as the curve rose (i.e., a value of the ordinate axis was increased), A tangent drawn at a point of the maximum inclination (i.e., a tangent at an inflection point) is defined as the tangent to the rise of the phosphorescence spectrum on the short-wavelength side.

The maximum with peak intensity being 15% or less of the maximum peak intensity of the spectrum is not included in the above-mentioned maximum closest to the short-wavelength side of the spectrum. The tangent drawn at a point of the maximum spectral value being the closest to the short-wavelength side and having the maximum inclination is defined as a tangent to the rise of the phosphorescence spectrum on the short-wavelength side.

Method of Preparing First Compound

The first compound can be prepared by a method described in Chemical Communications p. 10385-10387 (2013) and NATURE Photonics p. 326-332 (2014).

Specific examples of the first compound of the exemplary embodiment are shown below. It should be noted that the first compound according to the invention is not limited to these specific examples.

[Formula 24]

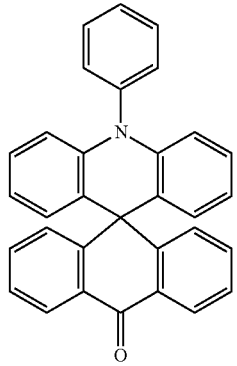

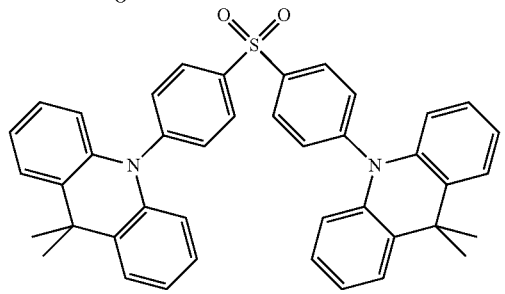

Second Compound

The second compound in the exemplary embodiment is a compound having a fused ring structure. The fused ring structure has a structure represented by a formula (2) below and has eight or less rings in total.

[Formula 25]

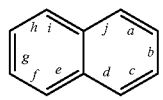

(2)

In the formula (2), a monocyclic ring or a fused ring may be fused to at least one of positions a, c, d, e, f, h, i and j. A five-membered ring (monocyclic ring) or a fused ring having a five-membered ring may be fused to at least one of positions b and g.

When a six-membered ring is fused to the positions i and j, a monocyclic ring or a fused ring is also fused to the positions d and e.

When a six-membered ring is fused to the positions d and e, a monocyclic ring or a fused ring is also fused to the positions i and j.

When a fused ring having a five-membered ring is fused to the position b, the five-membered ring of the fused ring is directly fused to the position b.

When a fused ring having a five-membered ring is fused to the position g, the five-membered ring of the fused ring is directly fused to the position g.

None of a six-membered ring (monocyclic ring) and a six-membered ring of a fused ring is directly bonded to the positions b and g. Further, when a ring is fused to at least one of the positions a, c, f and h, a monocyclic ring is preferably fused. When a fused ring is fused, the fused ring preferably has a five-membered ring.

The total number of the rings of the fused ring structure is preferably six or less, more preferably five or less, further preferably four or less.

Examples of fused ring structure having a structure represented by the formula (2) and having eight or less rings in total are fused ring structures below.

For instance, when a six-membered ring (e.g., a benzene ring) is fused to the position a in the formula (2), the fused ring structure is represented by a formula (2A) below.

[Formula 26]

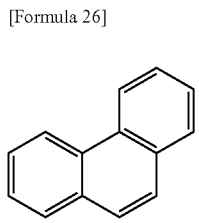

(2A)

For instance, when a six-membered ring is fused to the positions i and j and a six-membered ring is also fused to the positions e and d in the formula (2), the fused ring structure is represented by a formula (2B) below.

[Formula 27]

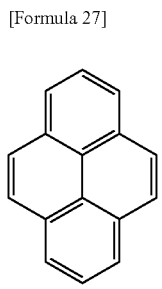

(2B)

For instance, when a five-membered ring is fused to the positions i and j in the formula (2), the fused ring structure is represented by a formula (2C) below. For instance, when a five-membered ring is directly fused to the positions i and j and a ten-member ring (e.g., a naphthalene ring) is further fused to the five-membered ring, the fused ring structure is represented by a formula (2D) below. Alternatively, the fused ring structure is represented by the formula (2D) below when an acenaphthene ring (a fused ring having a five-membered ring) is fused to the position b and the five-membered ring of the acenaphthene ring is directly fused to the position b.

[Formula 28]

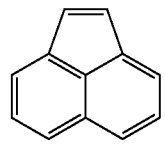

(2C)

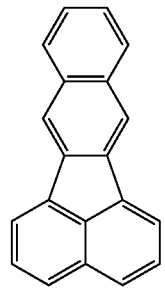

(2D)

For instance, when a five-membered ring is fused to the position c in the formula (2) and a six-membered ring is further fused to the five-membered ring, the fused ring structure is represented by a formula (2E) below.

[Formula 29]

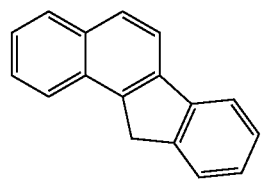

(2E)

For instance, when a ten-membered ring is fused to the position a in the formula (2), the fused ring structure is represented by a formula (2F) below.

[Formula 30]

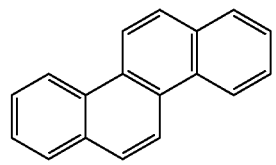

(2F)

For instance, when a six-membered ring is used to each of the positions a and c in the formula (2), the fused ring structure is represented by a formula (2G) below.

[Formula 31]

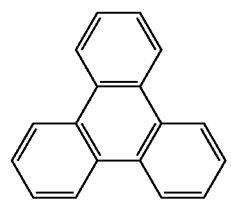

(2G)

In the exemplary embodiment, "the total number of the rings (or rings in total)" means the total number of the five-membered ring and the six-membered ring forming the fused ring structure that is a main skeleton.

For instance, in the case of the fused ring structure represented by the formula (2A) and the fused ring structure represented by the formula (2C), the total number of the rings is three. In the case of the fused ring structure represented by the formula (2B), the fused ring structure represented by the formula (2E), the fused ring structure represented by the formula (2F) and the fused ring structure represented by the formula (2G), the total number of the rings is four. In the case of the fused ring structure represented by the formula (2D), the total number of the rings is five.

The fused ring structure of the second compound is preferably a structure allowing of having energy capable of emitting light in a blue region and increasing an energy transfer efficiency from the singlet state of the first compound (a thermally activated delayed fluorescence material) to the singlet state of the second compound. In order to increase the energy transfer efficiency from the singlet state of thermally activated delayed fluorescence material (the first compound) to the singlet state of the second compound, it is preferable to inhibit the competing energy transfer from the triplet state of thermally activated delayed fluorescence material (the first compound) to the triplet state of the second compound. This is because the energy transfer from the triplet state of thermally activated delayed fluorescence material (the first compound) to the triplet state of the second compound causes a decrease in the efficiency due to thermal deactivation.

Herein, the energy transfer between the triplet states thereof significantly depends on an overlapping size of electron clouds of the first compound (thermally activated delayed fluorescence material) and the second compound.

For this reason, the energy transfer can be inhibited, for instance, by decreasing a spread of a molecular orbit on a main skeleton of the second compound.

Specifically, with an arrangement that the second compound has the structure represented by the formula (2) in the fused ring of the main skeleton of the second compound and the total number of the five-membered ring and the six-membered ring in the main skeleton is eight or less, it is inferred that the spread of the molecular orbit on the main skeleton of the second compound can be decreased to inhibit the energy transfer to the triplet state of the second compound, in comparison with a case where a six-membered ring is directly fused to the positions b and g of the structure represented by the formula (2) to provide a structure (e.g., an anthracene ring and a naphthacene ring) in which three or more six-membered rings are linearly fused, and a case where the total number of the five-membered ring and the six-membered ring is nine or more.

Consequently, it is inferred that the energy transfer efficiency from the singlet state of the first compound (thermally activated delayed fluorescence material) and the singlet state of the second compound is increased to improve the Luminous efficiency.

In the exemplary embodiment, when the second compound has a dihenzofuranyl group, dihenzothiophenyl group and the like as a side chain of the main skeleton, it is inferred that the overlapping of the electron clouds is further inhibited to enhance the luminous efficiency.

In the exemplary embodiment, the second compound is also preferably a compound having a partial structure represented by a formula (20) below, the structure being asymmetric relative to an X-Y axis in the formula (20).

[Formula 32]

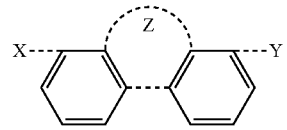

(20)

In the formula (20), Z is a substituted or unsubstituted ring structure having 5 or 6 ring carbon atoms.

In the exemplary embodiment, when the second compound has a fused ring structure as a substituent, the fused ring structure as the substituent is preferably a structure in which none of a six-membered ring (monocyclic ring) and a six-membered ring of the fused ring is directly fused to the positions b and g of the structure represented by the formula (2). Moreover, the fused ring structure as the substituent is preferably not a structure in which a monocyclic ring and a fused ring is fused to only the position b, only the position g, or only the two positions b and g in the structure represented by the formula (2). Moreover, the fused ring structure as the substituent is preferably not a structure in which a six-membered ring is fused to only the two positions i and j or only the two positions d and e. In the fused ring structure as the substituent, the total number of the rings is preferably eight or less, more preferably six or less, further preferably five or less, more further preferably four or less.

Examples of the fused ring structure including the structure represented by the formula (2) and having eight or less rings in total include benzofluorene (benzo[a]fluorene, benzo[b]fluorene, benzo[c]fluorene), fluoranthene, henzofluoranthene (benzo[b]fluoranthene, benzo[k]fluoranthene), pyrene, benzo[a]pyrene, chrysene, benzo[a]anthracene, and triphenylene.

In the exemplary embodiment, the energy gap $T_{77K}(M2)$ at 77 [K] of the second compound is preferably 1.9 eV or more, more preferably 2.0 eV or more.

In the exemplary embodiment, the second compound is preferably a compound having a benzofluorene skeleton, fluoranthene skeleton, pyrene skeleton, or chrysene skeleton in order to improve the luminous efficiency.

In the exemplary embodiment, the second compound is preferably a compound represented by a formula (21) below.

[Formula 33]

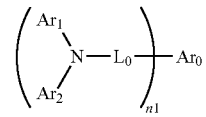

(21)

In the formula (21): n1 is an integer of 1 or more.

$Ar_0$ is a group having a benzofluorene skeleton, fluoranthene skeleton, pyrene skeleton, or chrysene skeleton.

$Ar_1$ and $Ar_2$ are each independently a substituent selected from the group consisting of a substituted or unsubstituted aromatic hydrocarbon group having 6 to 30 ring carbon atoms, a substituted or unsubstituted heterocyclic group having 5 to 30 ring atoms, a substituted or unsubstituted alkyl group having 1 to 30 carbon atoms, and a substituted or unsubstituted aralkyl group having 7 to 30 carbon atoms. $Ar_1$ and $Ar_2$ are optionally mutually bonded to form a saturated or unsaturated ring. When n1 is 2 or more, a plurality of $Ar_1$ are mutually the same or different and a plurality of $Ar_2$ are mutually the same or different.

$L_0$ is a single bond or a linking group. When $L_0$ is a linking group, the linking group is selected from the group consisting of a substituted or unsubstituted aromatic hydrocarbon group having 6 to 30 ring carbon atoms and a substituted or unsubstituted heterocyclic group having 5 to 30 ring atoms. When n1 is 2 or more, a plurality of $L_0$ are mutually the same or different.

In the exemplary embodiment, $Ar_0$ in the formula (21) is preferably a group having a pyrene skeleton or a chrysene skeleton.

In the exemplary embodiment, it is also preferable that n1 is 2 and $L_0$ is a single bond in the formula (21).

When $Ar_0$ is a pyrene skeleton, n1 is 2, and is a single bond, nitrogen atoms of the formula (21) are preferably bonded to a position 1 and a position 6 of the pyrene skeleton. When $Ar_0$ is a chrysene skeleton, n1 is 2, and $L_0$ is a single bond, nitrogen atoms of the formula (21) are preferably bonded to a position 6 and a position 12 of the chrysene skeleton.

In the exemplary embodiment, $Ar_0$ in the formula (21) is also preferably a group having a benzofluorene skeleton. The group having the benzofluorene skeleton as $Ar_0$ is preferably a group represented by a formula (Ar-1) below.

[Formula 34]

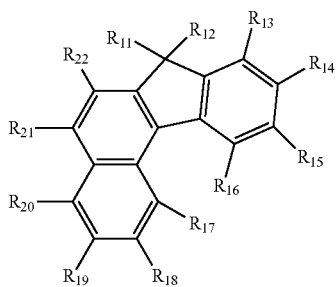

(Ar-1)

In the formula (Ar-1): $R_{11}$ and $R_{12}$ each independently represent a hydrogen atom or a substituent. When $R_{11}$ and $R_{12}$ are substituents, the substituents are each independently selected from the group consisting of a substituted or unsubstituted alkyl group having 1 to 30 carbon atoms and a substituted or unsubstituted aromatic hydrocarbon group having 6 to 30 ring carbon atoms.

$R_{13}$, $R_{14}$, $R_{15}$, $R_{16}$, $R_{17}$, $R_{18}$, $R_{19}$, $R_{20}$, $R_{21}$ and $R_{22}$ each independently represent a hydrogen atom, a substituent or a single bond to be bonded to $L_0$. At least one of $R_{13}$, $R_{14}$, $R_{15}$, $R_{16}$, $R_{17}$, $R_{18}$, $R_{19}$, $R_{20}$, $R_{21}$ and $R_{22}$ is a single bond to be bonded to $L_0$.

When $R_{13}$, $R_{14}$, $R_{15}$, $R_{16}$, $R_{17}$, $R_{18}$, $R_{19}$, $R_{20}$, $R_{21}$ and $R_{22}$ are substituents, the substituents are each independently selected from the group consisting of a halogen atom, a cyano group, a nitro group, a hydroxyl group, a substituted silyl group, a carboxyl group, a substituted or unsubstituted aromatic hydrocarbon group having 6 to 30 ring carbon atoms, a substituted or unsubstituted alkyl group having 1 to 30 carbon atoms, a substituted or unsubstituted alkylamino group having 1 to 30 carbon atoms, a substituted or unsubstituted arylamino group having 6 to 30 ring carbon atoms, a substituted or unsubstituted alkoxy group having 1 to 30 carbon atoms, a substituted or unsubstituted aryloxy group having 6 to 30 ring carbon atoms, a substituted or unsubstituted arylthio group having 6 to 30 ring carbon atoms, and a substituted or unsubstituted alkoxycarbonyl group having 1 to 30 carbon atoms. At least one of a combination of $R_{13}$ and $R_{14}$, a combination of $R_{14}$ and $R_{15}$, a combination of $R_{15}$ and $R_{16}$, a combination of $R_{17}$ and $R_{18}$, a combination of $R_{18}$ and $R_{19}$, a combination of $R_{19}$ and $R_{20}$, a combination of $R_{20}$ and $R_{21}$, and a combination of $R_{21}$ and $R_{22}$ optionally forms a saturated or unsaturated ring.

In the exemplary embodiment, the group represented by the formula (Ar-1) is preferably a group represented by a formula (Ar-2) below.

[Formula 35]

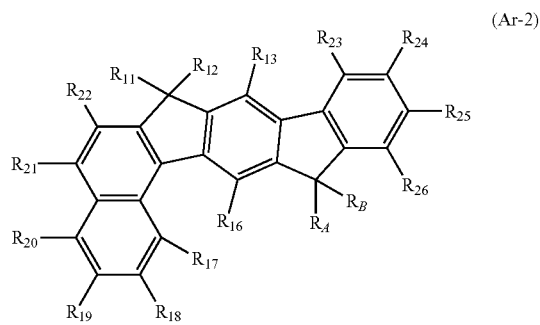

(Ar-2)

In the formula (Ar-2): $R_{11}$, $R_{12}$, $R_A$ and $R_B$ each independently represent a hydrogen atom or a substituent. When $R_{11}$, $R_{12}$, $R_A$ and $R_B$ are substituents, the substituents are each independently selected from the group consisting of a substituted or unsubstituted alkyl group having 1 to 30 carbon atoms and a substituted or unsubstituted aromatic hydrocarbon group having 6 to 30 ring carbon atoms.

$R_{13}$, $R_{16}$, $R_{17}$, $R_{18}$, $R_{19}$, $R_{20}$, $R_{21}$, $R_{22}$, $R_{23}$, $R_{24}$, $R_{25}$ and $R_{26}$ each independently represent a hydrogen atom, a substituent or a single bond to be bonded to $L_0$. At least one of $R_{13}$, $R_{16}$, $R_{17}$, $R_{18}$, $R_{19}$, $R_{20}$, $R_{21}$, $R_{22}$, $R_{23}$, $R_{24}$, $R_{25}$ and $R_{26}$ is a single bond to be bonded to $L_0$.

When $R_{13}$, $R_{16}$, $R_{17}$, $R_{18}$, $R_{19}$, $R_{20}$, $R_{21}$, $R_{22}$, $R_{23}$, $R_{24}$, $R_{25}$ and $R_{26}$ are substituents, the substituents are each independently selected from the group consisting of a halogen atom, a cyano group, a nitro group, a hydroxyl group, a substituted silyl group, a carboxyl group, a substituted or unsubstituted aromatic hydrocarbon group having 6 to 30 ring carbon atoms, a substituted or unsubstituted alkyl group having 1 to 30 carbon atoms, a substituted or unsubstituted alkylamino group having 1 to 30 carbon atoms, a substituted or unsubstituted arylamino group having 6 to 30 ring carbon atoms, a substituted or unsubstituted alkoxy group having 1 to 30 carbon atoms, a substituted or unsubstituted aryloxy group having 6 to 30 ring carbon atoms, a substituted or unsubstituted arylthio group having 6 to 30 ring carbon atoms, and a substituted or unsubstituted alkoxycarbonyl group having 1 to 30 carbon atoms. At least one of a combination of $R_{17}$ and $R_{18}$, a combination of $R_{18}$ and $R_{19}$, a combination of $R_{19}$ and $R_{20}$, a combination of $R_{20}$ and $R_{21}$, a combination of $R_{21}$ and $R_{22}$, a combination of $R_{23}$ and $R_{24}$, a combination of $R_{24}$ and $R_{25}$, and a combination of $R_{25}$ and $R_{26}$ optionally forms a saturated or unsaturated ring.

In the exemplary embodiment, at east one of $R_{21}$ and $R_{25}$ is preferably a single bond to be bonded to $L_0$.

In the exemplary embodiment, $R_{11}$, $R_{12}$, $R_A$ and $R_B$ are each independently preferably a substituent selected from the group consisting of a substituted or unsubstituted alkyl group having 1 to 30 carbon atoms and a substituted or unsubstituted aromatic hydrocarbon group having 6 to 30 ring carbon atoms.

In the exemplary embodiment, $Ar_1$ and $Ar_2$ of the formula (21) are preferably each independently a substituent selected from the group consisting of a substituted or unsubstituted aromatic hydrocarbon group having 6 to 30 ring carbon atoms and a substituted or unsubstituted heterocyclic group having 5 to 30 ring atoms, more preferably a substituent selected from the group consisting of a substituted or unsubstituted aromatic hydrocarbon group having 6 to 30 ring carbon atoms.

In the exemplary embodiment, at least one of $Ar_1$ and $Ar_2$ of the formula (21) is preferably a group represented by a formula (22) below. In this arrangement, $Ar_0$ in the formula (21) is preferably a group having a pyrene skeleton or a chrysene skeleton.

[Formula 36]

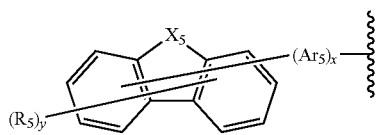

(22)

In the formula (22): x is an integer of 0 to 3; y is an integer of 0 to 7; and $X_5$ represents an oxygen atom, a sulfur atom or a selenium atom.

When x is 0, the group represented by the formula (22) is bonded by a single bond to a nitrogen atom of the formula (21).

When x is an integer of 1 to 3, $Ar_5$ is a substituted or unsubstituted aromatic hydrocarbon group having 6 to 30 ring carbon atoms. When x is 2 or more, a plurality of $Ar_5$ are optionally mutually the same or different and are optionally mutually bonded to form a saturated or unsaturated ring.

$R_5$ is selected from the group consisting of a halogen atom, a cyano group, a nitro group, a hydroxyl group, a substituted silyl group, a carboxyl group, a substituted or unsubstituted aromatic hydrocarbon group having 6 to 30 ring carbon atoms, a substituted or unsubstituted alkyl group having 1 to 30 carbon atoms, a substituted or unsubstituted alkylamino group having 1 to 30 carbon atoms, a substituted or unsubstituted arylamino group having 6 to 30 ring carbon atoms, a substituted or unsubstituted alkoxy group having 1 to 30 carbon atoms, a substituted or unsubstituted aryloxy group having 6 to 30 ring carbon atoms, a substituted or unsubstituted arylthio group having 6 to 30 ring carbon atoms, and a substituted or unsubstituted alkoxycarbonyl group having 1 to 30 carbon atoms. When y is 2 or more, a plurality of $R_5$ are optionally mutually the same or different and are optionally mutually bonded to form a saturated or unsaturated ring.

In the exemplary embodiment, $X_5$ of the formula (22) is preferably an oxygen atom or a sulfur atom, more preferably an oxygen atom.

In the exemplary embodiment, $Ar_1$ of the formula (21) is preferably a substituent selected from the group consisting of a substituted or unsubstituted aromatic hydrocarbon group having 6 to 30 ring carbon atoms, more preferably a substituent selected from the group consisting of a substituted or unsubstituted aromatic hydrocarbon group having 6 to 20 ring carbon atoms, further preferably a group selected from the group consisting of a phenyl group, biphenyl group, naphthyl group, phenanthryl group, terphenyl group and fluorenyl group.

In the exemplary embodiment, $Ar_2$ of the formula (21) is preferably a group represented by the formula (22).

In the exemplary embodiment, at least one of $Ar_1$ and $Ar_2$ of the formula (21) is preferably the group represented by the formula (Ar-1), more preferably the group represented by the formula (Ar-2). In this arrangement, $Ar_0$ in the formula (21) is preferably a group having a benzofluorene skeleton.

In the exemplary embodiment, n1 in the formula (21) is preferably 1 or 2

In the exemplary embodiment, the second compound is also preferably a compound represented by a formula (23) below.

[Formula 37]

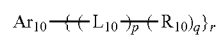

(23)

In the formula (23): p is an integer of 0 to 5; and q and r are each independently an integer of 1 to 5.

$Ar_{10}$ is a group having a benzofluorene skeleton, fluoranthene skeleton, pyrene skeleton, or chrysene skeleton.

$R_{10}$ is a substituent selected from the group consisting of a substituted or unsubstituted aromatic hydrocarbon group having 6 to 30 ring carbon atoms, a substituted or unsubstituted heterocyclic group having 5 to 30 ring atoms, a substituted or unsubstituted alkyl group having 1 to 30 carbon atoms and a substituted or unsubstituted aralkyl group having 7 to 30 carbon atoms. When a plurality of $R_{10}$ are present, the plurality of $R_{10}$ are optionally mutually the same or different and are optionally mutually bonded to form a saturated or unsaturated ring.

When p is 0, $Ar_{10}$ is bonded to $R_{10}$ by a single bond.

When p is an integer of 1 to 5, $L_{10}$ is a linking group selected from the group consisting of a substituted or unsubstituted aromatic hydrocarbon group having 6 to 30 ring carbon atoms and a substituted or unsubstituted heterocyclic group having 5 to 30 ring atoms. When a plurality of $L_{10}$ are present, the plurality of $L_{10}$ are optionally mutually the same or different and are optionally mutually bonded to form a saturated or unsaturated ring.

A bonding pattern of the compound represented by the formula (23) is exemplified by bonding patterns shown in Table 2 below.

TABLE 2

| No. | p | q | r | Bonding Pattern |
|---|---|---|---|---|
| (23A) | 0 | 1 | 1 | $Ar_{10}$—$R_{10}$ |
| (23B) | 1 | 1 | 1 | $Ar_{10}$—$L_{10}$—$R_{10}$ |
| (23C) | 0 | 2 | 1 | $Ar_{10}$—$R_{10}$—$R_{10}$,  $Ar_{10}\diagup^{R_{10}}_{\diagdown R_{10}}$ |
| (23D) | 1 | 2 | 1 | $Ar_{10}$—$L_{10}$—$R_{10}$—$R_{10}$,  $Ar_{10}$—$L_{10}\diagup^{R_{10}}_{\diagdown R_{10}}$ |
| (23E) | 1 | 1 | 2 | $Ar_{10}\diagup^{L_{10}-R_{10}}_{\diagdown L_{10}-R_{10}}$,  $Ar_{10}$—$L_{10}$—$R_{10}$—$L_{10}$—$R_{10}$ |

TABLE 2-continued

| No. | p | q | r | Bonding Pattern |
|---|---|---|---|---|
| (23F) | 0 | 2 | 2 | $Ar_{10}\diagup^{R_{10}-R_{10}}_{\diagdown R_{10}-R_{10}}$ |
| (23G) | 1 | 2 | 2 | $Ar_{10}\diagup^{L_{10}-R_{10}-R_{10}}_{\diagdown L_{10}-R_{10}-R_{10}}$ |
| (23H) | 2 | 2 | 2 | $Ar_{10}\diagup^{L_{10}-L_{10}-R_{10}-R_{10}}_{\diagdown L_{10}-L_{10}-R_{10}-R_{10}}$ |

In the exemplary embodiment, $Ar_{10}$ in the formula (23) is preferably a group having a fluoranthene skeleton, more preferably a group having a fluoranthene skeleton fused with a benzene ring (i.e., a benzofluoranthene skeleton).

In the exemplary embodiment, the second compound is preferably a fluorescent compound. An emission color and an emission wavelength of the second compound are not particularly limited. However, for instance, the second compound is preferably a fluorescent compound with an emission peak wavelength from 550 nm or less, more preferably a fluorescent compound with an emission peak wavelength from 400 nm to 500 nm, further preferably a fluorescent compound with an emission peak wavelength from 430 nm to 480 nm.

For instance, the second compound is preferably a green fluorescent compound or a blue fluorescent compound, more preferably a blue fluorescent compound.

The emission peak wavelength means a peak wavelength of luminescence spectrum exhibiting a maximum luminous intensity among luminous spectra measured in a toluene solution in which a measurement target compound is dissolved at a concentration from $10^{-6}$ mold to $10^{-5}$ mold.

The second compound is preferably a material with a high fluorescence quantum yield.

Method of Preparing Second Compound

The second compound can be prepared by a method described in International Publication Nos. WO2008/059713 and WO2010/122810 and the like.

Specific examples of the second compound of the exemplary embodiment are shown below. It should be noted that the second compound according to the invention is not limited to these specific examples.

[Formula 38]

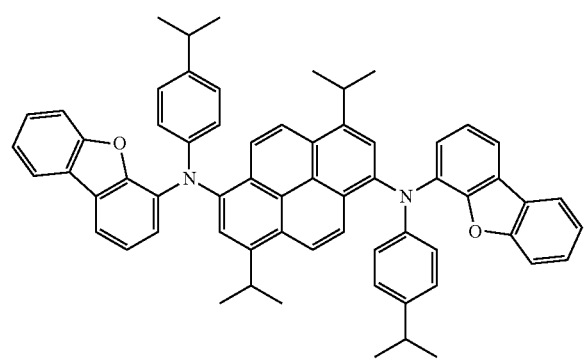

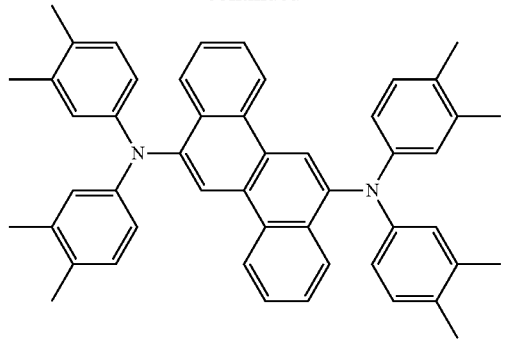

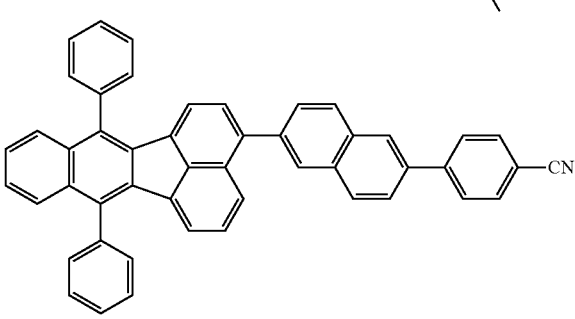

[Formula 39]

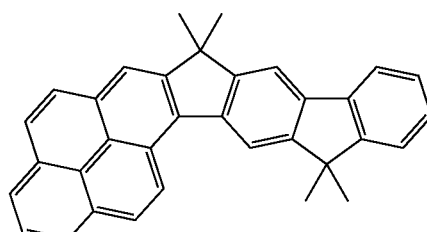

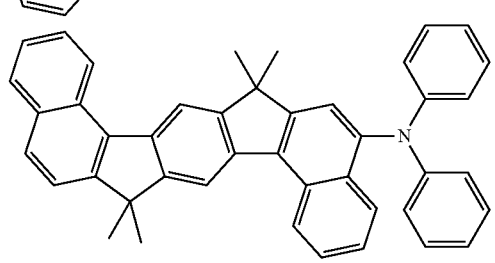

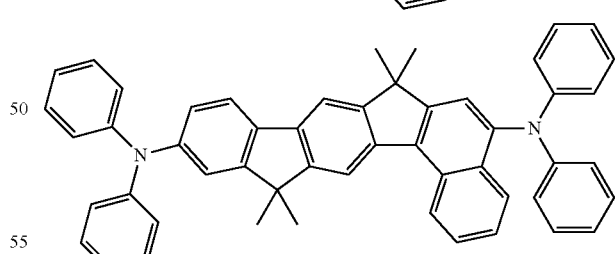

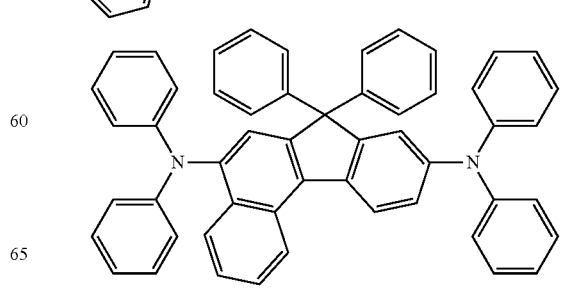

[Formula 40]
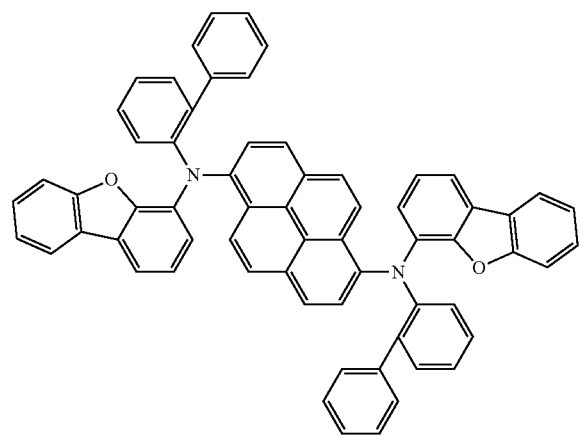
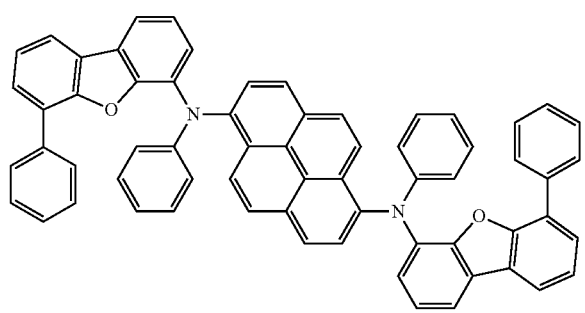
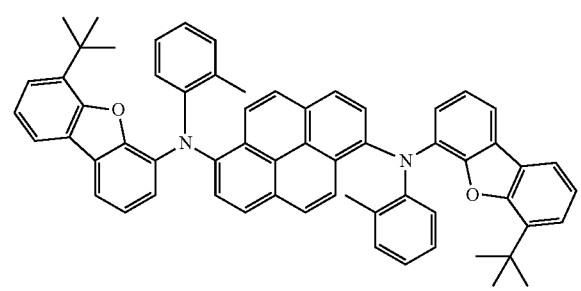
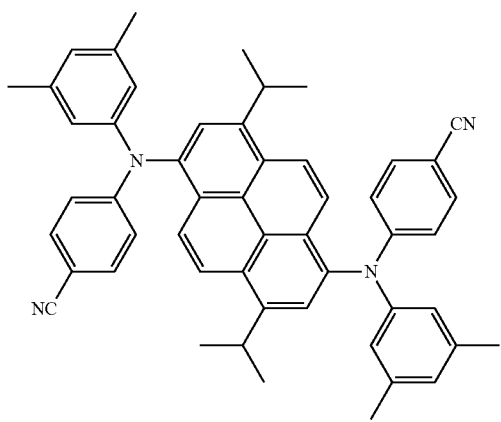
[Formula 41]
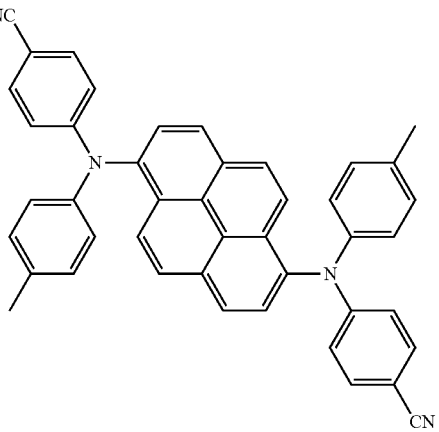
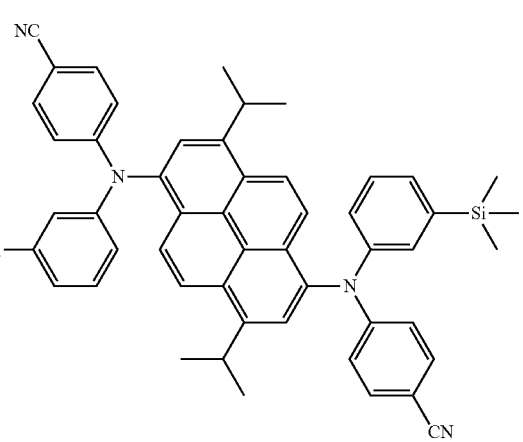
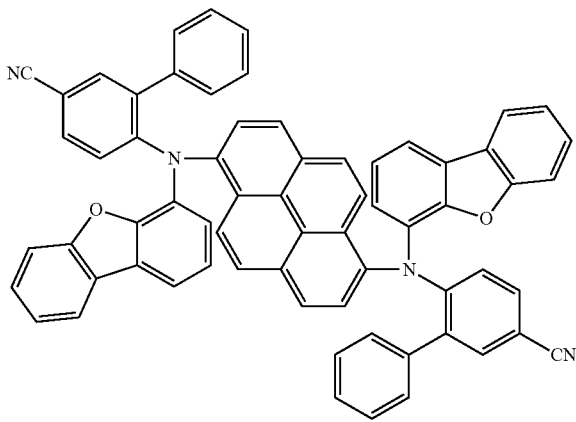

[Formula 42]

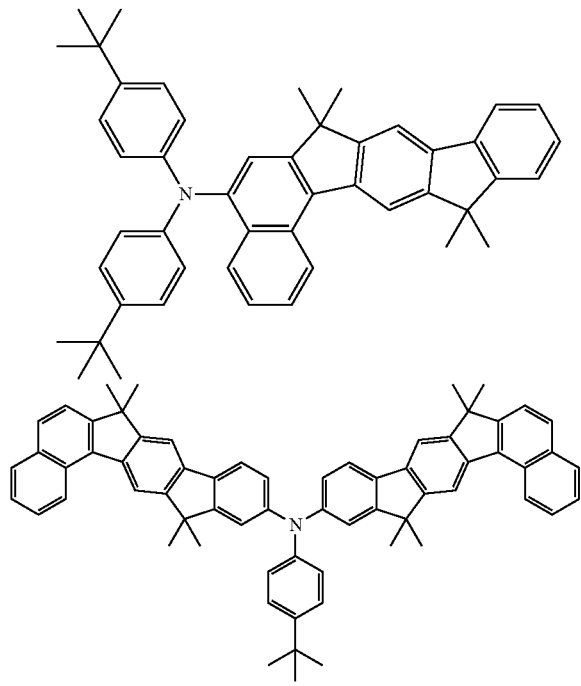

Third Compound

An energy gap $T_{77K}(M3)$ of the third compound in the exemplary embodiment is larger than the energy gap $T_{77K}(M2)$ of the second compound in the exemplary embodiment. The energy gap $T_{77K}(M3)$ of the third compound in the exemplary embodiment is preferably larger than the energy gap $T_{77K}(M1)$ of the first compound in the exemplary embodiment.

Measurement of Energy Gap $T_{77K}$ at 77 [K]

For the second and third compounds, the energy gap $T_{77K}$ at 77[K] is measured as follows.

The compound to be measured (i.e., the second and third compounds) was dissolved in EPA (diethylether:isopentane:ethanol=5:5:2 in volume ratio) at a concentration of 10 µmol/L, and the resulting solution was set in a quartz cell to provide a measurement sample. A phosphorescent spectrum (ordinate axis: phosphorescent luminous intensity, abscissa axis:wavelength) of each of the samples was measured at a low temperature (77K). A tangent was drawn to the rise of the phosphorescent spectrum on the short-wavelength side. An energy amount was calculated as the energy gap $T_{77K}$ at 77K according to a conversion equation 2 below based on a wavelength value $\lambda_{edge}$ (nm) at an intersection of the tangent and the abscissa axis.

$$T_{77K}[eV]=1239.85/\lambda_{edge} \qquad \text{Conversion Equation 2:}$$

For phosphorescence measurement, a spectrophotofluorometer body F-4500 (manufactured by Hitachi High-Technologies Corporation) was used. It should be noted that the phosphorescence measuring device may be different from the above device.

The tangent to the rise of the phosphorescence spectrum on the short-wavelength side is drawn as follows. While moving on a curve of the phosphorescence spectrum from the short-wavelength side to the maximum spectral value closest to the short-wavelength side among the maximum spectral values, a tangent is checked at each point on the curve toward the long-wavelength of the phosphorescence spectrum. An inclination of the tangent was increased as the curve rose (i.e., a value of the ordinate axis was increased). A tangent drawn at a point of the maximum inclination (i.e., a tangent at an inflection point) is defined as the tangent to the rise of the phosphorescence spectrum on the short-wavelength side.

The maximum with peak intensity being 15% or less of the maximum peak intensity of the spectrum is not included in the above-mentioned maximum closest to the short-wavelength side of the spectrum. The tangent drawn at a point of the maximum spectral value being the closest to the short-wavelength side and having the maximum inclination is defined as a tangent to the rise of the phosphorescence spectrum on the short-wavelength side.

As the third compound, one of various compounds may be used alone, or two or more thereof may be used in combination.

Relationship Between First Compound, Second Compound and Third Compound in Emitting Layer In the exemplary embodiment, the third compound is inferred to function as a dispersant that suppresses molecular association of the first compound of the exemplary embodiment with another in the emitting layer.

Further, it is inferred that, since the third compound separates the first compound from the second compound in distance therebetween, the energy transfer from the singlet state of the first compound to the singlet state of the second compound is promoted while the energy transfer from the triplet state of the first compound to the triplet state of the second compound is inhibited, thereby contributing to improvement in the luminous efficiency.

In the exemplary embodiment, it is preferable that the energy gap $T_{77K}(M1)$ at 77 [K] of the first compound is larger than the energy gap $T_{77K}(M2)$ at 77 [K] of the second compound, and the energy gap $T_{77K}(M3)$ at 77 [K] of the third compound is larger than the energy gap $T_{77K}(M1)$ at 77 [K] of the second compound.

In the exemplary embodiment, the energy gap $T_{77K}(M3)$ at 77 [K] of the third compound is preferably 2.9 eV or more. When the energy gap $T_{77K}(M3)$ of the third compound is in the above range, the third compound is unlikely to affect generation of excitons and carrier transport in the emitting layer.

TADF Mechanism

In the organic EL device of the exemplary embodiment, the first compound is preferably a compound having a small $\Delta ST(M1)$. When $\Delta ST(M1)$ is small, inverse intersystem crossing from the triplet level of the first compound to the singlet level thereof is easily caused by heat energy given from the outside. An energy state conversion mechanism to perform spin exchange from the triplet state of electrically excited excitons within the organic EL device to the singlet state by inverse intersystem crossing is referred to as TADF Mechanism.

Figure 4:
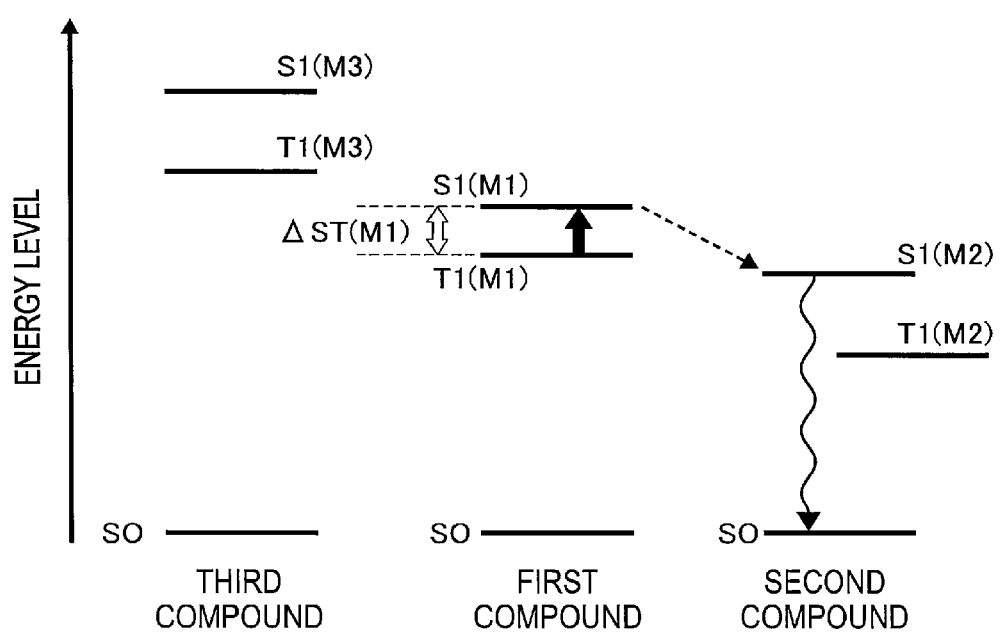
FIG. 4 shows a relationship between energy levels of a first compound, a second compound and a third compound and an energy transfer among the first compound, the second compound and the third compound in an emitting layer.

FIG. 4 shows an example of a relationship among energy levels and energy transfer of the first compound, the second compound and the third compound in the emitting layer. In FIG. 4, S0 represents a ground state, S1(M1) represents a lowest singlet state of the first compound, T1(M1) represents a lowest triplet state of the first compound, S1(M2) represents a lowest singlet state of the second compound, T1(M2) represents a lowest triplet state of the second compound, S1(M3) represents a lowest singlet state of the third compound, and T1(M3) represents a lowest triplet state of the third compound. A dashed arrow directed from S1(M1) to S1(M2) in FIG. 4 represents Förster energy transfer from the lowest singlet state of the first compound to the lowest singlet state of the second compound.

As shown in FIG. 4, when a compound having a small ΔST(M1) is used as the first compound, inverse intersystem crossing from the lowest triplet state T1(M1) to the lowest singlet state S1(M1) can be caused by a heat energy. Consequently, Förster energy transfer from the lowest singlet state S1(M1) of the first compound to the lowest singlet state S1(M2) of the second compound is caused. Consequently, fluorescence from the lowest singlet state S1(M2) of the second compound can be observed. It is inferred that the internal quantum efficiency can be theoretically raised up to 100% also by using delayed fluorescence by the TADF mechanism.

When the organic EL device 1 of the exemplary embodiment emits light, it is preferable that the second compound in the emitting layer 5 mainly emits light.

Film Thickness of Emitting Layer

A film thickness of the emitting layer 5 of the organic EL device of the exemplary embodiment is preferably in a range from 5 nm to 50 nm, more preferably in a range from 7 nm to 50 nm, and further preferably in a range from 10 nm to 50 nm. When the film thickness of the emitting layer 5 is 5 nm or more, emitting layer 5 is easily formed and chromaticity thereof is easily adjusted. When the film thickness of the emitting layer 5 is 50 nm or less, an increase in the drive voltage is suppressible.

Content Ratio of Compounds in Emitting Layer

In the organic EL device 1 of the exemplary embodiment, a content ratio of the first compound in the emitting layer 5 is preferably 5 mass % or more, more preferably in a range from 10 mass % to 60 mass %, further preferably in a range from 20 mass % to 40 mass % or from 40 mass % to 60 mass %. A content ratio of the second compound is preferably 10 mass % or less, more preferably 5 mass % or less, further preferably in a range from 0.01 mass % to 1 mass %. An upper limit of the total of the respective content ratios of the first, second and third compounds in the emitting layer 5 is 100 mass %. It should be noted that the emitting layer 5 of the exemplary embodiment may further contain another material in addition to the first, second and third compounds.

Substrate

A substrate 2 is used as a support for the organic EL device 1. For instance, glass, quartz, plastics and the like are usable for the substrate 2. A flexible substrate is also usable. The flexible substrate is a bendable substrate, which is exemplified by a plastic substrate. A material for the plastic substrate include polycarbonate, polyarylate, polyethersulfone, polypropylene, polyester, polyvinyl fluoride, polyvinyl chloride, polyimide, and polyethylene naphthalate. Moreover, an inorganic vapor deposition film is also usable.

Anode

Metal, alloy, an electrically conductive compound and a mixture thereof, which have a large work function, specifically, of 4.0 eV or more, is preferably usable as the anode 3 formed on the substrate 2. Specific examples of the material for the anode include indium tin oxide (ITO), indium tin oxide containing silicon or silicon oxide, indium zinc oxide, tungsten oxide, indium oxide containing zinc oxide and graphene. In addition, gold (Au), platinum (Pt), nickel (Ni), tungsten (W), chrome (Cr), molybdenum (Mo), iron (Fe), cobalt (Co), copper (Cu), palladium (Pd), titanium (Ti), and nitrides of a metal material (e.g., titanium nitride) are usable.

The above materials are typically deposited as a film by sputtering. For instance, indium zinc oxide can be deposited as a film by sputtering using a target that is obtained by adding zinc oxide in a range from 1 mass % to 10 mass % to indium oxide. Moreover, for instance, indium oxide containing tungsten oxide and zinc oxide can be deposited as a film by sputtering using a target that is obtained by adding tungsten oxide in a range from 0.5 mass % to 5 mass % and zinc oxide in a range from 0.1 mass % to 1 mass % to indium oxide. In addition, vapor deposition, coating, ink jet printing, spin coating and the like may be used for forming a film.

Among the organic layers formed on the anode 3, the hole injecting layer 6 formed in contact with the anode 3 is formed using a composite material that facilitates injection of holes irrespective of the work function of the anode 3. Accordingly, a material usable as an electrode material (e.g., metal, alloy, an electrically conductive compound, a mixture thereof, and elements belonging to Groups 1 and 2 of the periodic table of the elements) is usable as the material for the anode 3.

The elements belonging to Groups 1 and 2 of the periodic table of the elements, which are materials having a small work function, a rare earth metal and alloy thereof are also usable as the material for the anode 3. The elements belonging to Group 1 of the periodic table of the elements are alkali metal. The elements belonging to Group 2 of the periodic table of the elements are alkaline earth metal. Examples of alkali metal are lithium (Li) and cesium (Cs). Examples of alkaline earth metal are magnesium (Mg), calcium (Ca), and strontium (Sr). Examples of the rare earth metal are europium (Eu) and ytterbium (Yb). Examples of the alloys including these metals are MgAg and AlLi.

When the anode 3 is formed of the alkali metal, alkaline earth metal and alloy thereof, vapor deposition and sputtering are usable. Further, when the anode is formed of silver paste and the like, coating, ink jet printing and the like are usable.

Hole Injecting Layer

A hole injecting layer 6 is a layer containing a highly hole-injectable substance. Examples of the highly hole-injectable substance include molybdenum oxide, titanium oxide, vanadium oxide, rhenium oxide, ruthenium oxide, chromium oxide, zirconium oxide, hafnium oxide, tantalum oxide, silver oxide, tungsten oxide, and manganese oxide.

In addition, the examples of the highly hole-injectable substance further include: an aromatic amine compound, which is a low-molecule compound, such that 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), 4,4'-bis[N-(4-diphenylatninophenyl)-N-phenylamino]biphenyl (abbreviation: DPAB), 4,4'-bis(N-{4-[N'-(3-methylphenyl)-N'-phenylamino]phenyl}-N-phenylamino)biphenyl (abbreviation: DNTPD), 1,3,5-tris[N-(4-diphenylaminophenyl)-N-phenylamino]benzene (abbreviation: DPA3B), 3-[N-(9-phenylcarbazole-3-yl)-N-phenylamino]-9-phenylcarbazole (abbreviation: PCzPCA1), 3,6-bis[N-(9-phenylcarbazole-3-yl)-N-phenylamino]-9-phenylcarbazole (abbreviation: PCzPCA2), and 3-[N-(1-naphthyl)-N-(9-phenylcarbazole-3-yl)amino]-9-phenylcarbazole (abbreviation: PCzPCN1); and dipyrazino[2,3-f:20,30-h]quinoxaline-2,3,6,7,10,11-hexacarbonitrile (HAT-CN).

Moreover, a high-molecule compound is also usable as the highly hole-injectable substance. Examples of the high-molecule compound are an oligomer, dendrimer and polymer. Specific examples of the high-molecule compound include poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl)methacrylamido] (abbreviation: PTPDMA), and poly[N,N'-bis(4-butylphenyl)-N,N'-bis (phenyl)benzidine] (abbreviation: Poly-TPD). Furthermore, the examples of the high-molecule compound include a high-molecule compound added with an acid such as poly (3,4-ethylene dioxythiophene)/poly(styrene sulfonic acid) (PEDOT/PSS), and polyaniline/poly(styrene sulfonic acid) (PAni/PSS).

Hole Transporting Layer

A hole transporting layer 7 is a layer containing a highly hole-transportable substance. An aromatic amine compound, carbazole derivative, anthracene derivative and the like are usable for the hole transporting layer 7. Specific examples of a material for the hole transporting layer include 4,4'-bis[N-(1-naphthyl)-N-phenylamino]biphenyl (abbreviation: NPB), N,N'-bis(3-methylphenyl)-N,N-diphenyl[1,1'-biphenyl]-4,4'-diamine (abbreviation: TPD), 4-phenyl-4'-(9-phenylfluoren-9-yl)triphenylamine (abbreviation: BAFLP), 4,4'-bis[N-(9,9-dimethylfluoren-2-yl)-N-phenylamino]biphenyl (abbreviation: DFLDPBi), 4,4',4"-tris(N,N-diphenylamino) triphenylamine (abbreviation: TDATA), 4,4',4"-tris[N-(3-methylphenyl)-N-phenylamino]triphenylamine (abbreviation: MTDATA), and 4,4'-bis[N-(spiro-9,9'-bifluoren-2-yl)-N-phenylamino]biphenyl (abbreviation: BSPB). The above-described substances mostly have a hole mobility of $10^{-6}$ cm$^2$/(V·s) or more.

A carbazole derivative (e.g., CBP, 9-[4-(N-carbazoly)] phenyl-10-phenylanthracene (CzPA), and 9-phenyl-3-[4-(10-phenyl-9-anthryl)phenyl]-9H-carbazole (PCzPA)) and an anthracene derivative (e.g., t-BuDNA, DNA, and DPAnth) may be used for the hole transporting layer 7. A high polymer compound such as poly(N-vinylcarbazole) (abbreviation: PVK) and poly(4-vinyltriphenylamine) (abbreviation: PVTPA) is also usable.

However, any substance having a hole transporting performance higher than an electron transporting performance may be used in addition to the above substances. A highly hole-transportable substance may be provided in the form of a single layer or a laminated layer of two or more layers of the above substance.

When the hole transporting layer includes two or more layers, one of layers with a larger energy gap is preferably provided closer to the emitting layer 5.

In the exemplary embodiment, the hole transporting layer 7 preferably has a function of preventing triplet excitons generated in the emitting layer 5 from dispersing to the hole transporting layer 7 and the hole injecting layer 6 to trap the triplet excitons in the emitting layer 5.

Electron Transporting Layer

An electron transporting layer 8 is a layer containing a highly electron-transportable substance. As the electron transporting layer, 1) a metal complex such as an aluminum complex, beryllium complex and zinc complex, 2) heteroaromatic compound such as an imidazole derivative, benzimidazole derivative, azine derivative, carbazole derivative, and phenanthroline derivative, and 3) a high-molecule compound are usable. Specifically, as a low-molecule organic compound, a metal complex such as Alq, tris(4-methyl-8-quinoinato)aluminum (abbreviation: Almq3), bis(10-hydroxybenzo[h]quinolinato)beryllium (abbreviation: BeBc2), BAlq, Znq, ZnPBO and ZnBTZ are usable. In addition to the metal complex, a heteroaromatic compound such as 2-(4-biphenyl)-5-(4-tert-butylphenyl)-1,3,4-oxadiazole (abbreviation: PBD), 1,3-bis[5-(p-tert-butylphenyl)-1,3,4-oxadiazole-2-yl]benzene (abbreviation: OXD-7), 3-(4-tert-butylphenyl)-4-phenyl-5-(4-biphenyl)-1,2,4-triazole (abbreviation: TAZ), 3-(4-tert-butylphenyl)-4-(4-ethylphenyl)-5-(4-biphenyl)-1,2,4-triazole (abbreviation: p-EtTAZ), bathophenanthroline (abbreviation: BPhen), bathocuproine (abbreviation: BCP), and 4,4'-bis(5-methylbenzoxazole-2-yl)stilbene (abbreviation: BzOs) are usable. In the exemplary embodiment, a benzimidazole compound is suitably usable. The above-described substances mostly have an electron mobility of $10^{-6}$ cm$^2$/(V·s) or more. However, any substance having an electron transporting performance higher than a hole transporting performance may be used for the electron transporting layer 8 in addition to the above substances. The electron transporting layer 8 may be provided in the form of a single layer or a laminated layer of two or more layers of the above substance(s).

Moreover, a high-molecule compound is also usable for the electron transporting layer 8. For instance, poly[(9,9-dihexylfluorene-2,7-diyl)-co-(pyridine-3,5-diyl)] (abbreviation: PF-Py), poly[(9,9-dioctylfluorene-2,7-diyl)-co-(2,2'-bipyridin-6,6'-diyl)] abbreviation: PF-BPy) and the like are usable.

In the exemplary embodiment, the electron transporting layer 8 preferably has a function of preventing triplet excitons generated in the emitting layer 5 from dispersing to the electron transporting layer 8 and the electron injecting layer 9 to trap the triplet excitons in the emitting layer 5.

Electron Injecting Layer

An electron injecting layer 9 is a layer containing a highly electron-injectable substance. Examples of a material for the electron injecting layer include an alkali metal, alkaline earth metal and a compound thereof, examples of which include lithium (Li), cesium (Cs), calcium (Ca), lithium fluoride (LiF), cesium fluoride (CsF), calcium fluoride (CaF2), and lithium oxide (LiOx). In addition, a compound containing an alkali metal, alkaline earth metal and a compound thereof in the electron transportable substance, specifically, a compound containing magnesium (Mg) in Alq and the like may be used. In this arrangement, electrons can be more efficiently injected from the cathode 4.

Alternatively, a composite material provided by mixing an organic compound with an electron donor may be used for the electron injecting layer 9. The composite material exhibits excellent electron injecting performance and electron transporting performance since the electron donor generates electron in the organic compound. In this arrangement, the organic compound is preferably a material exhibiting an excellent transforming performance of the generated electrons. Specifically, for instance, the above-described substance for the electron transporting layer 8 (e.g., the metal complex and heteroaromatic compound) is usable. The electron donor may be any substance exhibiting an electron donating performance to the organic compound. Specifically, an alkali metal, alkaline earth metal and a rare earth metal are preferable, examples of which include lithium, cesium, magnesium, calcium, erbium and ytterbium. Moreover, an alkali metal oxide or alkaline earth metal oxide is preferably used as the electron donor, examples of which include lithium oxide, calcium oxide, and barium oxide. Further, Lewis base such as magnesium oxide is also usable. Furthermore, tetrathiafulvalene (abbreviation: TTF) is also usable.

Cathode

Metal, alloy, an electrically conductive compound, a mixture thereof and the like, which have a small work function, specifically, of 3.8 eV or less, is preferably usable as a material for the cathode 4. Specific examples of the material for the cathode are the elements belonging to Groups 1 and 2 of the periodic table of the elements, a rare earth metal and alloys thereof. The elements belonging to Group 1 of the periodic table of the elements are alkali metal. The elements belonging to Group 2 of the periodic table of the elements are alkaline earth metal. Examples of alkali metal are lithium (Li) and cesium (Cs). Examples of alkaline earth metal are magnesium (Mg), calcium (Ca), and strontium (Sr). Examples of the rare earth metal are europium (Eu) and ytterbium (Yb). Examples of the alloys including these metals are MgAg and AlLi.

When the cathode 4 is formed of the alkali metal, alkaline earth metal and alloy thereof, vapor deposition and sputtering are usable. Further, when the anode is formed of silver paste and the like, coating, ink jet printing and the like are usable.

By providing the electron injecting layer 9, various conductive materials such as Al, Ag, ITO, graphene and indium tin oxide containing silicon or silicon oxide are usable for forming the cathode 4 irrespective of the magnitude of the work function. The conductive materials can be deposited as a film by sputtering, ink jet printing, spin coating and the like.

Layer Formation Method(s)

A method for forming each layer of the organic EL device 1 in the exemplary embodiment is subject to no limitation except for the above particular description. However, known methods of dry film-forming and wet film-forming are applicable. Examples of the dry film-forming include vacuum deposition, sputtering, plasma and ion plating. Examples of the wet film-forming include spin coating, dipping, flow coating and ink-jet.

Film Thickness

A film thickness of each of the organic layers of the organic EL device 1 according to the exemplary embodiment is subject to no limitation except for the above particular description. The thickness is generally preferably in a range from several nanometers to 1 μm in order to cause less defects (e.g., a pin hole) and prevent deterioration in the efficiency caused by requiring high voltage to be applied.

In the exemplary embodiment, the number of carbon atoms forming a ring (also referred to as ring carbon atoms) means the number of carbon atoms included in atoms forming the ring itself of a compound in which the atoms are bonded to form the ring (e.g., a monocyclic compound, a fused ring compound, a cross-linked compound, a carbocyclic compound, and a heterocyclic compound). When the ring is substituted by a substituent, carbon atom(s) included in the substituent is not counted as the ring carbon atoms. The same applies to the "ring carbon atoms" described below, unless particularly noted. For instance, a benzene ring has 6 ring carbon atoms, a naphthalene ring has 10 ring carbon atoms, a pyridinyl group has 5 ring carbon atoms, and a furanyl group has 4 ring carbon atoms. When a benzene ring or a naphthalene ring is substituted, for instance, by an alkyl group, the carbon atoms of the alkyl group are not counted as the ring carbon atoms. For instance, when a fluorene ring (inclusive of a spirofluorene ring) is bonded as a substituent to a fluorene ring, the carbon atoms of the fluorene ring as a substituent are not counted as the ring carbon atoms.

In the exemplary embodiment, the number of atoms forming a ring (also referred to as ring atoms) means the number of atoms forming the ring itself of a compound in which the atoms are bonded to form the ring (e.g., a monocyclic compound, a fused ring compound, a cross-linked compound, a carbocyclic compound, and a heterocyclic compound). Atom(s) not forming the ring (e.g., hydrogen atom(s) for saturating the valence of the atom which forms the ring) and atom(s) in a substituent by which the ring is substituted are not counted as the ring atoms. The same applies to the "ring atoms" described below, unless particularly noted. For instance, a pyridine ring has 6 ring atoms, a quinazoline ring has 10 ring atoms, and a furan ring has 5 ring atoms. Hydrogen atoms respectively bonded to carbon atoms of the pyridine ring or the quinazoline ring and atoms forming a substituent are not counted as the ring atoms. For instance, when a fluorene ring (inclusive of a spirofluorene ring) is bonded as a substituent to a fluorene ring, the atoms of the fluorene ring as a substituent are not included in the ring atoms.

Next, each of substituents described in the above formulae will be described.

Examples of the aromatic hydrocarbon group having 6 to 30 ring carbon atoms (occasionally referred to as an aryl group) in the exemplary embodiment are a phenyl group, biphenyl group, terphenyl group, naphthyl group, anthryl group, phenanthryl group, fluorenyl group, pyrenyl group, chrysenyl group, fluoranthenyl group, benz[a]anthryl group, benzo[c]phenanthryl group, triphenylenyl group, benzo[k]fluoranthenyl group, benzo[g]chrysenyl group, benzo[b]triphenylenyl group, picenyl group, and perylenyl group.

The aryl group in the exemplary embodiment preferably has 6 to 20 ring carbon atoms, more preferably 6 to 14 ring carbon atoms, further preferably 6 to 12 ring carbon atoms. Among the aryl group, a phenyl group, biphenyl group, naphthyl group, phenanthryl group, terphenyl group and fluorenyl group are particularly preferable. A carbon atom at a position 9 of each of 1-fluorenyl group, 2-fluorenyl group, 3-fluorenyl group and 4-fluorenyl group is preferably substituted by a substituted or unsubstituted alkyl group having 1 to 30 carbon atoms or a substituted or unsubstituted aryl group having 6 to 18 ring carbon atoms later described in the exemplary embodiment.

In the exemplary embodiment, the heterocyclic group (occasionally referred to as heteroaryl group, heteroaromatic ring group or aromatic heterocyclic group) having 5 to 30 ring atoms preferably contains at least one atom selected from the group consisting of nitrogen, sulfur, oxygen, silicon, selenium atom and germanium atom, and more preferably contains at least one atom selected from the group consisting of nitrogen, sulfur and oxygen.

Examples of the heterocyclic group having 5 to 30 ring atoms in the exemplary embodiment are a pyridyl group, pyrimidinyl group, pyrazinyl group, pyridazynyl group, triazinyl group, quinolyl group, isoquinolinyl group, naphthyridinyl group, phthalazinyl group, quinoxalinyl group, quinazolinyl group, phenanthridinyl group, acridinyl group, phenanthrolinyl group, pyrrolyl group, imidazolyl group, pyrazolyl group, triazolyl group, tetrazolyl group, indolyl group, benzimidazolyl group, indazolyl group, imidazopyridinyl group, benzotriazolyl group, carbazolyl group, furyl group, thienyl group, oxazolyl group, thiazolyl group, isoxazolyl group, isothiazolyl group, oxadiazolyl group, thiadiazolyl group, benzofuranyl group, benzothiophenyl group, benzoxazolyl group, benzothiazolyl group, benzisoxazolyl group, benzisothiazolyl group, benzoxadiazolyl group, benzothialiazolyl group, dibenzofuranyl group, dibenzothiophenyl group, piperidinyl group, pyrrolidinyl group, piperazinyl group, morpholyl group, phenazinyl group, phenothiazinyl group, and phenoxazinyl group.

The heterocyclic group in the exemplary embodiment preferably has 5 to 20 ring atoms, more preferably 5 to 14 ring atoms. Among the above heterocyclic group, a 1-dibenzofuranyl group, 2-dibenzofuranyl group, 3-dibenzofuranyl group, 4-dibenzofuranyl group, 1-dibenzothiophenyl group, 2-dibenzothiophenyl group, 3-dibenzothiophenyl group, 4-dibenzothiophenyl group, 1-carbazolyl group, 2-carbazolyl group, 3-carbazolyl group, 4-carbazolyl group, and 9-carbazolyl group are further preferable. A nitrogen atom at a position 9 of each of 1-carbazolyl group, 2-carbazolyl group, 3-carbazolyl group and 4-carbazolyl group is preferably substituted by a substituted or unsubstituted aryl group having 6 to 30 ring carbon atoms or a substituted or unsubstituted heterocyclic group having 5 to 30 ring atoms in the exemplary embodiment.

In the exemplary embodiment, the heterocyclic group may be a group derived from any one of moieties represented by formulae (XY-1) to (XY-18).

[Formula 43]

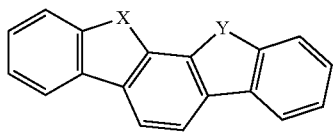
(XY-1)

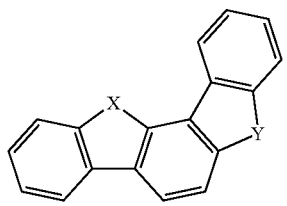
(XY-2)

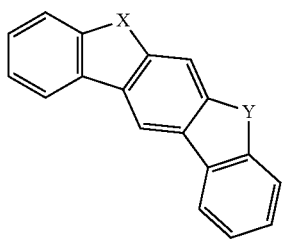
(XY-3)

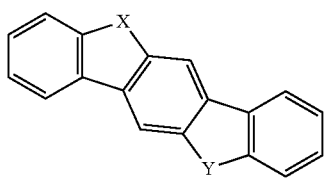
(XY-4)

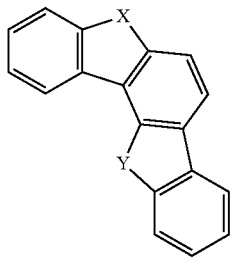
(XY-5)

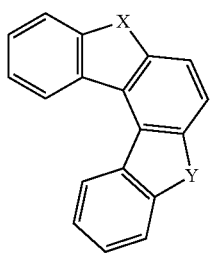
(XY-6)

[Formula 44]

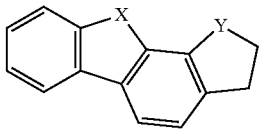
(XY-7)

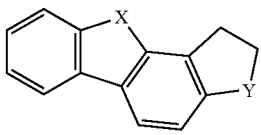
(XY-8)

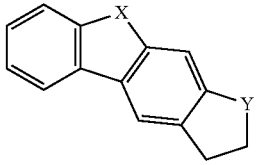
(XY-9)

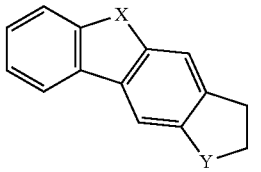
(XY-10)

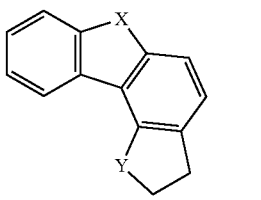
(XY-11)

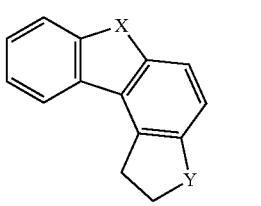
(XY-12)

[Formula 45]

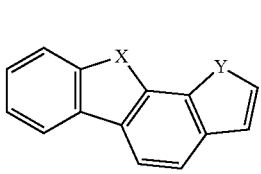
(XY-13)

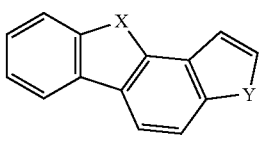
(XY-14)

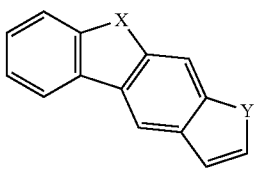
(XY-15)

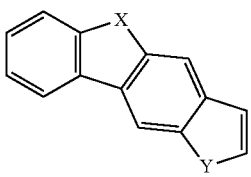
(XY-16)

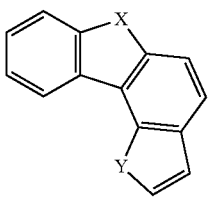
(XY-17)

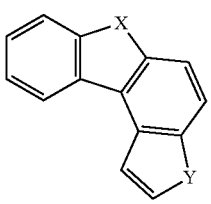
(XY-18)

In the formulae (XY-1) to (XY-18), X and Y are each independently a hetero atom, and are preferably an oxygen atom, sulfur atom, selenium atom, silicon atom or germanium atom. The moieties represented by the formulae (XY-1) to (XY-18) may each be bonded in any position to be a heterocyclic group, which may be substituted.

In the exemplary embodiment, examples of the substituted or unsubstituted carbazolyl group may include a group in which a carbazole ring is further fused with a ring(s) as shown in the following formulae. Such a group may be substituted. The group may be bonded in any position as desired.

[Formula 46]

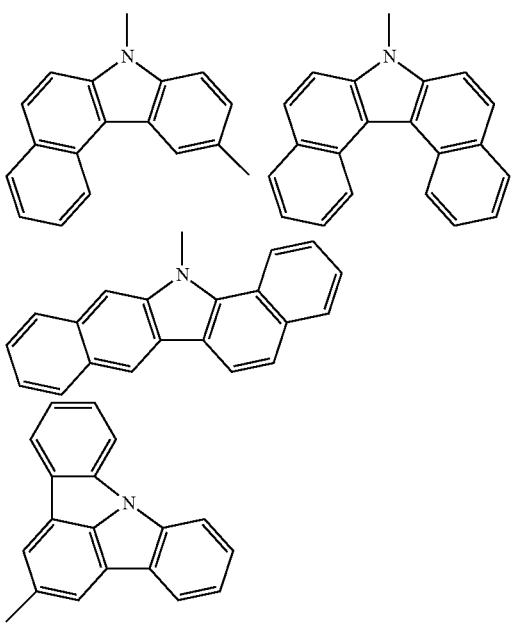

The alkyl group having 1 to 30 carbon atoms in the exemplary embodiment may be linear, branched or cyclic.

Examples of the linear or branched alkyl group include: a methyl group, ethyl group, n-propyl group, isopropyl group, n-butyl group, s-butyl group, isobutyl group, t-butyl group, n-pentyl group, n-hexyl group, n-heptyl group, n-octyl group, n-nonyl group, n-decyl group, n-undecyl group, n-dodecyl group, n-tridecyl group, n-tetradecyl group, n-pentadecyl group, n-hexadecyl group, n-heptadecyl group, n-octadecyl group, neopentyl group, amyl group, isoamyl group, 1-methylpentyl group, 2-methylpentyl group, 1-pentylhexyl group, 1-butylpentyl group, 1-heptyloctyl group, and 3-methylpentyl group.

The linear or branched alkyl group in the exemplary embodiment preferably has 1 to 10 carbon atoms, more preferably 1 to 6 carbon atoms. Among the linear or branched alkyl group, a methyl group, ethyl group, propyl group, isopropyl group, n-butyl group, 5-butyl group, isobutyl group, t-butyl group, n-pentyl group, n-hexyl group, amyl group, isoamyl group and neopentyl group are further preferable.

Examples of the cycloalkyl group having 3 to 30 in the exemplary embodiment are a cyclopropyl group, cyclobutyl group, cyclopentyl group, cyclohexyl group, 4-metylcyclohexyl group, adamantyl group and norbornyl group. The cycloalkyl group preferably has 3 to 10 ring carbon atoms, more preferably 5 to 8 ring carbon atoms. Among the cycloalkyl group, a cyclopentyl group and a cyclohexyl group are further preferable.

A halogenated alkyl group provided by substituting an alkyl group with a halogen atom is exemplified by one provided by substituting an alkyl group having 1 to 30 carbon atoms with one or more halogen atoms. Specific examples of the above halogenated alkyl group are a fluoromethyl group, difluoromethyl group, trifluoromethyl group, fluoroethyl group, trifluoromethylmethyl group, trifluoroethyl group and pentafluoroethyl group.

Examples of the substituted silyl group in the exemplary embodiment are an alkylsilyl group having 3 to 30 carbon atoms and an arylsilyl group having 6 to 30 ring carbon atoms.

The alkylsilyl group having 3 to 30 carbon atoms in the exemplary embodiment is exemplified by a trialkylsilyl group having the above examples of the alkyl group having 1 to 30 carbon atoms. Specific examples of the alkylsilyl group are a trimethylsilyl group, triethylsilyl group, tri-n-butylsilyl group, tri-n-octylsilyl group, triisobutylsilyl group, dimethylethylsilyl group, dimethylisopropylsilyl group, dimethyl-n-propylsilyl group, dimethyl-n-butylsilyl group, dimethyl-t-butylsilyl group, diethylisopropylsilyl group, vinyl dimethylsilyl group, propyldimethylsilyl group, and triisopropylsilyl group. Three alkyl groups in the trialkylsilyl group may be the same or different.

Examples of the arylsilyl group having 6 to 30 ring carbon atoms in the exemplary embodiment area dialkylarylsilyl group, alkyldiaryisilyl group and triaryisilyl group.

The dialkylarylsilyl group is exemplified by a dialkylarylsilyl group including two of the alkyl group listed as the examples of the alkyl group having 1 to 30 carbon atoms and one of the aryl group listed as the examples of the aryl group having 6 to 30 ring carbon atoms. The dialkylarylsilyl group preferably has 8 to 30 carbon atoms.

The alkyldiarylsilyl group is exemplified by an alkyldiarylsilyl group including one of the alkyl group listed as the examples of the alkyl group having 1 to 30 carbon atoms and two of the aryl group listed as the examples of the aryl group having 6 to 30 ring carbon atoms. The alkyldiarylsilyl group preferably has 13 to 30 carbon atoms.

The triarylsilyl group is exemplified by a triarylsilyl group including three of the aryl group listed as the examples of the aryl group having 6 to 30 ring carbon atoms. The triarylsilyl group preferably has 18 to 30 carbon atoms.

The alkoxy group having 1 to 30 carbon atoms in the exemplary embodiment is represented by —$OZ_1$. $Z_1$ is exemplified by the above alkyl group having 1 to 30 carbon atoms. Examples of the alkoxy group are a methoxy group, ethoxy group, propoxy group, butoxy group, pentyloxy group and hexyloxy group. The alkoxy group preferably has 1 to 20 carbon atoms.

A halogenated alkoxy group provided by substituting an alkoxy group with a halogen atom is exemplified by one provided by substituting an alkoxy group having 1 to 30 carbon atoms with one or more fluorine atoms.

The aryloxy group having 6 to 30 ring carbon atoms in the exemplary embodiment is represented by —$OZ_2$. $Z_2$ is exemplified by the above aryl group having 6 to 30 ring carbon atoms. The aryloxy group preferably has 6 to 20 ring carbon atoms. The aryloxy group is exemplified by a phenoxy group.

The alkylamino group having 1 to 30 carbon atoms is represented by —$NHR_v$ or —$N(R_v)_2$. $R_v$ is exemplified by the alkyl group having 1 to 30 carbon atoms.

The arylamino group having 6 to 30 ring carbon atoms is represented by —$NHR_w$ or —$N(R_w)_2$. $R_w$ is exemplified by the above aryl group having 6 to 30 ring carbon atoms.

The alkylthio group having 1 to 30 carbon atoms is represented by —$SR_v$. $R_v$ is exemplified by the alkyl group having 1 to 30 carbon atoms. The alkylthio group preferably has 1 to 20 carbon atoms.

The arylthio group having 6 to 30 ring carbon atoms is represented by —$SR_w$. $R_w$ is exemplified by the above aryl group having 6 to 30 ring carbon atoms. The arylthio group preferably has 6 to 20 ring carbon atoms.

The aralkyl group is preferably an aralkyl group having 6 to 30 ring carbon atoms and is represented by —$Z_3$—$Z_4$. $Z_3$ is exemplified by an alkylene group corresponding to the above alkyl group having 1 to 30 carbon atoms. $Z_4$ is exemplified by the above aryl group having 6 to 30 ring carbon atoms. This aralkyl group is preferably an aralkyl group having 7 to 30 carbon atoms, in which an aryl moiety has 6 to 30 carbon atoms, preferably 6 to 20 carbon atoms, more preferably 6 to 12 carbon atoms and an alkyl moiety has 1 to 30 carbon atoms, preferably 1 to 20 carbon atoms, more preferably 1 to 10 carbon atoms, further preferably 1 to 6 carbon atoms. Examples of the aralkyl group are a benzyl group, 2-phenylpropane-2-yl group, 1-phenylethyl group, 2-phenylethyl group, 1-phenylisopropyl group, 2-phenylisopropyl group, phenyl-t-butyl group, α-naphthylmethyl group, 1-α-naphthylethyl group, 2-α-naphthylethyl group, 1-α-naphthylisopropyl group, 2-α-naphthylisopropyl group, β-naphthylmethyl group, 1-β-naphthylethyl group, 2-β-naphthylethyl group, 1-β-naphthylisopropyl group, and 2-β-naphthylisopropyl group.

The alkoxycarbonyl group having 1 to 30 carbon atoms is represented by —COOY'. Y' is exemplified by the above-described alkyl group.

Examples of the halogen atom include a fluorine atom, chlorine atom, bromine tom and iodine atom, among which a fluorine atom is preferable.

In the exemplary embodiment, "carbon atoms forming a ring (ring carbon atoms)" mean carbon atoms forming a saturated ring, unsaturated ring, or aromatic ring. "Atoms forming a ring (ring atoms)" mean carbon atoms and hetero atoms forming a hetero ring including a saturated ring, unsaturated ring, or aromatic ring.

In the exemplary embodiment, a hydrogen atom includes isotope having different numbers of neutrons, specifically, protium, deuterium and tritium.

Examples of the substituent meant by "substituted or unsubstituted" are an alkenyl group, alkynyl group, cyano group, hydroxyl group, nitro group and carboxy group, in addition to the above-described aryl group, heterocyclic group, alkyl group (linear or branched alkyl group, cycloalkyl group and haloalkyl group), alkyisilyl group, arylsilyl group, alkoxy group, aryloxy group, alkylamino group, arylamino group, alkylthio group, arylthio group, aralkyl group and halogen atom.

Among the above substituents, an aryl group, heterocyclic group, alkyl group, halogen atom, alkylsiyl group, arylsilyl group and cyano group are preferable. More preferable substituents are one listed as the preferable substituents described for each substituent.

The above substituents may be further substituted by an alkenyl group, alkynyl group, aralkyl group, halogen atom, cyano group, hydroxyl group, nitro group and carboxy group, in addition to the above-described aryl group, heterocyclic group, alkyl group, alkylsilyl group, arylsilyl group, alkoxy group, alyloxy group, alkylamino group, arylamino group, alkylthio group, and arylthio group. In addition, plural ones of these substituents may be mutually bonded to form a ring.

The alkenyl group is preferably an alkenyl group having 2 to 30 carbon atoms, which may be linear, branched or cyclic. Examples of the alkenyl group include a vinyl group, propenyl group, butenyl group, oleyl group, eicosapentaenyl group, docosahexaenyl group, styryl group, 2,2-diphenylvinyl group, 1,2,2-triphenylvinyl group, 2-phenyl-2-propenyl group, cyclopentadienyl group, cyclopentenyl group, cyclohexenyl group, and cyclohexadienyl group.

The alkynyl group is preferably an alkynyl group having 2 to 30 carbon atoms, which may be linear, branched or cyclic. Examples of the alkynyl group include ethynyl, propynyl, and 2-phenylethynyl.

"Unsubstituted" in "substituted or unsubstituted" means that a group is not substituted by the above-described substituents but bonded with a hydrogen atom.

In the exemplary embodiment, "XX to YY carbon atoms" in the description of "substituted or unsubstituted ZZ group having XX to YY carbon atoms" represent carbon atoms of an unsubstituted ZZ group and do not include carbon atoms of a substituent(s) of a substituted ZZ group. "YY" is larger than "XX" and each of "XX" and "YY" represents an integer of 1 or more.

In the exemplary embodiment, "XX to YY atoms" in the description of "substituted or unsubstituted ZZ group having XX to YY atoms" represent atoms of an unsubstituted ZZ group and does not include atoms of a substituent(s) of a substituted ZZ group. "YY" is larger than "XX" and each of "XX" and "YY" represents an integer of 1 or more.

The same description as the above applies to "substituted or unsubstituted" in the following compound or a partial structure thereof.

In the exemplary embodiment, when substituents are mutually bonded to form a cyclic structure, the cyclic structure is a saturated ring, unsaturated ring, aromatic hydrocarbon ring, or a heterocyclic ring.

In the exemplary embodiment, examples of the aryl group and the like for the linking group include a divalent or multivalent group obtained by removing at least one atom from the above-described monovalent groups.

Electronic Device

The organic EL device 1 of the exemplary embodiment is usable in an electronic device such as a display device and a light-emitting device. Examples of the display unit include display components such as en organic EL panel module, TV, mobile phone, tablet, and personal computer. Examples of the light-emitting unit include an illuminator and a vehicle light.

Second Exemplary Embodiment

An arrangement of an organic EL device according to a second exemplary embodiment will be described below. In the description of the second exemplary embodiment, the same components as those in the first exemplary embodiment are denoted by the same reference signs and names to simplify or omit an explanation of the components. In the second exemplary embodiment, including specific examples, the same materials and compounds as described in the first exemplary embodiment are usable, unless otherwise specified.

An organic EL device according to the second exemplary embodiment includes the anode, emitting layer and the cathode. The emitting layer according to the second exemplary embodiment is different from the emitting layer according to the first exemplary embodiment (containing the first, second and third compounds) in that the emitting layer contains the first and second compounds but does not contain the third compound.

The first compound of the exemplary embodiment is a compound represented by a formula (10) or (10') below.

[Formula 47]

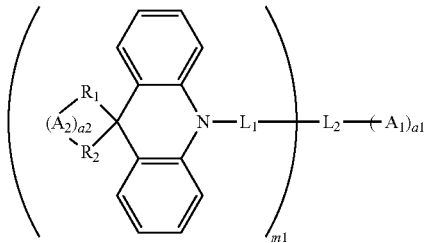

(10)

In the formula (10): a1 is 0 or 1 and a2 is 0 or 1, provided that a1+a2≥1.

m1 is an integer of 1 to 5.

When a2 is 0, $R_1$ and $R_2$ each independently represent a hydrogen atom or a monovalent substituent. When $R_1$ and $R_2$ are substituents, the substituents are each independently selected from the group consisting of a substituted or unsubstituted aromatic hydrocarbon group having 6 to 30 ring carbon atoms, a substituted or unsubstituted heterocyclic group having 5 to 30 ring atoms, a substituted or unsubstituted alkyl group having 1 to 30 carbon atoms, a substituted or unsubstituted alkoxy group having 1 to 30 carbon atoms, a substituted or unsubstituted aralkyl group having 7 to 30 carbon atoms, a substituted or unsubstituted aryloxy group having 6 to 30 ring carbon atoms, and a substituted silyl group.

When a2 is 1, $R_1$ and $R_2$ are each independently a linking group selected from the group consisting of a substituted or unsubstituted aromatic hydrocarbon group having 6 to 30 ring carbon atoms, a substituted or unsubstituted heterocyclic group having 5 to 30 ring atoms, a substituted or unsubstituted alkyl group having 1 to 30 carbon atoms, a substituted or unsubstituted alkoxy group having 1 to 30 carbon atoms, a substituted or unsubstituted aralkyl group having 7 to 30 carbon atoms, a substituted or unsubstituted aryloxy group having 6 to 30 ring carbon atoms, and a substituted silyl group.

When m1 is 2 or more, a plurality of $R_1$ are mutually the same or different; a plurality of $R_2$ are mutually the same or different.

$A_1$ and $A_2$ are each independently a group having a partial structure selected from formulae (a-1) to (a-7) below. When m1 is 2 or more, a plurality of $A_2$ are mutually the same or different.

When a1 is 0, $L_2$ is a hydrogen atom or a monovalent substituent. When $L_2$ is a monovalent substituent, the substituent is selected from the group consisting of a substituted or unsubstituted aromatic hydrocarbon group having 6 to 30 ring carbon atoms and a substituted or unsubstituted heterocyclic group having 5 to 30 ring atoms.

When a1 is 1, $L_2$ is a single bond or a linking group. When $L_2$ is a linking group, the linking group is selected from the group consisting of a substituted or unsubstituted aromatic hydrocarbon group having 6 to 30 ring carbon atoms and a substituted or unsubstituted heterocyclic group having 5 to 30 ring atoms.

$L_1$ is a single bond or a linking group. When $L_1$ is a linking group, the linking group is selected from the group consisting of a substituted or unsubstituted aromatic hydrocarbon group having 6 to 30 ring carbon atoms and a substituted or unsubstituted heterocyclic group having 5 to 30 ring atoms. When m1 is 2 or more, a plurality of $L_1$ are mutually the same or different.

[Formula 48]

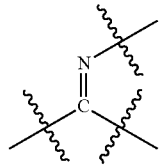

(a-1)

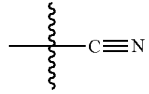

(a-2)

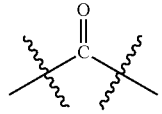

(a-3)

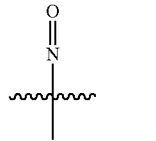

(a-4)

(a-5)

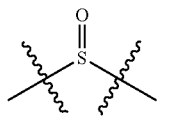

(a-6)

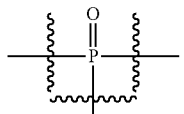

(a-7)

[Formula 49]

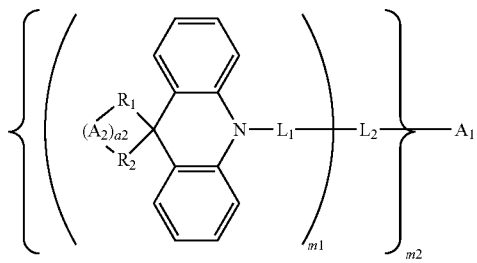

(10')

In the formula (10'): m2 is 2. a2 is 0 or 1; a plurality of a2 are mutually the same or different.

m1 is an integer of 1 to 5. A plurality of m1 are mutually the same or different.

When a2 is 0, $R_1$ and $R_2$ each independently represent a hydrogen atom or a monovalent substituent. When $R_1$ and $R_2$ are substituents, the substituents are each independently selected from the group consisting of a substituted or unsubstituted aromatic hydrocarbon group having 6 to 30 ring carbon atoms, a substituted or unsubstituted heterocyclic group having 5 to 30 ring atoms, a substituted or unsubstituted alkyl group having 1 to 30 carbon atoms, a substituted or unsubstituted alkoxy group having 1 to 30 carbon atoms, a substituted or unsubstituted aralkyl group having 7 to 30 carbon atoms, a substituted or unsubstituted aryloxy group having 6 to 30 ring carbon atoms, and a substituted silyl group.

When a2 is 1, $R_1$ and $R_2$ are each independently a linking group selected from the group consisting of a substituted or unsubstituted aromatic hydrocarbon group having 6 to 30 ring carbon atoms, a substituted or unsubstituted heterocyclic group having 5 to 30 ring atoms, a substituted or unsubstituted alkyl group having 1 to 30 carbon atoms, a substituted or unsubstituted alkoxy group having 1 to 30 carbon atoms, a substituted or unsubstituted aralkyl group having 7 to 30 carbon atoms, a substituted or unsubstituted aryloxy group having 6 to 30 ring carbon atoms, and a substituted silyl group.

A plurality of $R_1$ are mutually the same or different. A plurality of $R_2$ are mutually the same or different.

$A_1$ and $A_2$ are a group having a partial structure selected from the formulae (a-1) to (a-7). A plurality of $A_2$ are mutually the same or different.

$L_2$ is a single bond or a linking group. When $L_2$ is a linking group, the linking group is selected from the group consisting of a substituted or unsubstituted aromatic hydrocarbon group having 6 to 30 ring carbon atoms and a substituted or unsubstituted heterocyclic group having 5 to 30 ring atoms. A plurality of $L_2$ are mutually the same or different.

$L_1$ is a single bond or a linking group. When $L_1$ is a linking group, the linking group is selected from the group consisting of a substituted or unsubstituted aromatic hydrocarbon group having 6 to 30 ring carbon atoms and a substituted or unsubstituted heterocyclic group having 5 to 30 ring atoms. A plurality of $L_1$ are mutually the same or different.

The first compound in the exemplary embodiment is preferably a delayed fluorescent compound.

The second compound in the exemplary embodiment is a compound having a fused ring structure. The fused ring structure has a structure represented by a formula (2) below and has eight or less rings in total.

[Formula 50]

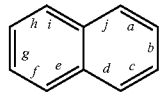

(2)

In the formula (2), a monocyclic ring or a fused ring may be fused to at least one of positions a, c, d, e, f, h, i and j. A five-membered ring or a fused ring having a five-membered ring may be fused to at least one of positions b and g.

When a six-membered ring is fused to the positions i and j, a monocyclic ring or a fused ring is also fused to the positions d and e.

When a six-membered ring is fused to the positions d and e, a monocyclic ring or a fused ring is also fused to the positions i and j.

When a fused ring having a five-membered ring is fused to the position b, the five-membered ring of the fused ring is directly fused to the position b.

When a fused ring having a five-membered ring is fused to the position g, the five-membered ring of the fused ring is directly fused to the position g.

None of a six-membered ring (monocyclic ring) and a six-membered ring of a fused ring is directly bonded to the positions b and g.

In the exemplary embodiment, the second compound is preferably a fluorescent compound. An emission color and an emission wavelength of the second compound are not particularly limited. However, for instance, the second compound is preferably a fluorescent compound with an emission peak wavelength from 550 nm or less, more preferably a fluorescent compound with an emission peak wavelength from 400 nm to 500 nm, further preferably a fluorescent compound with an emission peak wavelength from 430 nm to 480 nm.

For instance, the second compound is preferably a green fluorescent compound or a blue fluorescent compound, more preferably a blue fluorescent compound.

The second compound is preferably a material with a high fluorescence quantum yield.

TADF Mechanism

In the organic EL device of the exemplary embodiment, the first compound is preferably a compound having a small $\Delta ST(M1)$. When $\Delta ST(M1)$ is small, inverse intersystem crossing from the triplet level of the first compound to the singlet level thereof is easily caused by heat energy given from the outside. An energy state conversion mechanism to perform spin exchange from the triplet state of electrically excited excitons within the organic EL device to the singlet state by inverse intersystem crossing is referred to as TADF Mechanism.

Figure 5:
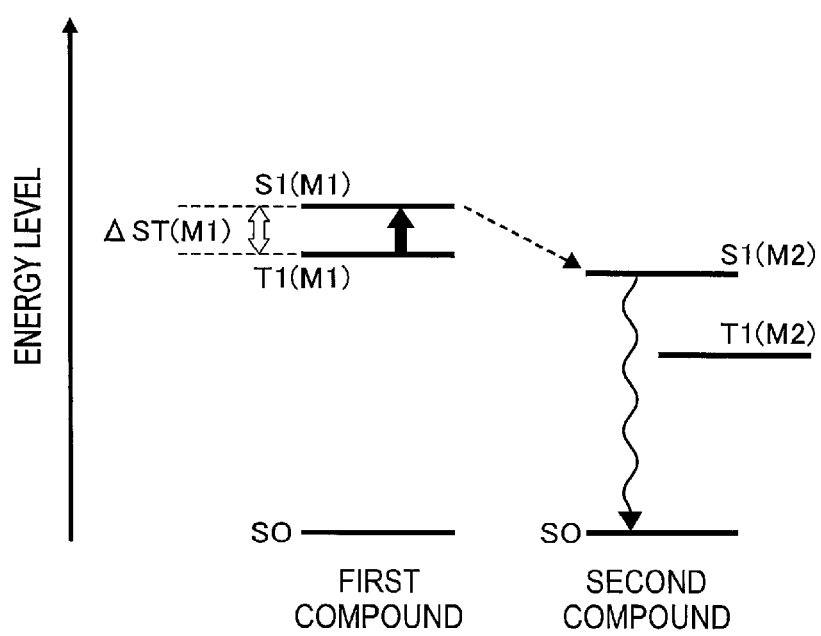
FIG. 5 shows a relationship between energy levels of a first compound and a second compound and an energy transfer between the first compound and the second compound in an emitting layer.

FIG. 5 shows a relationship between energy levels of the first compound and the second compound and the energy transfer between the first compound and the second compound in an emitting layer. In FIG. 5, S0 represents a ground state, S1(M1) represents a lowest singlet state of the first compound, T1(M1) represents a lowest triplet state of the first compound, S1(M2) represents a lowest singlet state of the second compound, T1(M2) represents a lowest triplet state of the second compound. A dashed arrow directed from S1(M1) to S1(M2) in FIG. 5 represents Förster energy transfer from the lowest singlet state of the first compound to the lowest singlet state of the second compound.

As shown in FIG. 5, when a compound having a small ΔST(M1) is used as the first compound, inverse intersystem crossing from the lowest triplet state T1(M1) to the lowest singlet state S1(M1) can be caused by a heat energy. Consequently, Förster energy transfer from the lowest singlet state S1(M1) of the first compound to the lowest singlet state S1(M2) of the second compound is caused. Consequently, fluorescence from the lowest singlet state S1(M2) of the second compound can be observed. It is inferred that the internal quantum efficiency can be theoretically raised up to 100% also by using delayed fluorescence by the TADF mechanism.

In the exemplary embodiment, an energy gap $T_{77K}(M1)$ at 77 [K] of the first compound is preferably larger than an energy gap $T_{77K}(M2)$ at 77 [K] of the second compound.

When the organic EL device 1 of the exemplary embodiment emits light, it is preferable that the second compound in the emitting layer 5 mainly emits light.

Content Ratio of Compounds in Emitting Layer

In the organic EL device 1 of the exemplary embodiment, the content ratio of the second compound in the emitting layer 5 is preferably 10 mass % or less, more preferably 5 mass % or less, further preferably in a range from 0.01 mass % to 1 mass %.

Modification of Embodiments

It should be noted that the invention is not limited to the above exemplary embodiments but may include any modification and improvement as long as such modification and improvement are compatible with the invention.

For instance, the emitting layer is not limited to a single layer, but may be provided by laminating a plurality of emitting layers. When the organic EL device has a plurality of emitting layers, it is only required that at least one of the emitting layers satisfies the conditions described in the above exemplary embodiments. For instance, the rest of the emitting layers may be a fluorescent emitting layer or a phosphorescent emitting layer using emission by electronic transition from the triplet state directly to the ground state.

When the organic EL device includes the plurality of emitting layers, the plurality of emitting layers may be adjacent to each other, or may be laminated on each other via an intermediate layer, a so-called tandem organic EL device.

For instance, a blocking layer may be provided in contact with at least one of an anode-side and a cathode-side of the emitting layer. It is preferable that the blocking layer is adjacent to the emitting layer and blocks at least one of holes, electrons and excitons.

For instance, when the blocking layer is provided in contact with the cathode-side of the emitting layer, the blocking layer permits transport of electrons, but prevents holes from reaching a layer provided near the cathode (e.g., the electron transporting layer) beyond the blocking layer. When the organic EL device includes an electron transporting layer, the blocking layer is preferably interposed between the emitting layer and the electron transporting layer.

When the blocking layer is provided in contact with the emitting layer near the anode, the blocking layer permits transport of holes, but prevents electrons from reaching a layer provided near the anode (e.g., the hole transporting layer) beyond the blocking layer. When the organic EL device includes a hole transporting layer, the blocking layer is preferably interposed between the emitting layer and the hole transporting layer.

Further, a blocking layer may be provided in contact with the emitting layer to prevent an excitation energy from leaking from the emitting layer into a layer in the vicinity thereof. Excitons generated in the emitting layer are prevented from moving into a layer provided near the electrode (e.g., an electron transporting layer and a hole transporting layer) beyond the blocking layer.

The emitting layer and the blocking layer are preferably bonded to each other.

Specific structure and shape of the components in the present invention may be designed in any manner as long as the object of the present invention can be achieved.

EXAMPLES

Examples of the invention will be described below. However, the invention is not limited by these Examples.
Preparation and Evaluation of Organic EL Device
The organic EL device was prepared and evaluated as follows.

Example 1

A glass substrate (size: 25 mm×75 mm×1.1 mm thick, manufactured by Geomatec Co., Ltd.) having an ITO transparent electrode (anode) was ultrasonic-cleaned in isopropyl alcohol for five minutes, and then UV/ozone-cleaned for 30 minutes. A film of ITO was 130 nm thick.

After the glass substrate having the transparent electrode line was cleaned, the glass substrate was mounted on a substrate holder of a vacuum evaporation apparatus. Initially, a compound H1 was vapor-deposited on a surface of the glass substrate where the transparent electrode line was provided in a manner to cover the transparent electrode, thereby forming a 5-nm-thick hole injecting layer.

Next, the compound HT-1 was vapor-deposited on the hole injecting layer to form a 80-nm-thick first hole transporting layer on the HI film.

Next, a compound HT-2 was deposited on the first hole transporting layer to form a 10-nm-thick second hole transporting layer.

Next, a compound EB was deposited on the second hole transporting layer to form a 5-nm-thick blocking layer.

Further, a compound BH (the first compound), a compound BD-1 (the second compound) and a compound DA-1 (the third compound) were co-deposited on the blocking layer to form a 25-nm-thick emitting layer. A concentration of the compound BH was defined as 14 mass %, a concentration of the compound BD-1 was defined as 1 mass %, and a concentration of the compound DA-1 was defined 85 mass % in the emitting layer.

A compound DA-2 was then deposited on the emitting layer to form a 5-nm-thick blocking layer.

Next, a compound ET was deposited on the blocking layer to form a 20-nm-thick electron transporting layer.

Lithium fluoride (LiF) was then deposited on the electron transporting layer to form a 1-nm-thick electron injecting electrode (cathode).

A metal aluminum (Al) was then deposited on the electron injecting electrode to form an 80-nm-thick metal Al cathode.

A device arrangement of the organic EL device of Example 1 is shown in symbols as follows.

ITO(130)/HI(5) HT-1(80)/HT-2(10)/EB(5)/DA-1:BH: BD-1(25, 85%:14%:1%)/DA-2(5)/ET(20)/LiF(1)/Al(80)

Numerals in parentheses represent a film thickness (unit: nm). The numerals in the form of percentage in parentheses indicate ratios (mass %) of the compounds in the emitting layer.

Example 2

An organic EL device of Example 2 was prepared in the same manner as the organic EL device of Example 1 except that the concentration of the compound BH was determined at 49 mass %, the concentration of the compound BD-1 was determined at 1 mass % and the concentration of the compound DA-1 was determined at 50 mass % in the emitting layer of Example 1.

A device arrangement of the organic EL device of Example 2 is shown in symbols as follows.

ITO(130)/HI(5)/HT-1(80)/HT-2(10)/EB(5)/DA-1:BH: BD-1(25, 50%:49%:1%)/DA-2(5)/ET(20)/LiF(1)/Al(80)

Example 3

An organic EL device of Example 3 was prepared in the same manner as the organic EL device of Example 1 except that a compound BD-2 was used in place of the compound BD-1 in the emitting layer of Example 1.

A device arrangement of the organic EL device of Example 3 is shown in symbols as follows.

ITO(130)/HI(5)/HT-1(80)/HT-2(10)/EB(5)/DA-1:BH: BD-2(25, 85%:14%:1%)/DA-2(5)/ET(20)/LiF(1)/Al(80)

Example 4

An organic EL device of Example 4 was prepared in the same manner as the organic EL device of Example 2 except that the compound RD-2 was used in place of the compound BD-1 in the emitting layer of Example 2.

A device arrangement of the organic EL device of Example 4 is shown in symbols as follows.

ITO(130)/HI(5)/HT-1(80)/HT-2(10)/EB(5)/DA-1:BH: BD-2(25, 50%:49%:1%)/DA-2(5)/ET(20)/LiF(1)/Al(80)

Example 5

An organic EL device of Example 5 was prepared in the same manner as the organic EL device of Example 1 except that a compound BD-3 was used in place of the compound BD-1 in the emitting layer of Example 1.

A device arrangement of the organic EL device of Example 5 is shown in symbols as follows.

ITO(130)/HI(5)/HT-1(80)/HT-2(10)/EB(5)/DA-1:BH: BD-3(25, 85%:14%:1%)/DA-2(5)/ET(20)/LiF(1)/Al(80)

Example 6

An organic EL device of Example 6 was prepared in the same manner as the organic EL device of Example 2 except that the compound BD-3 was used in place of the compound BD-1 in the emitting layer of Example 2.

A device arrangement of the organic EL device of Example 6 is shown in symbols as follows.

ITO(130)/HI(5)/HT-1(80)/HT-2(10)/EB(5)/DA-1:BH: BD-3(25, 50%:49%:1%)/DA-2(5)/ET(20)/LiF(1)/Al(80)

Example 7

An organic EL device of Example 7 was prepared in the same manner as the organic EL device of Example 1 except that a compound DA-2 was used in place of the compound DA-1 in the emitting layer of Example 1.

A device arrangement of the organic EL device of Example 7 is shown in symbols as follows.

ITO(130)/HI(5)/HT-1(80)/HT-2(10)/EB(5)/DA-2:BH: BD-1(25, 85%:14%:1%)/DA-2(5)/ET(20)/LiF(1)/Al(80)

Example 8

An organic EL device of Example 8 was prepared in the same manner as the organic EL device of Example 2 except that the compound DA-2 was used in place of the compound DA-1 in the emitting layer of Example 2.

A device arrangement of the organic EL device of Example 8 is shown in symbols as follows.

ITO(130)/HI(5)/HT-1(80)/HT-2(10)/EB(5)/DA-2:BH: BD-1(25, 50%:49%:1%)/DA-2(5)/ET(20)/LiF(1)/Al(80)

Example 9

An organic EL device of Example 9 was prepared in the same manner as the organic EL device of Example 5 except that the compound DA-2 was used in place of the compound DA-1 in the emitting layer of Example 5.

A device arrangement of the organic EL device of Example 9 is shown in symbols as follows.

ITO(130)/HI(5)/HT-1(80)/HT-2(10)/EB(5)/DA-2:BH: BD-3(25, 85%:14%:1%)/DA-2(5)/ET(20)/LiF(1)/Al(80)

Example 10

An organic EL device of Example 10 was prepared in the same manner as the organic EL device of Example 6 except that the compound DA-2 was used in place of the compound DA-1 in the emitting layer of Example 6.

A device arrangement of the organic EL device of Example 10 is shown in symbols as follows.

ITO(130)/HI(5)/HT-1(80)/HT-2(10)/EB(5)/DA-2:BH: BD-3(25, 50%:49%:1%)/DA-2(5)/ET(20)/LiF(1)Al(80)

Comparative 1

An organic EL device of Comparative 1 was prepared in the same manner as the organic EL device of Example 1 except that the compound BD-1 of the emitting layer of Example 1 was not used, the concentration of the compound BH was determined at 14 mass % and the concentration of the compound DA-1 was determined at 86 mass % in the emitting layer of Example 1.

A device arrangement of the organic EL device in Comparative 1 is shown in symbols as follows.

ITO(130)/HI(5)/HT-1(80)/HT-2(10)/EB(5)/DA-1:B14 (25, 86%:14%)/DA-2(5)/ET(20)/LiF(1)/Al(80)

Compounds used for preparing the organic EL device are shown below.
[Formula 51]
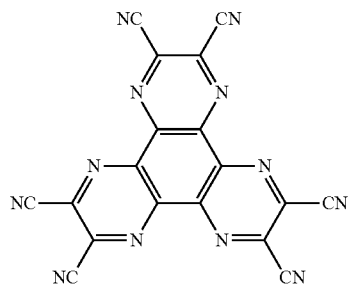
HI
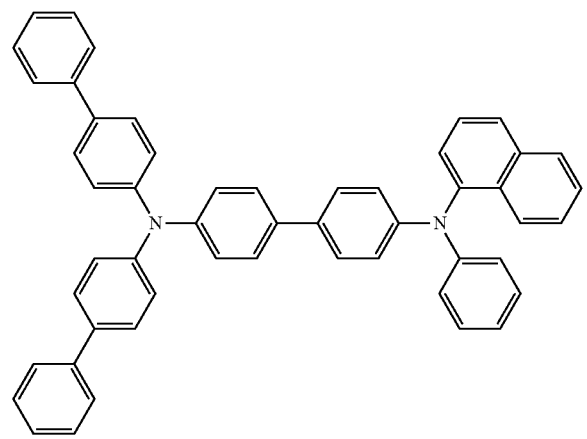
HT-1
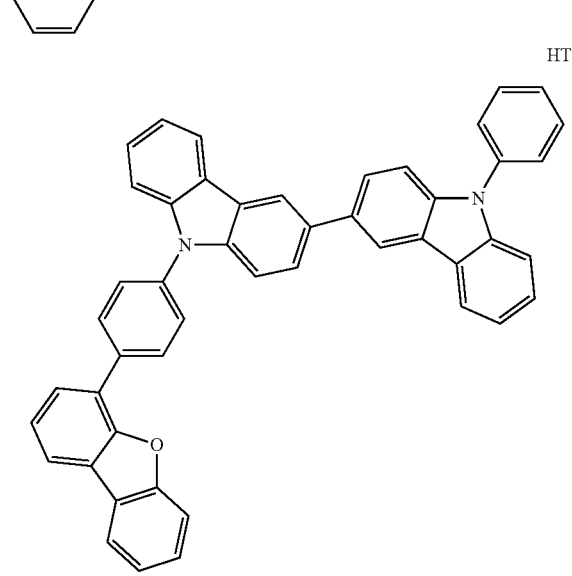
HT-2
[Formula 52]
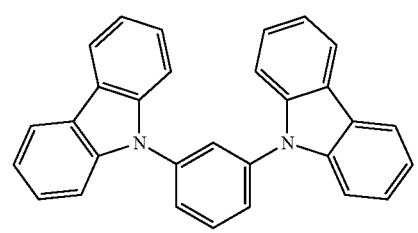
EB
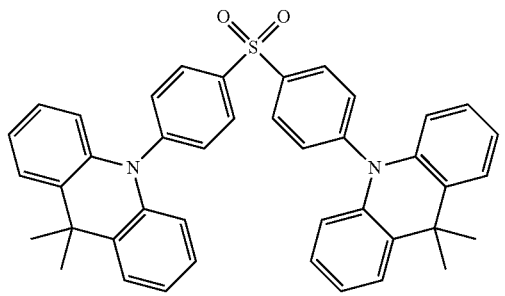
BH
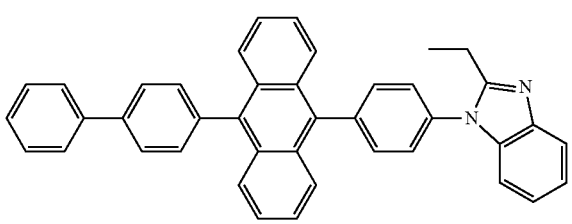
ET
[Formula 53]
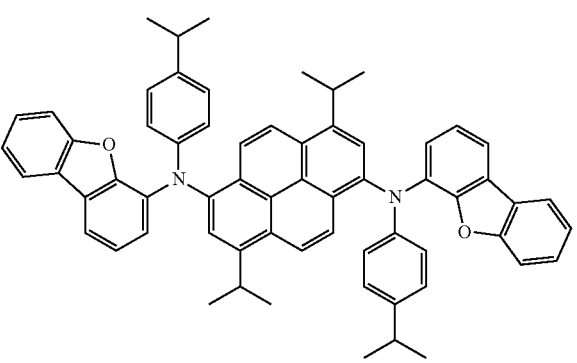
BD-1
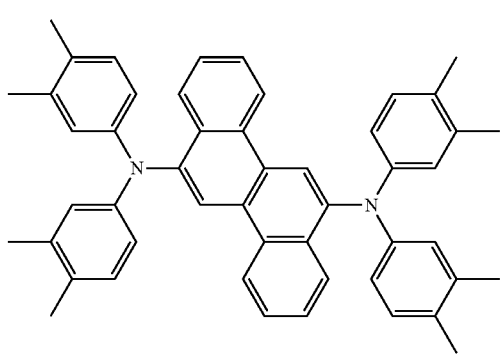
BD-2

-continued

BD-3
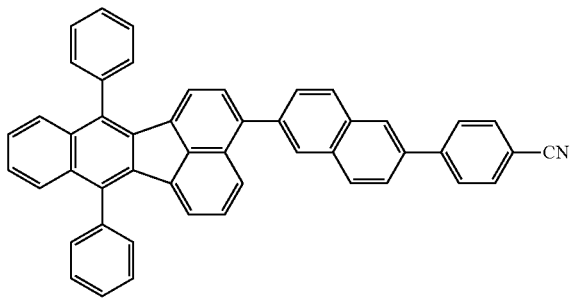

[Formula 54]

DA-1
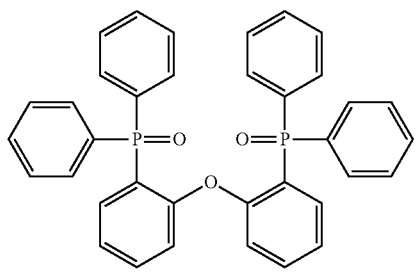

DA-2
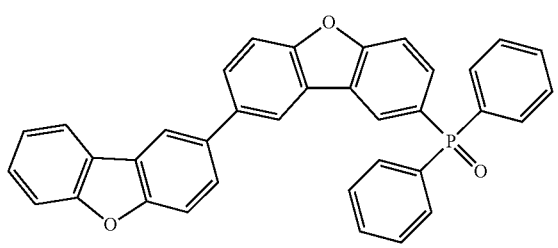

Evaluation of Compounds

Delayed fluorescence of the compound BH was measured. A measurement method and a calculation method are shown below.

Delayed Fluorescence

Delayed fluorescence was checked by measuring transitional PL using the device shown in FIG. 2. A sample was prepared by co-depositing the compounds BH and TH-2 on a quartz substrate at a ratio of the compound BH of 12 mass % to form a 100-nm-thick thin film. After the compound BH are excited with pulse light (light irradiated from the pulse laser) having a wavelength to be absorbed in the measurement target compounds, Prompt Emission that is immediately observed in the excited state and Delay Emission that is not observed immediately after the excitation and is later observed are present. The delayed fluorescence in the exemplary embodiment means that an amount of Delay Emission is 5% or more based on an amount of Prompt Emission. It was found that the amount of Delay Emission was 5% or more based on the amount of Prompt Emission in the compound BH. The amount of Prompt Emission and the amount of Delay Emission can be obtained according to the method as a method described in "Nature 492, 234-238, 2012." A device used for calculating the amounts of Prompt Emission and Delay Emission is not limited to the device of FIG. 2 and a device described in the above document.

Energy Gap $T_{77K}$ at 77 [K]

$T_{77K}$ was measured as follows.

For the second compound and the third compound (measurement targets), $T_{77K}$ was measured as follows. Herein, the measurement targets were the compounds BD-1, BD-2, BD-3, DA-1 and DA-2. Each of the measurement targets (i.e., the second and third compounds) was dissolved in EPA (diethylether:isopentane:ethanol=5:5:2 in volume ratio) at a concentration of 10 μmol/L, and the resulting solution was set in a quartz cell to provide a measurement sample. A phosphorescent spectrum (ordinate axis:phosphorescent luminous intensity, abscissa axis:wavelength) of each of the measurement samples was measured at a low temperature (77K). A tangent was drawn to the rise of the phosphorescent spectrum on the short-wavelength side. An energy amount was calculated as the energy gap $T_{77K}$ at 77K according to a conversion equation 2 below based on a wavelength value $\lambda_{edge}$ (nm) at an intersection of the tangent and the abscissa axis.

$$T_{77K}[eV]=1.239.85/\lambda_{edge}$$ Conversion Equation 2:

For the first compound (measurement target), $T_{77K}$ was measured as follows. Herein, the measurement target was the compound BH. The measurement target compound (the first compound) and the compound TH-2 were co-deposited on a quartz substrate to prepare a sample sealed in an NMR tube. The sample was prepared under the following conditions.

quartz substrate/TH-2: compound BH (100 nm of thickness, 12 mass % of concentration of the compound BH)

A phosphorescent spectrum (ordinate axis:phosphorescent luminous intensity, abscissa axis: wavelength) of each of the samples was measured at a low temperature (77K). A tangent was drawn to the rise of the phosphorescent spectrum on the short-wavelength side. An energy amount was calculated as the energy gap $T_{77K}$ at 77K according to a conversion equation 1 below based on a wavelength value $\lambda_{edge}$ (nm) at an intersection of the tangent and the abscissa axis.

$$T_{77K}[eV]=1239.85/\lambda_{edge}$$ Conversion Equation 1:

For phosphorescence measurement, a spectrophotofluorometer body F-4500 (manufactured by Hitachi High-Technologies Corporation) was used.

The tangent to the rise of the phosphorescence spectrum on the short-wavelength side was drawn as follows.

While moving on a curve of the phosphorescence spectrum from the short-wavelength side to the maximum spectral value closest to the short-wavelength side among the maximum spectral values, a tangent is checked at each point on the curve toward the long-wavelength of the phosphorescence spectrum. An inclination of the tangent was increased as the curve rose (i.e., a value of the ordinate axis was increased). A tangent drawn at a point of the maximum inclination (i.e., a tangent at an inflection point) was defined as the tangent to the rise of the phosphorescent spectrum on the short-wavelength side.

The maximum with peak intensity being 15% or less of the maximum peak intensity of the spectrum was not included in the above-mentioned maximum closest to the short-wavelength side of the spectrum. The tangent drawn at a point of the maximum spectral value being the closest to the short-wavelength side and having the maximum inclination was defined as a tangent to the rise of the phosphorescence spectrum on the short-wavelength side.

The calculated energy gaps $T_{77K}$ are shown below.
BH: 3.1 eV
BD-1: 2.0 eV
BD-2: 2.3 eV
BD-3: 2.1 eV
DA-1: 3.5 eV
DA-2: 3.0 eV Evaluation of Organic EL Devices The organic EL devices manufactured in Examples 1 to 10 and Comparative 1 were evaluated with respect to the drive voltage and the emission peak wavelength $\lambda_p$. Moreover, the organic EL devices manufactured in Examples 1 to 2 and Comparative 1 were also evaluated with respect to the external quantum efficiency EQE. Further, the organic EL devices manufactured in Examples 1, 2 and 5 to 10 and Comparative 1 were also evaluated with respect to the CIE1931 chromaticity. Furthermore, the organic EL devices manufactured in Examples 1 to 4, 7 and 8 and Comparative 1 were also evaluated with respect to a half bandwidth (FWHM). Evaluation methods are as follows. The results are shown in Tables 3 to 6.

Drive Voltage

Voltage was applied between ITO transparent electrode and Al metal cathode such that a current density was 0.1 mA/cm², where the voltage (unit: V) was measured.

CIE193 Chromaticity

Voltage was applied on each of the organic EL devices such that a current density was 0.1 mA/cm² where coordinates (x, y) of CIE1931. chromaticity were measured by a spectroradiometer (CS-1000 manufactured by Konica Minolta, Inc.).

External Quantum Efficiency EQE

Voltage was applied on each of the organic EL devices such that the current density was 0.1 mA/cm², where spectral-radiance spectra were measured using the above spectroradiometer. The external quantum efficiency EQE (unit: %) was calculated based on the obtained spectral-radiance spectra, assuming that the spectra was provided under a Lambertian radiation.

Emission Peak Wavelength $\lambda_p$

An emission peak wavelength $\lambda_p$ was calculated based on the obtained spectral-radiance spectra.

Half Bandwidth (FWHM)

The half bandwidth (unit: nm) was measured based on the obtained spectral-radiance spectra.

TABLE 3

| | Emitting Layer | BH Content in Emitting Layer (mass %) | Current Density (mA/cm²) | Voltage (V) | Chromaticity x | Chromaticity y | EQE (%) | $\lambda_p$ (nm) | FWHM (nm) |
|---|---|---|---|---|---|---|---|---|---|
| Comparative 1 | DA-1, BH | 14 | 0.1 | 4.3 | 0.154 | 0.183 | 12.4 | 465 | 65 |
| Example 1 | DA-1, BH, BD-1 | 14 | 0.1 | 4.2 | 0.139 | 0.158 | 12.3 | 464 | 46 |
| Example 2 | DA-1, BH, BD-1 | 49 | 0.1 | 3.2 | 0.143 | 0.176 | 12.2 | 464 | 48 |

TABLE 4

| | Emitting Layer | BH Content in Emitting Layer (mass %) | Current Density (mA/cm²) | Voltage (V) | Chromaticity x | Chromaticity y | $\lambda_p$ (nm) | FWHM (nm) |
|---|---|---|---|---|---|---|---|---|
| Example 7 | DA-2, BH BD-1 | 14 | 0.1 | 3.7 | 0.141 | 0.166 | 463 | 47 |
| Example 8 | DA-2, BH BD-1 | 49 | 0.1 | 3.1 | 0.141 | 0.173 | 464 | 47 |

TABLE 5

| | Emitting Layer | BH Content in Emitting Layer (mass %) | Current Density (mA/cm²) | Voltage (V) | $\lambda_p$ (nm) | FWHM (nm) |
|---|---|---|---|---|---|---|
| Example 3 | DA-1, BH, BD-2 | 14 | 0.1 | 4.4 | 467 | 56 |
| Example 4 | DA-1, BH, BD-2 | 49 | 0.1 | 3.3 | 469 | 58 |

TABLE 6

| | Emitting Layer | BH Content in Emitting Layer (mass %) | Current Density (mA/cm²) | Voltage (V) | Chromaticity x | Chromaticity y | $\lambda_p$ (nm) |
|---|---|---|---|---|---|---|---|
| Example 5 | DA-1, BH, BD-3 | 14 | 0.1 | 4.2 | 0.147 | 0.146 | 451 |
| Example 6 | DA-1, BH, BD-3 | 49 | 0.1 | 3.2 | 0.151 | 0.182 | 472 |
| Example 9 | DA-2, BH, BD-3 | 14 | 0.1 | 3.7 | 0.147 | 0.156 | 453 |
| Example 10 | DA-2, BH, BD-3 | 49 | 0.1 | 3.2 | 0.149 | 0.176 | 473 |

As shown in Tables 3 to 6, it was observed that the voltage was decreased as the concentration of the compound BH (the first compound) was increased in the emitting layer.

The luminous efficiency of each of the organic EL devices in Examples 1 and 2 was equal to the luminous efficiency of the organic EL device of Comparative 1.

In each of the organic EL devices in Examples 1, 2 and 5 to 10, blue emission having a chromatic purity equal to or exceeding chromatic purity of the organic EL device of Comparative 1 was obtained. Particularly, emission having a high chromatic purity was obtained in the organic EL devices of Examples 5, 6, 9 and 10 using the compound BD-3.

The half bandwidth of each of the organic EL devices in Examples 1 to 4, 7 and 8 was narrower than the half bandwidth of Comparative 1.

As described above, the device performance of the organic EL devices of Examples 1 to 10 was improved by combining the first, second and third compounds as compared with the device performance of Comparative 1.

Examples 11 to 18

Organic EL devices in Examples 11 to 18 were prepared using the following compounds in addition to the compounds used in the above Examples.

[Formula 55]

BD-4

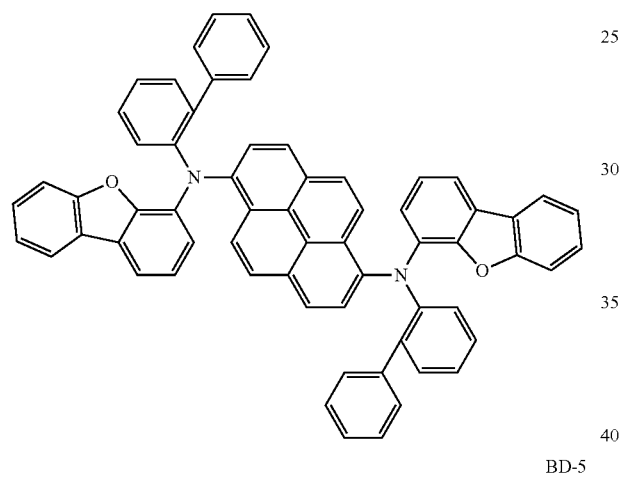

BD-5

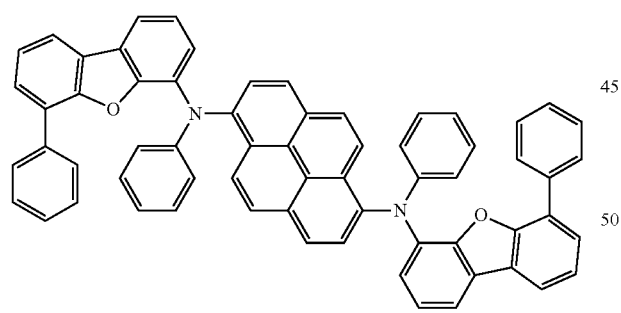

BD-6

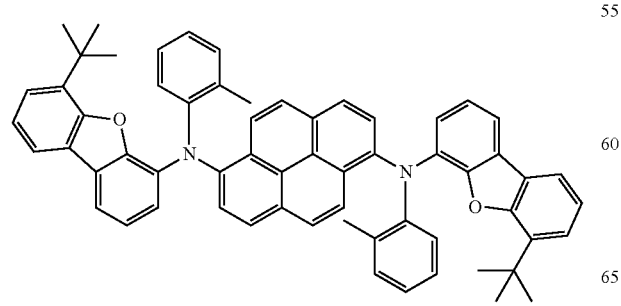

BD-7

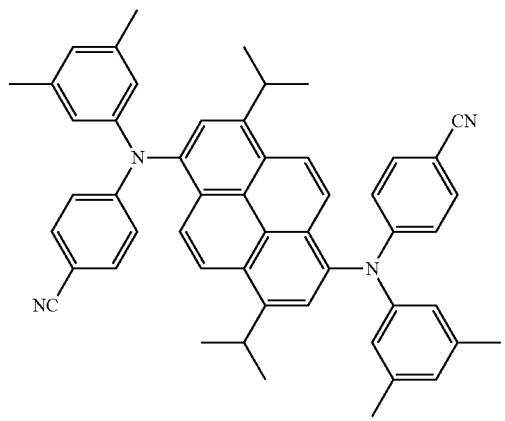

[Formula 56]

BD-8

BD-9

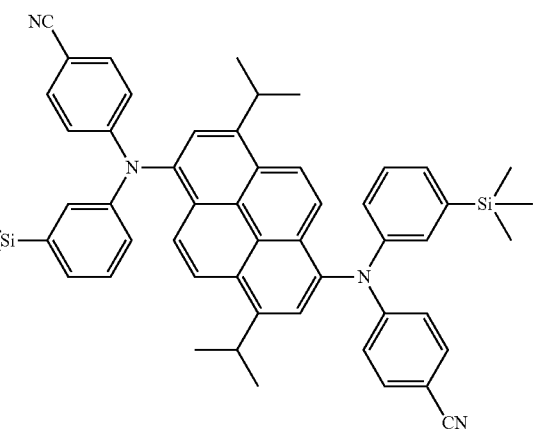

-continued

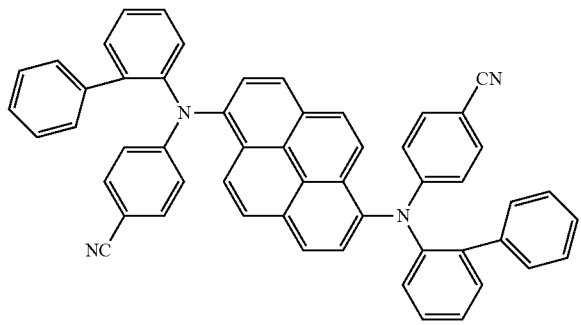

BD-10

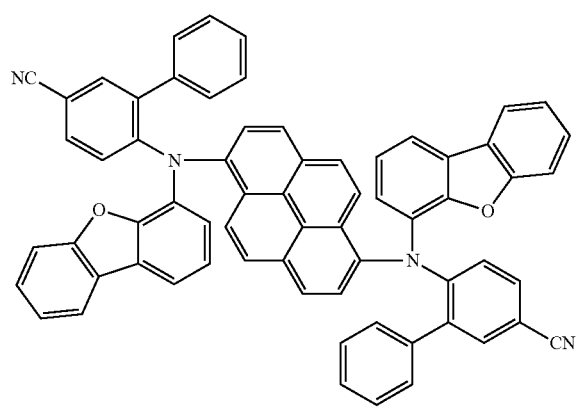

BD-11

Preparation and Evaluation of Organic EL Device

The organic EL device was prepared and evaluated as follows.

Example 11

An organic EL device of Example 11 was prepared in the same manner as the organic EL device of Example 1 except that a compound BD-4 was used in place of the compound BD-1, the concentration of the compound BD-4 was determined at 1 mass %, the concentration of the compound BH was determined at 24 mass % and the concentration of the compound DA-1 was determined at 75 mass % in the emitting layer of Example 1.

A device arrangement of the organic EL device of Example 11 is shown in symbols as follows.

ITO(130)/HI(5)/HT-1(80)/HT-2(10)/EB(5)/DA-1:BH:BD-4(25, 75%:24%:1%)/DA-2(5)/ET(20)/LiF(1)/Al(80)

Numerals in parentheses represent a film thickness (unit: nm). The numerals in the form of percentage in parentheses indicate ratios (mass %) of the compounds in the emitting layer.

Example 12

An organic EL device of Example 12 was prepared in the same manner as the organic EL device of Example 11 except that a compound BD-5 was used in place of the compound BD-4 in the emitting layer of Example 11.

A device arrangement of the organic EL device of Example 12 is shown in symbols as follows.

ITO(130)/HI(5)/HT-1(80)/HT-2(10)/EB(5)/DA-1:BH:BD-5(2.5, 75%:24%:1%)/DA-2(5)/ET(20)/LiF(1)/Al(80)

Example 13

An organic EL device of Example 13 was prepared in the same manner as the organic EL device of Example 11 except that a compound BD-6 was used in place of the compound BD-4 in the emitting layer of Example 11.

A device arrangement of the organic EL device of Example 13 is shown in symbols as follows.

ITO(130)/HI(5)/HT-1(80)HT-2(10)/EB(5)/DA-1:BH:BD-6(25, 75%:24%:1%)/DA-2(5)/ET(20)/LiF(1)/Al(80)

Example 14

An organic EL device of Example 14 was prepared in the same manner as the organic EL device of Example 11 except that a compound BD-7 was used in place of the compound BD-4 in the emitting layer of Example 11.

A device arrangement of the organic EL device of Example 14 is shown in symbols as follows.

ITO(130)/HI(5)/HT-1(80)/HT-2(10)/EB(5)/DA-1:BH:BD-7(25, 75%:24%:1%)/DA-2(5)/ET(20)/LiF(1)/Al(80)

Example 15

An organic EL device of Example 15 was prepared in the same manner as the organic EL device of Example 11 except that a compound BD-8 was used in place of the compound BD-4 in the emitting layer of Example 11.

A device arrangement of the organic EL device of Example 15 is shown in symbols as follows.

ITO(130)/HI(5)/HT-1(80)/HT-2(10)/EB(5)/DA-1:BH:BD-8(25, 75%:24%:1%)/DA-2/ET(20)/LiF(1)/Al(80)

Example 16

An organic EL device of Example 16 was prepared in the same manner as the organic EL device of Example 11 except that a compound BD-9 was used in place of the compound BD-4 in the emitting layer of Example 11.

A device arrangement of the organic EL device of Example 16 is shown in symbols as follows.

ITO(130)/HI(5)/HT-1(80)/HT-2(10)/EB(5)/DA-1:BH:BD-9(25, 75%:24%:1%)/DA-2(5)/ET(20)/LiF(1)/Al(80)

Example 17

An organic EL device of Example 17 was prepared in the same manner as the organic EL device of Example 11 except that a compound BD-10 was used in place of the compound BD-4 in the emitting layer of Example 11.

A device arrangement of the organic EL device of Example 17 is shown in symbols as follows.

ITO(130)/HI(5)/HT-1(80)/HT-2(10)/EB(5)/DA-1:BH:BD-10(25, 75%:24%:1%)/DA-2(5)/ET(20)/LiF(1)/Al(80)

Example 18

An organic EL device of Example 18 was prepared in the same manner as the organic EL device of Example 11 except that a compound BD-11 was used in place of the compound BD-4 in the emitting layer of Example 11.

A device arrangement of the organic EL device of Example 18 is shown in symbols as follows.

ITO(130)/HI(5)/HT-1(80)/HT-2(10)/EB(5)/DA-1:BH:BD-11(25, 75%:24%:1%)/DA-2(5)/ET(20)/LiF(1)/Al(80)

Comparative 2

An organic EL device of Comparative 2 was prepared in the same manner as the organic EL device of Example 11 except that the compound BD-4 of the emitting layer of Example 11 was not used, the concentration of the compound BH was determined at 24 mass % and the concentration of the compound DA-1 was determined at 76 mass % in the emitting layer of Example 11.

A device arrangement of the organic EL device in Comparative 2 is shown in symbols as follows.

ITO(130)/HI(5)/HT-1(80)/HT-2(10)/EB(5)/DA-1:BH(25, 76%:24%)/DA-2(5)/ET(20)/LiF(1)/Al(80)

Evaluation of Compounds

Energy Gap $T_{77K}$ at 77 [K]

For the second compound (measurement target) (the compounds BD-4 to BD-11), $T_{77K}$ was measured in the same manner as for the compound BD-1.

The calculated energy gaps $T_{77K}$ are shown below.
BD-4: 2.0 eV
BD-5: 2.0 eV
BD-6: 2.0 eV
BD-7: 2.0 eV
BD-8: 2.0 eV
BD-9: 2.0 eV
BD-10; 2.0 eV
BD-1: 2.0 eV Evaluation of Organic EL Devices The organic EL devices manufactured in Examples 11 to 18 and Comparative 2 were evaluated with respect to the CIE193 chromaticity, emission peak wavelength $\lambda_p$ and half bandwidth (FWHM). The evaluation method was the same as the above. In Examples 11 to 18 and Comparative 2, a current density for driving the organic EL devices was determined at 0.1 mA/cm². The results of the evaluation are shown in Table 7.

TABLE 7

| | Emitting Layer | BH Content in Emitting Layer (mass %) | Current Density (mA/cm²) | Chromaticity | | $\lambda_p$ (nm) | FWHM (nm) |
| --- | --- | --- | --- | --- | --- | --- | --- |
| | | | | x | y | | |
| Comparative 2 | DA-1, BH | 24 | 0.1 | 0.154 | 0.206 | 467 | 66 |
| Example 11 | DA-1, BH, BD-4 | 24 | 0.1 | 0.147 | 0.147 | 458 | 47 |
| Example 12 | DA-1, BH, BD-5 | 24 | 0.1 | 0.147 | 0.145 | 458 | 49 |
| Example 13 | DA-1, BH, BD-6 | 24 | 0.1 | 0.148 | 0.144 | 456 | 51 |
| Example 14 | DA-1, BH, BD-7 | 24 | 0.1 | 0.152 | 0.173 | 460 | 57 |
| Example 15 | DA-1, BH, BD-8 | 24 | 0.1 | 0.150 | 0.166 | 460 | 54 |
| Example 16 | DA-1, BH, BD-9 | 24 | 0.1 | 0.151 | 0.159 | 459 | 53 |
| Example 17 | DA-1, BH, BD-10 | 24 | 0.1 | 0.153 | 0.168 | 457 | 56 |
| Example 18 | DA-1, BH, BD-11 | 24 | 0.1 | 0.153 | 0.160 | 455 | 53 |

As shown in Table 7, in each of the organic EL devices in Examples 11 to 18, blue emission having a chromatic purity higher than chromatic purity of the organic EL device of Comparative 2 was obtained.

The half bandwidth of each of the organic EL devices in Examples 11 to 18 was narrower than the half bandwidth of the organic EL device of Comparative 2.

As described above, the device performance of the organic EL devices of Examples 11 to 18 was improved by combining the first, second and third compounds as compared with the device performance of Comparative 2.

Examples 19 to 22

Organic EL devices in Examples 19 to 22 were prepared using the following compounds in addition to the compounds used in the above Examples.

[Formula 57]

BD-12

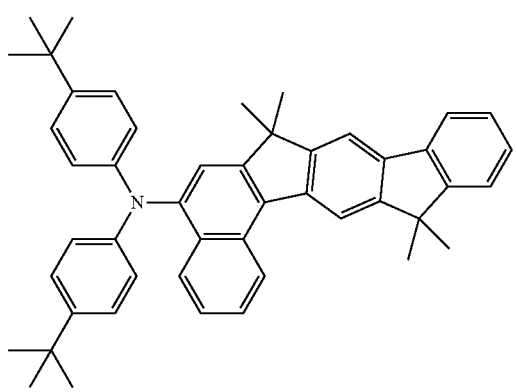

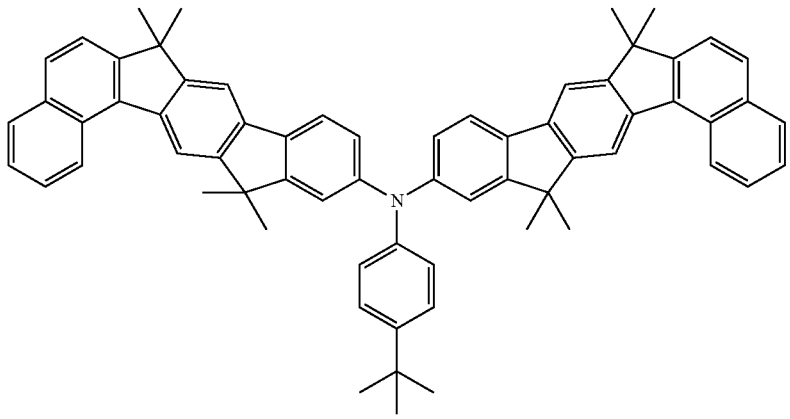

BD-13

Preparation and Evaluation of Organic EL Device

The organic EL device was prepared and evaluated as follows.

Example 19

An organic EL device of Example 19 was prepared in the same manner as the organic EL device of Example 1 except that a compound BD-12 was used in place of the compound BD-1 in the emitting layer of Example 1.

A device arrangement of the organic EL device of Example 19 is shown in symbols as follows.

ITO(130)/HI(5)/HT-1(80)/HT-2(10)/EB(5)/DA-1:BH:BD-12(25, 85%:14%:1%)/DA-2(5)/ET(20)/LiF(1)/Al(80)

Numerals in parentheses represent a film thickness (unit: nm). The numerals in the form of percentage in parentheses indicate ratios (mass %) of the compounds in the emitting layer.

Example 20

An organic EL device of Example 20 was prepared in the same manner as the organic EL device of Example 2 except that the compound BD-12 was used in place of the compound BD-1 in the emitting layer of Example 2.

A device arrangement of the organic EL device of Example 20 is shown in symbols as follows.

ITO(130)/HI(5)/HT-1(80)/HT-2(10)/EB(5)/DA-1:BH:BD-12(25, 50%:49%:1%)/DA-2(5)/ET(20)/LiF(1)/Al(80)

Example 21

An organic EL device of Example 21 was prepared in the same manner as the organic EL device of Example 1 except that a compound BD-13 was used in place of the compound BD-1 in the emitting layer of Example 1.

A device arrangement of the organic EL device of Example 21 is shown in symbols as follows.

ITO(130)/HI(5)/HT-1(80)HT-2(10)/EB(5)/DA-1:BH:BD-13(25, 85%:14%:1%)/DA-2(5)/ET(20)/LiF(1)/Al(80)

Example 22

An organic EL device of Example 22 was prepared in the same manner as the organic EL device of Example 2 except that the compound BD-13 was used in place of the compound BD-1 in the emitting layer of Example 2.

A device arrangement of the organic EL device of Example 22 is shown in symbols as follows.

ITO(130)/HI(5)/HT-1(80)/HT-2(10)/EB(5)/DA-1:BH:BD-13(25, 50%:49%:1%)/DA-2(5)/ET(20)/LiF(1)/Al(80)

Comparative 3

An organic EL device of Comparative 3 was prepared in the same manner as the organic EL device of Example 19 except that the compound BD-12 of the emitting layer of Example 19 was not used, the concentration of the compound BH was determined at 15 mass % and the concentration of the compound DA-1 was determined at 85 mass % in the emitting layer of Example 19.

A device arrangement of the organic EL device in Comparative 3 is shown in symbols as follows.

ITO(130)/HI(5)/HT-1(80)/HT-2(10)/EB(5)/DA-1:BH(25, 85%:15%)/DA-2(5)/ET(20)/LiF(1)/Al(80)

Evaluation of Compounds

Energy Gap $T_{77K}$ at 77 [K]

For the second compound (measurement target) (the compounds BD-12 and BD-13), $T_{77K}$ was measured in the same manner as for the compound BD-1.

The calculated energy gaps $T_{77K}$ are shown below.

BD-12: 2.2 eV

BD-13: 2.2 eV

Evaluation of Organic EL Devices

The organic EL devices manufactured in Examples 19 to 22 and Comparative 3 were evaluated with respect to the voltage (V), CIE193 chromaticity, emission peak wavelength $\lambda_p$ and half bandwidth (FWHM). Moreover, the organic EL devices manufactured in Examples 19 to 20 and Comparative 3 were evaluated with respect to the external quantum efficiency EQE (%). The evaluation method was the same as the above. In Examples 19 to 22 and Comparative 3, a current density for driving the organic EL devices was determined at 0.1 mA/cm². The results of the evaluation are shown in Tables 8 and 9

TABLE 8

| | Emitting Layer | BH Content in Emitting Layer (mass %) | Current Density (mA/cm²) | Voltage (V) | Chromaticity | | EQE (%) | $\lambda_p$ (nm) | FWHM (nm) |
|---|---|---|---|---|---|---|---|---|---|
| | | | | | x | y | | | |
| Example 19 | DA-1, BH, BD-12 | 14 | 0.1 | 4.0 | 0.147 | 0.181 | 12.6 | 466 | 57 |
| Example 20 | DA-1, BH, BD-12 | 49 | 0.1 | 3.3 | 0.148 | 0.218 | 11.9 | 470 | 59 |
| Comparative 3 | DA-1, BH | 15 | 0.1 | 4.3 | 0.154 | 0.183 | 12.4 | 465 | 65 |

TABLE 9

| | Emitting Layer | BH Content in Emitting Layer (mass %) | Current Density (mA/cm²) | Voltage (V) | Chromaticity | | $\lambda_p$ (nm) | FWHM (nm) |
|---|---|---|---|---|---|---|---|---|
| | | | | | x | y | | |
| Example 21 | DA-1, BH, BD-13 | 14 | 0.1 | 4.2 | 0.149 | 0.130 | 453 | 52 |
| Example 22 | DA-1, BH, BD-13 | 49 | 0.1 | 3.3 | 0.150 | 0.176 | 461 | 62 |

As shown in Tables 8 to 9, it was observed that the voltage was decreased as the concentration of the compound BH (the first compound) was increased in the emitting layer.

The luminous efficiency of each of the organic EL devices in Examples 19 and 20 was almost equal to the luminous efficiency of Comparative 3.

In each of the organic EL devices in Examples 19 to 22, blue emission having a chromatic purity equal to or exceeding chromatic purity of the organic EL device of Comparative 3 was obtained.

The half bandwidth of each of the organic EL devices in Examples 19 to 22 was narrower than the half bandwidth of the organic EL device of Comparative 3.

As described above, the device performance of the organic EL devices of Examples 19 to 22 was improved by combining the first, second and third compounds as compared with the device performance of Comparative 3.

Comparatives 4 and 5

Organic EL devices in Comparatives 4 and 5 were prepared using the following compounds in addition to the compounds used in the above Examples.

[Formula 58]

(BD-X)

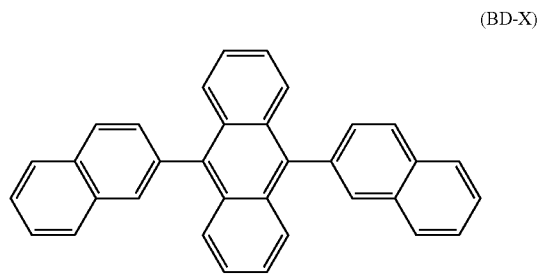

Preparation and Evaluation of Organic EL Device

The organic EL device was prepared and evaluated as follows.

Comparative 4

An organic EL device of Comparative 4 was prepared in the same manner as the organic EL device of Example 1 except that a compound BD-X was used in place of the compound BD-1 in the emitting layer of Example 1.

A device arrangement of the organic EL device in Comparative 4 is shown in symbols as follows.

ITO(130)/HI(5)/HT-1(80)/HT-2(10)/EB(5)/DA-1:BH:BD-X(25, 85%:14%:1%)/DA-2(5)/ET(20)/LiF(1)/Al(80)

Numerals in parentheses represent a film thickness (unit: nm). The numerals in the form of percentage in parentheses indicate ratios (mass %) of the compounds in the emitting layer.

Comparative 5

An organic EL device of Comparative 5 was prepared in the same manner as the organic EL device of Example 2 except that the compound BD-X was used in place of the compound BD-1 in the emitting layer of Example 2.

A device arrangement of the organic EL device in Comparative 5 is shown in symbols as follows.

ITO(130)/HI(5)/HT-1(80)/HT-2(10)/EB5/DA-1:BH:BD-X(25, 50%:49%:1%)/DA-2(5)/ET(20)/LiF(1)/Al(80)

Evaluation of Compounds

Energy Gap $T_{77}$ at 77 [K]

For the compound BD-X (measurement target), $T_{77K}$ was measured in the same manner as for the compound BD-1.

The calculated energy gaps $T_{77K}$ are shown below.

BD-X:1.8 eV;

Evaluation of Organic EL Devices

The organic EL devices manufactured in Comparatives 4 and 5 were evaluated with respect to the voltage (V), CIE193 chromaticity, external quantum efficiency EQE (%), emission peak wavelength $\lambda_p$ and half bandwidth (FWHM). The evaluation method was the same as the above. In Comparatives 4 and 5, a current density for driving the organic EL devices was determined at 0.1 mA/cm². The results of the evaluation are shown in Table 10.

TABLE 10

| | Emitting Layer | BH Content in Emitting Layer (mass %) | Current Density (mA/cm²) | Voltage (V) | Chromaticity x | Chromaticity y | EQE (%) | $\lambda_p$ (nm) | FWHM (nm) |
|---|---|---|---|---|---|---|---|---|---|
| Comparative 4 | DA-1, BH, BD-X | 14 | 0.1 | 4.1 | 0.156 | 0.192 | 10.1 | 464 | 68 |
| Comparative 5 | DA-1, BH, BD-X | 49 | 0.1 | 3.3 | 0.163 | 0.239 | 8.6 | 471 | 70 |

As shown in Table 10, the luminous efficiency in each of the organic EL devices in Comparatives 4 and 5 was inferior to the luminous efficiency of each of Examples 1, 2, 19 and 20.

The half bandwidth of each of the organic EL devices in Comparatives 4 and 5 was wider than the half bandwidth of each of the organic EL devices of Examples.

The invention claimed is:

1. An organic electroluminescence device, comprising:
   an anode;
   an emitting layer; and
   a cathode, wherein
   the emitting layer comprises a first compound, a second compound, and a third compound,
   the first compound is a delayed fluorescent compound,
   the first compound has an energy gap $T_{77K}$ at 77 [K] larger than an energy gap $T_{77K}$ at 77 [K] of the second compound,
   the third compound has an energy gap $T_{77K}$ larger than the energy gap $T_{77K}$ at 77 [K] of the second compound, and
   the second compound is a compound having a fused ring structure represented by a formula (2) below, the fused ring structure having eight or less rings in total,

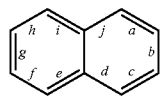
(2)

where: a monocyclic ring or a fused ring is optionally fused to at least one of positions a, c, d, e, f, h, i and j;
   a five-membered ring or a fused ring having a five-membered ring is optionally fused to at least one of positions b and g;
   when a six-membered ring is fused to the positions i and j, a monocyclic ring or a fused ring is also fused to the positions d and e;
   when a six-membered ring is fused to the positions d and e, a monocyclic ring or a fused ring is also fused to the positions i and j;
   when a fused ring having a five-membered ring is fused to the position b, the five-membered ring of the fused ring is directly fused to the position b; and
   when a fused ring having a five-membered ring is fused to the position g, the five-membered ring of the fused ring is directly fused to the position g.

2. The organic electroluminescence device according to claim 1, wherein
   the first compound has a content ratio in a range from 10 mass % to 60 mass % in the emitting layer.

3. The organic electroluminescence device according to claim 1, wherein
   the first compound is a compound represented by a formula (1) below,

(1)

where: A is a group having a partial structure selected from formulae (a-1) to (a-7) below; when a plurality of A are present, the plurality of A are optionally mutually the same or different and the plurality of A are optionally mutually bonded to form a saturated or unsaturated ring;
   B is a group having a partial structure selected from formulae (b-1) to (b-6) below; when a plurality of B are present, the plurality of B are optionally mutually the same or different and the plurality of B are optionally mutually bonded to form a saturated or unsaturated ring;
   a, b and d are each independently an integer of 1 to 5;
   c is an integer of 0 to 5;
   when c is 0, A is bonded to B by a single bond or a spiro bond;
   when c is an integer of 1 to 5, L is a linking group selected from the group consisting of a substituted or unsubstituted aromatic hydrocarbon group having 6 to 30 ring carbon atoms and a substituted or unsubstituted heterocyclic group having 5 to 30 ring atoms; and
   when a plurality of L are present, the plurality of L are optionally mutually the same or different and are optionally mutually bonded to form a saturated or unsaturated ring,

(a-1)

(a-2)

(a-3)

(a-4)

(a-5)

(a-6)

-continued

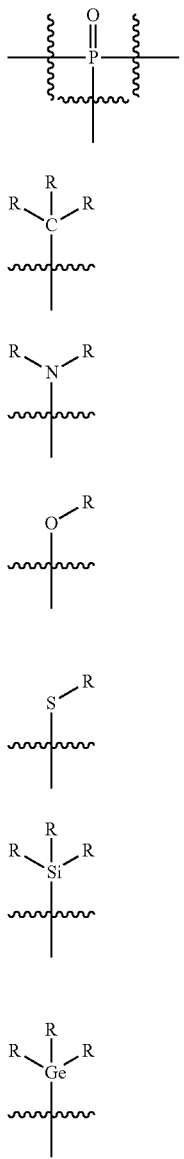

(a-7)

(b-1)

(b-2)

(b-3)

(b-4)

(b-5)

(b-6)

where, in the formulae (b-1) to (b-6):

R is each independently a hydrogen atom or a substituent;

when R is a substituent, the substituent is selected from the group consisting of a substituted or unsubstituted aromatic hydrocarbon group having 6 to 30 ring carbon atoms, a substituted or unsubstituted heterocyclic group having 5 to 30 ring atoms, and a substituted or unsubstituted alkyl group having 1 to 30 carbon atoms; and when a plurality of R are present, the plurality of R are optionally mutually the same or different and are optionally mutually bonded to form a saturated or unsaturated ring.

4. The organic electroluminescence device according to claim 3, wherein the first compound is a compound represented by a formula (10) below,

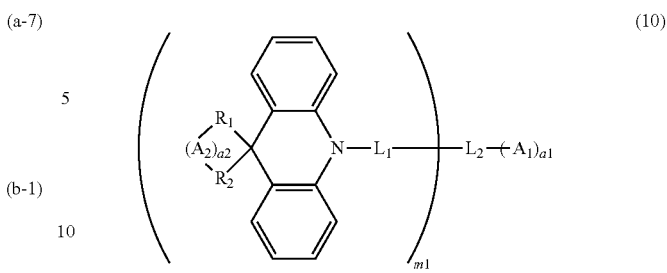

(10)

where: a1 is 0 or 1 and a2 is 0 or 1, provided that a1+a2≥1;
m1 is an integer of 1 to 5;
when a2 is 0, $R_1$ and $R_2$ each independently represent a hydrogen atom or a monovalent substituent;
when $R_1$ and $R_2$ are substituents, the substituents are each independently selected from the group consisting of a substituted or unsubstituted aromatic hydrocarbon group having 6 to 30 ring carbon atoms, a substituted or unsubstituted heterocyclic group having 5 to 30 ring atoms, a substituted or unsubstituted alkyl group having 1 to 30 carbon atoms, a substituted or unsubstituted alkoxy group having 1 to 30 carbon atoms, a substituted or unsubstituted aralkyl group having 7 to 30 carbon atoms, a substituted or unsubstituted aryloxy group having 6 to 30 ring carbon atoms, and a substituted silyl group;
when a2 is 1, $R_1$ and $R_2$ are each independently a linking group selected from the group consisting of a substituted or unsubstituted aromatic hydrocarbon group having 6 to 30 ring carbon atoms, a substituted or unsubstituted heterocyclic group having 5 to 30 ring atoms, a substituted or unsubstituted alkyl group having 1 to 30 carbon atoms, a substituted or unsubstituted alkoxy group having 1 to 30 carbon atoms, a substituted or unsubstituted aralkyl group having 7 to 30 carbon atoms, a substituted or unsubstituted aryloxy group having 6 to 30 ring carbon atoms, and a substituted silyl group;
when m1 is 2 or more, a plurality of $R_1$ are mutually the same or different and a plurality of $R_2$ are mutually the same or different;
$A_1$ and $A_2$ are each independently a group having a partial structure selected from formulae (a-1) to (a-7) below;
when m1 is 2 or more, a plurality of $A_2$ are mutually the same or different;
when a1 is 0, $L_2$ is a hydrogen atom or a monovalent substituent;
when $L_2$ is a monovalent substituent, the substituent is selected from the group consisting of a substituted or unsubstituted aromatic hydrocarbon group having 6 to 30 ring carbon atoms and a substituted or unsubstituted heterocyclic group having 5 to 30 ring atoms;
when a1 is 1, $L_2$ is a single bond or a linking group;
when $L_2$ is a linking group, the linking group is selected from the group consisting of a substituted or unsubstituted aromatic hydrocarbon group having 6 to 30 ring carbon atoms and a substituted or unsubstituted heterocyclic group having 5 to 30 ring atoms;
$L_1$ is a single bond or a linking group;
when $L_1$ is a linking group, the linking group is selected from the group consisting of a substituted or unsubstituted aromatic hydrocarbon group having 6 to 30 ring carbon atoms and a substituted or unsubstituted heterocyclic group having 5 to 30 ring atoms; and when m1 is 2 or more, a plurality of $L_1$ are mutually the same or different.

5. The organic electroluminescence device according to claim 3, wherein
the first compound is a compound represented by a formula (10') below,

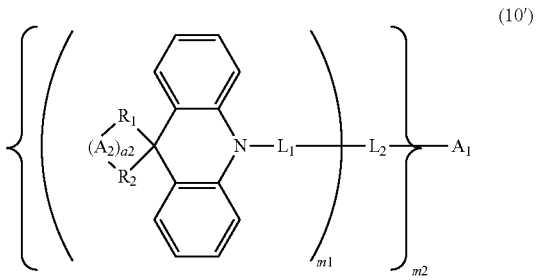

(10')

where: m2 is 2;
a2 is 0 or 1;
a plurality of a2 are mutually the same or different;
m1 is an integer of 1 to 5;
a plurality of m1 are mutually the same or different;
when a2 is 0, $R_1$ and $R_2$ each independently represent a hydrogen atom or a monovalent substituent;
when $R_1$ and $R_2$ are substituents, the substituents are each independently selected from the group consisting of a substituted or unsubstituted aromatic hydrocarbon group having 6 to 30 ring carbon atoms, a substituted or unsubstituted heterocyclic group having 5 to 30 ring atoms, a substituted or unsubstituted alkyl group having 1 to 30 carbon atoms, a substituted or unsubstituted alkoxy group having 1 to 30 carbon atoms, a substituted or unsubstituted aralkyl group having 7 to 30 carbon atoms, a substituted or unsubstituted aryloxy group having 6 to 30 ring carbon atoms, and a substituted silyl group;
when a2 is 1, $R_1$ and $R_2$ are each independently a linking group selected from the group consisting of a substituted or unsubstituted aromatic hydrocarbon group having 6 to 30 ring carbon atoms, a substituted or unsubstituted heterocyclic group having 5 to 30 ring atoms, a substituted or unsubstituted alkyl group having 1 to 30 carbon atoms, a substituted or unsubstituted alkoxy group having 1 to 30 carbon atoms, a substituted or unsubstituted aralkyl group having 7 to 30 carbon atoms, a substituted or unsubstituted aryloxy group having 6 to 30 ring carbon atoms, and a substituted silyl group;
a plurality of $R_1$ are mutually the same or different;
a plurality of $R_2$ are mutually the same or different;
$A_1$ and $A_2$ are a group having a partial structure selected from the formulae (a-1) to (a-7);
a plurality of $A_2$ are mutually the same or different;
$L_2$ is a single bond or a linking group;
when $L_2$ is a linking group, the linking group is selected from the group consisting of a substituted or unsubstituted aromatic hydrocarbon group having 6 to 30 ring carbon atoms and a substituted or unsubstituted heterocyclic group having 5 to 30 ring atoms;
a plurality of $L_2$ are mutually the same or different;
$L_1$ is a single bond or a linking group;
when $L_1$ is a linking group, the linking group is selected from the group consisting of a substituted or unsubstituted aromatic hydrocarbon group having 6 to 30 ring carbon atoms and a substituted or unsubstituted heterocyclic group having 5 to 30 ring atoms; and
a plurality of $L_1$ are mutually the same or different.

6. The organic electroluminescence device according to claim 4, wherein
the first compound is selected from the group consisting of a compound represented by a formula (10B), a compound represented by a formula (10C), a compound represented by a formula (10D), and a compound represented by a formula (10E) below,

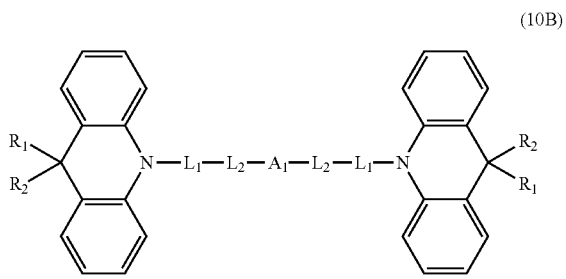

(10B)

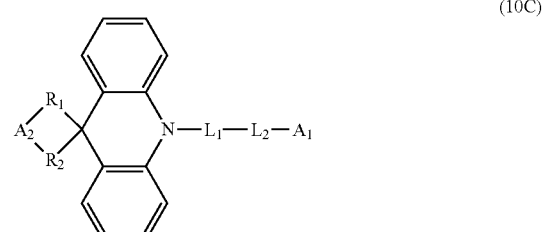

(10C)

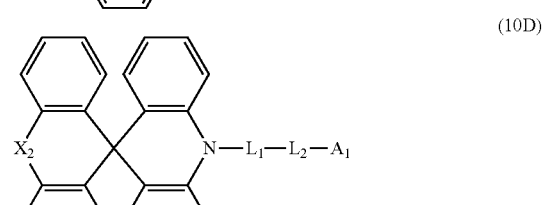

(10D)

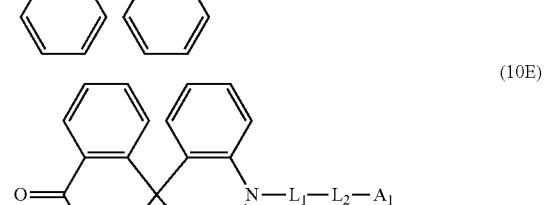

(10E)

where: in the formula (10D), $X_2$ is selected from the group consisting of $=N-L_1-L_2-A_1$, an oxygen atom, a sulfur atom and a selenium atom; and
in the formulae (10B), (10C), (10D) and (10E), $R_1$, $R_2$, $A_1$, $A_2$, $L_1$ and $L_2$ each represent the same as $R_1$, $R_2$, $A_1$, $A_2$, $L_1$ and $L_2$ in the formula (10).

7. The organic electroluminescence device according to claim 1, wherein
the second compound is a fluorescent compound having an emission peak wavelength of 550 nm or less.

8. The organic electroluminescence device according to claim 1, wherein
the second compound is a blue fluorescent compound.

9. The organic electroluminescence device according to claim 1, wherein the second compound is a compound having a benzofluorene skeleton, fluoranthene skeleton, pyrene skeleton, or chrysene skeleton.

10. The organic electroluminescence device according to claim 9, wherein
the second compound is a compound represented by a formula (21) below,

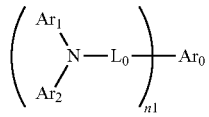
(21)

where: n1 is an integer of 1 or more;
Ar$_0$ is a group having a benzofluorene skeleton, fluoranthene skeleton, pyrene skeleton, or chrysene skeleton;
A$_1$ and Ar$_2$ are each independently a substituent selected from the group consisting of a substituted or unsubstituted aromatic hydrocarbon group having 6 to 30 ring carbon atoms, a substituted or unsubstituted heterocyclic group having 5 to 30 ring atoms, a substituted or unsubstituted alkyl group having 1 to 30 carbon atoms and a substituted or unsubstituted aralkyl group having 7 to 30 carbon atoms;
Ar$_1$ and Ar$_2$ are optionally mutually bonded to form a saturated or unsaturated ring;
when n1 is 2 or more, a plurality of Ar$_1$ are mutually the same or different and a plurality of Ar$_2$ are mutually the same or different;
L$_0$ is a single bond or a linking group;
when L$_0$ is a linking group, the linking group is selected from the group consisting of a substituted or unsubstituted aromatic hydrocarbon group having 6 to 30 ring carbon atoms and a substituted or unsubstituted heterocyclic group having 5 to 30 ring atoms; and
when n1 is 2 or more, a plurality of L$_0$ are mutually the same or different.

11. The organic electroluminescence device according to claim 10, wherein
Ar$_1$ and Ar$_2$ are each independently selected from the group consisting of a substituted or unsubstituted aromatic hydrocarbon group having 6 to 30 ring carbon atoms and a substituted or unsubstituted heterocyclic group having 5 to 30 ring atoms.

12. The organic electroluminescence device according to claim 10, wherein
at least one of Ar$_1$ and Ar$_2$ is a substituent selected from the group consisting of a substituted or unsubstituted aromatic hydrocarbon group having 6 to 30 ring carbon atoms.

13. The organic electroluminescence device according to claim 10, wherein
at least one of Ar$^1$ and Ar$^2$ is the group represented by a formula (22) below,

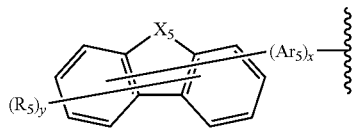
(22)

where: x is an integer of 0 to 3;
y is an integer of 0 to 7;
X$_5$ represents an oxygen atom, a sulfur atom or a selenium atom;

when x is 0, the group represented by the formula (22) is bonded by a single bond to a nitrogen atom of the formula (21);

when x is an integer of 1 to 3, Ar$_5$ is a substituted or unsubstituted aromatic hydrocarbon group having 6 to 30 ring carbon atoms;

when x is 2 or more, a plurality of Ar$_5$ are optionally mutually the same or different and are optionally mutually bonded to form a saturated or unsaturated ring;

R$_5$ is selected from the group consisting of a halogen atom, a cyano group, a nitro group, a hydroxyl group, a substituted silyl group, a carboxyl group, a substituted or unsubstituted aromatic hydrocarbon group having 6 to 30 ring carbon atoms, a substituted or unsubstituted alkyl group having 1 to 30 carbon atoms, a substituted or unsubstituted alkylamino group having 1 to 30 carbon atoms, a substituted or unsubstituted arylamino group having 6 to 30 ring carbon atoms, a substituted or unsubstituted alkoxy group having 1 to 30 carbon atoms, a substituted or unsubstituted aryloxy group having 6 to 30 ring carbon atoms, a substituted or unsubstituted arylthio group having 6 to 30 ring carbon atoms, and a substituted or unsubstituted alkoxycarbonyl group having 1 to 30 carbon atoms;

when y is 2 or more, a plurality of R$_5$ are optionally mutually the same or different and are optionally mutually bonded to form a saturated or unsaturated ring.

14. The organic electroluminescence device according to claim 13, wherein
Ar$_1$ is a substituent selected from the group consisting of a substituted or unsubstituted aromatic hydrocarbon group having 6 to 30 ring carbon atoms, and
Ar$_2$ is a group represented by the formula (22).

15. The organic electroluminescence device according to claim 14, wherein
Ar$_1$ is a substituent selected from the group consisting of a substituted or unsubstituted aromatic hydrocarbon group having 6 to 20 ring carbon atoms.

16. The organic electroluminescence device according to claim 14, wherein
Ar$_1$ is a group selected from a phenyl group, biphenyl group, naphthyl group, phenanthryl group, terphenyl group and fluorenyl group.

17. The organic electroluminescence device according to claim 13, wherein
X$_5$ is an oxygen atom.

18. The organic electroluminescence device according to claim 10, wherein
Ar$_0$ is a group having a pyrene skeleton or a chrysene skeleton.

19. The organic electroluminescence device according to claim 10, wherein
the group having the benzofluorene skeleton as Ar$_0$ in the formula (21) is a group represented by a formula (Ar-1) below,

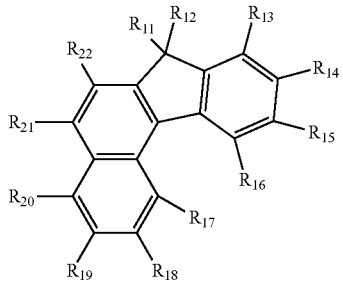

(Ar-1)

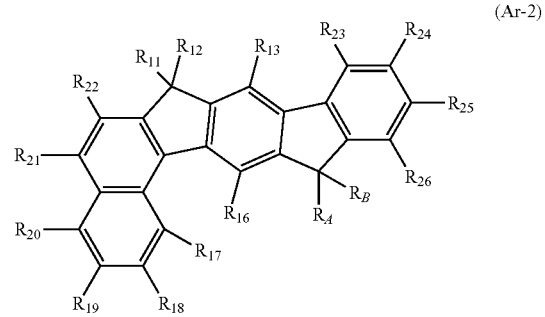

(Ar-2)

where: $R_{11}$ and $R_{12}$ each independently represent a hydrogen atom or a substituent;

when $R_1$ and $R_2$ are substituents, the substituents are each independently selected from the group consisting of a substituted or unsubstituted alkyl group having 1 to 30 carbon atoms and a substituted or unsubstituted aromatic hydrocarbon group having 6 to 30 ring carbon atoms;

$R_{13}$, $R_{14}$, $R_{15}$, $R_{16}$, $R_{17}$, $R_{18}$, $R_{19}$, $R_{20}$, $R_{21}$ and $R_{22}$ each independently represent a hydrogen atom, a substituent or a single bond to be bonded to $L_0$; at least one of $R_{13}$, $R_{14}$, $R_{15}$, $R_{16}$, $R_{17}$, $R_{18}$, $R_{19}$, $R_{20}$, $R_{21}$ and $R_{22}$ is a single bond to be bonded to $L_0$;

when $R_{13}$, $R_{14}$, $R_{15}$, $R_{16}$, $R_{17}$, $R_{18}$, $R_{19}$, $R_{20}$, $R_{21}$ and $R_{22}$ are substituents, the substituents are each independently selected from the group consisting of a halogen atom, a cyano group, a nitro group, a hydroxyl group, a substituted silyl group, a carboxyl group, a substituted or unsubstituted aromatic hydrocarbon group having 6 to 30 ring carbon atoms, a substituted or unsubstituted alkyl group having 1 to 30 carbon atoms, a substituted or unsubstituted alkylamino group having 1 to 30 carbon atoms, a substituted or unsubstituted arylamino group having 6 to 30 ring carbon atoms, a substituted or unsubstituted alkoxy group having 1 to 30 carbon atoms, a substituted or unsubstituted aryloxy group having 6 to 30 ring carbon atoms, a substituted or unsubstituted arylthio group having 6 to 30 ring carbon atoms, and a substituted or unsubstituted alkoxycarbonyl group having 1 to 30 carbon atoms;

at least one of a combination of $R_{13}$ and $R_{14}$, a combination of $R_{14}$ and $R_{15}$, a combination of $R_{15}$ and $R_{16}$, a combination of $R_{17}$ and $R_{18}$, a combination of $R_{18}$ and $R_{19}$, a combination of $R_{19}$ and $R_{20}$, a combination of $R_{20}$ and $R_{21}$, and a combination of $R_{21}$ and $R_{22}$ optionally forms a saturated or unsaturated ring.

20. The organic electroluminescence device according to claim 19, wherein
at least one of $Ar_1$ and $Ar_2$ is the group represented by the formula (Ar-1).

21. The organic electroluminescence device according to claim 19, wherein
the group represented by the formula (Ar-1) is a group represented by a formula (Ar-2) below, where: $R_{11}$, $R_{12}$, $R_A$ and $R_B$ each independently represent a hydrogen atom or a substituent;

when $R_{11}$, $R_{12}$, $R_A$ and $R_B$ are substituents, the substituents are each independently selected from the group consisting of a substituted or unsubstituted alkyl group having 1 to 30 carbon atoms and a substituted or unsubstituted aromatic hydrocarbon group having 6 to 30 ring carbon atoms;

$R_{13}$, $R_{16}$, $R_{17}$, $R_{18}$, $R_{19}$, $R_{20}$, $R_{21}$, $R_{22}$, $R_{23}$, $R_{24}$, $R_{25}$ and $R_{26}$ each independently represent a hydrogen atom, a substituent or a single bond to be bonded to $L_0$;

at least one of $R_{13}$, $R_{16}$, $R_{17}$, $R_{18}$, $R_{19}$, $R_{20}$, $R_{21}$, $R_{22}$, $R_{23}$, $R_{24}$, $R_{25}$ and $R_{26}$ is a single bond to be bonded to $L_0$;

when $R_{13}$, $R_{16}$, $R_{17}$, $R_{18}$, $R_{19}$, $R_{20}$, $R_{21}$, $R_{22}$, $R_{23}$, $R_{24}$, $R_{25}$ and $R_{26}$ are substituents, the substituents are each independently selected from the group consisting of a halogen atom, a cyano group, a nitro group, a hydroxyl group, a substituted silyl group, a carboxyl group, a substituted or unsubstituted aromatic hydrocarbon group having 6 to 30 ring carbon atoms, a substituted or unsubstituted alkyl group having 1 to 30 carbon atoms, a substituted or unsubstituted alkylamino group having 1 to 30 carbon atoms, a substituted or unsubstituted arylamino group having 6 to 30 ring carbon atoms, a substituted or unsubstituted alkoxy group having 1 to 30 carbon atoms, a substituted or unsubstituted aryloxy group having 6 to 30 ring carbon atoms, a substituted or unsubstituted arylthio group having 6 to 30 ring carbon atoms, and a substituted or unsubstituted alkoxycarbonyl group having 1 to 30 carbon atoms;

at least one of a combination of $R_{17}$ and $R_{18}$, a combination of $R_{18}$ and $R_{19}$, a combination of $R_{19}$ and $R_{20}$, a combination of $R_{20}$ and $R_{21}$, a combination of $R_{21}$ and $R_{22}$, a combination of $R_{23}$ and $R_{24}$, a combination of $R_{24}$ and $R_{25}$, and a combination of $R_{25}$ and $R_{26}$ optionally forms a saturated or unsaturated ring.

22. The organic electroluminescence device according to claim 21, wherein
at least one of $R_{21}$ and $R_{25}$ is a single bond to be bonded to $L_0$.

23. The organic electroluminescence device according to claim 9, wherein
the second compound is a compound represented by a formula (23) below,

(23)

where: p is an integer of 0 to 5;
q and r are each independently an integer of 1 to 5;
$Ar_{10}$ is a group having a benzofluorene skeleton, fluoranthene skeleton, pyrene skeleton, or chrysene skeleton;

$R_{10}$ is a substituent selected from the group consisting of a substituted or unsubstituted aromatic hydrocarbon group having 6 to 30 ring carbon atoms, a substituted or unsubstituted heterocyclic group having 5 to 30 ring atoms, a substituted or unsubstituted alkyl group having 1 to 30 carbon atoms and a substituted or unsubstituted aralkyl group having 7 to 30 carbon atoms;

when a plurality of $R_{10}$ are present, the plurality of $R_{10}$ are optionally mutually the same or different and are optionally mutually bonded to form a saturated or unsaturated ring;

when p is 0, $Ar_{10}$ is bonded to $R_{10}$ by a single bond;

when p is an integer of 1 to 5, $L_{10}$ is a linking group selected from the group consisting of a substituted or unsubstituted aromatic hydrocarbon group having 6 to 30 ring carbon atoms and a substituted or unsubstituted heterocyclic group having 5 to 30 ring atoms; and when a plurality of $L_{10}$ are present, the plurality of $L_{10}$ are optionally mutually the same or different and are optionally mutually bonded to form a saturated or unsaturated ring.

24. The organic electroluminescence device according to claim 23, wherein $Ar_{10}$ is a group having a benzofluoranthene skeleton.

25. The organic electroluminescence device according to claim 1, further comprising:

a hole transporting layer between the anode and the emitting layer.

26. The organic electroluminescence device according to claim 1, further comprising:

an electron transporting layer between the emitting layer and the cathode.

27. An electronic device comprising the organic electroluminescence device according to claim 1.

* * * * *